US012707824B2

(12) United States Patent
Shim et al.

(10) Patent No.: US 12,707,824 B2
(45) Date of Patent: Aug. 11, 2026

(54) DISPLAY APPARATUS

(71) Applicant: Samsung Display Co., LTD., Yongin-si (KR)

(72) Inventors: Yongsub Shim, Yongin-si (KR); Youngjae Kim, Yongin-si (KR); Youngjun Yoo, Yongin-si (KR); Jungmin Choi, Yongin-si (KR); Younho Han, Yongin-si (KR); Jongbeom Hong, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 374 days.

(21) Appl. No.: 18/433,858

(22) Filed: Feb. 6, 2024

(65) Prior Publication Data

US 2024/0306431 A1 Sep. 12, 2024

(30) Foreign Application Priority Data

Mar. 6, 2023 (KR) ........................ 10-2023-0029271

(51) Int. Cl.

*H10K 59/12* (2023.01)
*H10K 59/122* (2023.01)
*H10K 59/35* (2023.01)
*H10K 102/00* (2023.01)

(52) U.S. Cl.

CPC ........... *H10K 59/122* (2023.02); *H10K 59/35* (2023.02); *H10K 2102/311* (2023.02)

(58) Field of Classification Search

CPC . H10K 59/35; H10K 59/122; H10K 2102/311

USPC ........................................................... 257/89

See application file for complete search history.

(56) References Cited

U.S. PATENT DOCUMENTS

| | | | | |
|---|---|---|---|---|
| 10,168,458 | B2 | 1/2019 | Kong et al. | |
| 2021/0367020 | A1* | 11/2021 | Bok | H10K 59/121 |
| 2022/0059804 | A1 | 2/2022 | Hong et al. | |
| 2022/0163704 | A1 | 5/2022 | Liu et al. | |
| 2022/0181575 | A1* | 6/2022 | Yun | H10K 59/80515 |
| 2022/0336781 | A1 | 10/2022 | Hong et al. | |

FOREIGN PATENT DOCUMENTS

| | | | | |
|---|---|---|---|---|
| CN | 114628459 A | * 6/2022 | H10K 50/813 |
| CN | 217562576 U | * 10/2022 | H10K 59/8792 |
| KR | 1020180014319 A | 2/2018 | |
| KR | 102152178 B1 | 9/2020 | |
| KR | 1020220024465 A | 3/2022 | |

* cited by examiner

*Primary Examiner* — Phuc T Dang

(74) *Attorney, Agent, or Firm* — CANTOR COLBURN LLP

(57) ABSTRACT

A display apparatus includes a substrate including a foldable area including a first foldable area adjacent to a first non-folded area and a second foldable area adjacent to a second non-folded area, a pixel-defining layer disposed over the substrate, and a light-blocking layer disposed over the pixel-defining layer. The pixel-defining layer defines a (1-1)st lower opening, a (1-2)nd lower opening, a (1-3)rd lower opening, and a (1-4)th lower opening. The light-blocking layer defines a (1-1)st upper opening, a (1-2)nd upper opening, a (1-3)rd upper opening, and a (1-4)th upper opening. The (1-3)rd upper opening is shifted to one side facing the first non-folded area of the (1-3)rd lower opening. The (1-4)th upper opening is shifted to one side facing the second non-folded area of the (1-4)th lower opening.

20 Claims, 28 Drawing Sheets

NFA2

FA

NFA1 x z y

630
610
550
530
510
430
420
410
400
330
321
311
DPE1
340
621
P11
UO11
R1
LO11
NFA1
III
III'
P13
UO13
LO13
FA1
V
V'
P14
UO14
LO14
FA2
VI
VI'
P12
UO12
LO12
NFA2
IV
IV'
z
x
y
D4
D5

FIG. 19

A
340
P1
P2
P3
J
L
K
G
H
F
FA21
FA23
FA22
FA12
FA13
FA11
FA2
FA1
FA
NFA2
NFA1
x
y
z

DISPLAY APPARATUS

This application claims priority to Korean Patent Application No. 10-2023-0029271, filed on Mar. 6, 2023, and all the benefits accruing therefrom under 35 U.S.C. § 119, the content of which in its entirety is herein incorporated by reference.

BACKGROUND

1. Field

Embodiments relate to a display apparatus, and more particularly, to a display apparatus with an improved display quality in which a difference in light characteristics between a non-folded area and a foldable area is reduced.

2. Description of the Related Art

Display apparatuses may be utilized as various electronic apparatuses. The display apparatuses may be mobile electronic apparatuses such as smartphones. The electronic apparatuses may be foldable electronic apparatuses in which a portion of a display surface thereof is folded to increase an area of a display area thereof while reducing an overall size.

SUMMARY

However, in a display apparatus according to the related art, because a foldable area of a display surface is not flat in an unfolded state after being folded, a difference in light characteristics between the non-folded area and the foldable area occurs, which may reduce display quality.

Embodiments include a display apparatus with an improved display quality, in which a difference in light characteristics between a non-folded area and a foldable area is reduced. However, such a technical problem is an example, and the disclosure is not limited thereto.

Additional features will be set forth in part in the description which follows and, in part, will be apparent from the description, or may be learned by practice of the presented embodiments of the disclosure.

In an embodiment of the disclosure, a display apparatus includes a substrate including a first non-folded area, a second non-folded area, and a foldable area. The second non-folded area is apart in a first direction from the first non-folded area, and the foldable area is disposed between the first non-folded area and the second non-folded area and extending in a second direction crossing the first direction, a pixel-defining layer disposed over the substrate, and a light-blocking layer disposed over the pixel-defining layer, the foldable area includes a first foldable area adjacent to the first non-folded area and a second foldable area adjacent to the second non-folded area, the pixel-defining layer defines a (1-1)st lower opening overlapping the first non-folded area, a (1-2)nd lower opening overlapping the second non-folded area, a (1-3)rd lower opening overlapping the first foldable area, and a (1-4)th lower opening overlapping the second foldable area, the light-blocking layer defines a (1-1)st upper opening overlapping the (1-1)st lower opening, a (1-2)nd upper opening overlapping the (1-2)nd lower opening, a (1-3)rd upper opening overlapping the (1-3)rd lower opening, and a (1-4)th upper opening overlapping the (1-4)th lower opening, a width of the (1-1)st upper opening, a width of the (1-2)nd lower opening, a width of the (1-3)rd lower opening, and a width of the (1-4)th lower opening are same, a width of the (1-1)st upper opening, a width of the (1-2)nd lower opening, a width of the (1-3)rd upper opening, and a width of the (1-4)th upper opening are same, the (1-3)rd upper opening is shifted to one side facing the first non-folded area of the (1-3)rd lower opening in the first direction, and the (1-4)th upper opening is shifted to one side facing the second non-folded area of the (1-4)th lower opening in the first direction.

In an embodiment, a central point of the (1-3)rd upper opening may be apart in a first non-folded area direction from a central point of the (1-3)rd lower opening by a (1-3)rd separation distance in a plan view, and a central point of the (1-4)th upper opening may be apart in a second non-folded area direction from a central point of the (1-4)th lower opening by a (1-4)th separation distance in the plan view.

In an embodiment, a central point of the (1-1)st upper opening may be disposed at a same position as a position of a central point of the (1-1)st lower opening in a plan view, and a central point of the (1-2)nd upper opening may be disposed at a same position as a position of a central point of the (1-2)nd lower opening in the plan view.

In an embodiment, the (1-1)st upper opening may be disposed not to be shifted to one side of the (1-1)st lower opening in the first direction, and the (1-2)nd upper opening may be disposed not to be shifted to one side of the (1-2)nd lower opening in the first direction.

In an embodiment, the display apparatus may further include a plurality of first pixel electrodes, a plurality of second pixel electrodes, and a plurality of third pixel electrodes disposed over the substrate and arranged apart from each other, a plurality of first emission layers respectively disposed on the plurality of first pixel electrodes and configured to emit red light, a plurality of second emission layers respectively disposed on the plurality of second pixel electrodes and configured to emit blue light, a plurality of third emission layers respectively disposed on the plurality of third pixel electrodes and configured to emit green light, and an opposite electrode overlapping the plurality of first pixel electrodes, the plurality of second pixel electrodes, and the plurality of third pixel electrodes. The pixel-defining layer may define a (2-1)st lower opening and a (3-1)st lower opening overlapping the first non-folded area, a (2-2)nd lower opening and a (3-2)nd lower opening overlapping the second non-folded area, a (2-3)rd lower opening and a (3-3)rd lower opening overlapping the first foldable area, and a (2-4)th lower opening and a (3-4)th lower opening overlapping the second foldable area, each of the (1-1)st lower opening, the (1-2)nd lower opening, the (1-3)rd lower opening, and the (1-4)th lower opening may expose a central portion of each of the plurality of first pixel electrodes, each of the (2-1)st lower opening, the (2-2)nd lower opening, the (2-3)rd lower opening, and the (2-4)th lower opening may expose a central portion of each of the plurality of second pixel electrodes, and each of the (3-1)st lower opening, the (3-2)nd lower opening, the (3-3)rd lower opening, and the (3-4)th lower opening may expose a central portion of each of the plurality of third pixel electrodes.

In an embodiment, the light-blocking layer may define a (2-1)st upper opening overlapping the (2-1)st lower opening, a (3-1)st upper opening overlapping the (3-1)st lower opening, a (2-2)nd upper opening overlapping the (2-2)nd lower opening, a (3-2)nd upper opening overlapping the (3-2)nd lower opening, a (2-3)rd upper opening overlapping the (2-3)rd lower opening, a (3-3)rd upper opening overlapping the (3-3)rd lower opening, a (2-4)th upper opening overlapping the (2-4)th lower opening, and a (3-4)th upper opening overlapping the (3-4)th lower opening, the (2-3)rd upper opening may be shifted to one side facing the first non-folded area of the (2-3)rd lower opening in the first direction, the (3-3)rd upper opening may be shifted to one side facing the first non-folded area of the (3-3)rd lower opening in the first direction, the (2-4)th upper opening may be shifted to one side facing the second non-folded area of the (2-4)th lower opening in the first direction, and the (3-4)th upper opening may be shifted to one side facing the first non-folded area of the (3-4)th lower opening in the first direction.

In an embodiment, in the plan view, a central point of the (2-3)rd upper opening may be apart by a (2-3)rd separation distance in the first non-folded area direction from a central point of the (2-3)rd lower opening, in the plan view, a central point of the (3-3)rd upper opening may be apart by a (3-3)rd separation distance in the first non-folded area direction from a central point of the (3-3)rd lower opening, in the plan view, a central point of the (2-4)th upper opening may be apart by a (2-4)th separation distance in the second non-folded area direction from a central point of the (2-4)th lower opening, and, in the plan view, a central point of the (3-4)th upper opening may be apart by a (3-4)th separation distance in the second non-folded area direction from a central point of the (3-4)th lower opening.

In an embodiment, the (1-3)rd separation distance, the (2-3)rd separation distance, and the (3-3)rd separation distance may be different from one another, and the (1-4)th separation distance, the (2-4)th separation distance, and the (3-4)th separation distance may be different from one another.

In an embodiment, the (1-3)rd lower opening may be provided in plural, the (1-3)rd upper opening may be provided in plural, the first foldable area may include a (1-1)st foldable area adjacent to the first non-folded area, a (1-2)nd foldable area adjacent to the second foldable area, and a (1-3)rd foldable area between the (1-1)st foldable area and the (1-2)nd foldable area, in a plan view, a central point of the (1-3)rd upper opening overlapping the (1-3)rd lower opening overlapping the (1-1)st foldable area may be apart by a (1-3-1)st separation distance from a central point of the (1-3)rd lower opening overlapping the (1-1)st foldable area, in the plan view, a central point of the (1-3)rd upper opening overlapping the (1-3)rd lower opening overlapping the (1-2)nd foldable area may be apart by a (1-3-2)nd separation distance from the central point of the (1-3)rd lower opening overlapping the (1-2)nd foldable area, in the plan view, a central point of the (1-3)rd upper opening overlapping the (1-3)rd lower opening overlapping the (1-3)rd foldable area may be apart by a (1-3-3)rd separation distance from a central point of the (1-3)rd lower opening overlapping the (1-3)rd foldable area, and the (1-3-3)rd separation distance may be greater than each of the (1-3-1)st separation distance and the (1-3-2)nd separation distance.

In an embodiment, the (1-4)th lower opening may be provided in plural, and the (1-4)th upper opening may be provided in plural, the second foldable area may include a (2-1)st foldable area adjacent to the second non-folded area, a (2-2)nd foldable area adjacent to the first foldable area, and a (2-3)rd foldable area between the (2-1)st foldable area and the (2-2)nd foldable area, in the plan view, a central point of the (1-4)th upper opening overlapping the (1-4)th lower opening overlapping the (2-1)st foldable area may be apart by a (1-4-1)st separation distance from a central point of the (1-4)th lower opening overlapping the (2-1)st foldable area, in the plan view, a central point of the (1-4)th upper opening overlapping the (1-4)th lower opening overlapping the (2-2)nd foldable area may be apart by a (1-4-2)nd separation distance from the central point of the (1-4)th lower opening overlapping the (2-2)nd foldable area, in the plan view, a central point of the (1-4)th upper opening overlapping the (1-4)th lower opening overlapping the (2-3)rd foldable area may be apart by a (1-4-3)rd separation distance from a central point of the (1-4)th lower opening overlapping the (2-3)rd foldable area, and the (1-4-3)rd separation distance may be greater than each of the (1-4-1)st separation distance and the (1-4-2)nd separation distance.

In an embodiment of the disclosure, a display apparatus includes a substrate including a first non-folded area, a second non-folded area, and a foldable area, the second non-folded area is apart in a first direction from the first non-folded area, and the foldable area is disposed between the first non-folded area and the second non-folded area and extending in a second direction crossing the first direction, a pixel-defining layer disposed over the substrate, and a light-blocking layer disposed over the pixel-defining layer, the foldable area includes a first foldable area adjacent to the first non-folded area and a second foldable area adjacent to the second non-folded area, the pixel-defining layer defines a (1-1)st lower opening overlapping the first non-folded area, a (1-2)nd lower opening overlapping the second non-folded area, a (1-3)rd lower opening overlapping the first foldable area, and a (1-4)th lower opening overlapping the second foldable area, the light-blocking layer defines a (1-1)st upper opening overlapping the (1-1)st lower opening, a (1-2)nd upper opening overlapping the (1-2)nd lower opening, a (1-3)rd upper opening overlapping the (1-3)rd lower opening, and a (1-4)th upper opening overlapping the (1-4)th lower opening, a width of the (1-1)st lower opening, a width of the (1-2)nd lower opening, a width of the (1-3)rd lower opening, and a width of the (1-4)th lower opening are same, a width of the (1-2)nd upper opening is the same as a width of the (1-1)st upper opening, and each of a width of the (1-3)rd upper opening and a width of the (1-4)th upper opening is longer than the width of the (1-1)st upper opening, the (1-3)rd lower opening is shifted to one side of the first non-folded area of the (1-3)rd lower opening in the first direction, and the (1-4)th upper opening is shifted to one side of the second non-folded area of the (1-4)th lower opening in the first direction.

In an embodiment, a central point of the (1-3)rd upper opening may be apart in a first non-folded area direction from a central point of the (1-3)rd lower opening by a (1-3)rd separation distance in a plan view, and a central point of the (1-4)th upper opening may be apart in a second non-folded area direction from a central point of the (1-4)th lower opening by a (1-4)rd separation distance in the plan view.

In an embodiment, a central point of the (1-1)st upper opening may be disposed at a same position as a position of a central point of the (1-1)st lower opening in a plan view, and a central point of the (1-2)nd upper opening may be disposed at a same position as a position of a central point of the (1-2)nd lower opening in the plan view.

In an embodiment, the (1-1)st upper opening may be shifted to one side of the (1-1)st lower opening in the first direction, and the (1-2)nd upper opening may not be shifted to one side of the (1-2)nd lower opening in the first direction.

In an embodiment, the display apparatus may further include a plurality of first pixel electrodes, a plurality of second pixel electrodes, and a plurality of third pixel electrodes disposed over the substrate and arranged apart from each other, a plurality of first emission layers disposed on each of the plurality of first pixel electrodes and configured to emit red light, a plurality of second emission layers disposed on each of the plurality of second pixel electrodes and configured to emit blue light, a plurality of third emission layers disposed on each of the plurality of third pixel electrodes and configured to emit green light, and an opposite electrode overlapping the plurality of first pixel electrodes, the plurality of second pixel electrodes, and the plurality of third pixel electrodes. The pixel-defining layer may define a (2-1)st lower opening and a (3-1)st lower opening overlapping the first non-folded area, a (2-2)nd lower opening and a (3-2)nd lower opening overlapping the second non-folded area, a (2-3)rd lower opening and a (3-3)rd lower opening overlapping the first foldable area, and a (2-4)th lower opening and a (3-4)th lower opening overlapping the second foldable area, each of the (1-1)st lower opening, the (1-2)nd lower opening, the (1-3)rd lower opening, and the (1-4)th lower opening may expose a central portion of each of the plurality of first pixel electrodes, each of the (2-1)st lower opening, the (2-2)nd lower opening, the (2-3)rd lower opening, and the (2-4)th lower opening may expose a central portion of each of the plurality of second pixel electrodes, and each of the (3-1)st lower opening, the (3-2)nd lower opening, the (3-3)rd lower opening, and the (3-4)th lower opening may expose a central portion of each of the plurality of third pixel electrodes.

In an embodiment, the light-blocking layer may define a (2-1)st upper opening overlapping the (2-1)st lower opening, a (3-1)st upper opening overlapping the (3-1)st lower opening, a (2-2)nd upper opening overlapping the (2-2)nd lower opening, a (3-2)nd upper opening overlapping the (3-2)nd lower opening, a (2-3)rd upper opening overlapping the (2-3)rd lower opening, a (3-3)rd upper opening overlapping the (3-3)rd lower opening, a (2-4)th upper opening overlapping the (2-4)th lower opening, and a (3-4)th upper opening overlapping the (3-4)th lower opening. The (2-3)rd upper opening may be shifted to one side facing the first non-folded area of the (2-3)rd lower opening in the first direction, the (3-3)rd upper opening may be shifted to one side facing the first non-folded area of the (3-3)rd lower opening in the first direction, the (2-4)th upper opening may be shifted to one side facing the second non-folded area of the (2-4)th lower opening in the first direction, and the (3-4)th upper opening may be shifted to one side facing the first non-folded area of the (3-4)th lower opening in the first direction.

In an embodiment, in the plan view, a central point of the (2-3)rd upper opening may be apart by a (2-3)rd separation distance in the first non-folded area direction from a central point of the (2-3)rd lower opening, in the plan view, a central point of the (3-3)rd upper opening may be apart by a (3-3)rd separation distance in the first non-folded area direction from a central point of the (3-3)rd lower opening, in the plan view, a central point of the (2-4)th upper opening may be apart by a (2-4)th separation distance in the second non-folded area direction from a central point of the (2-4)th lower opening, and in the plan view, a central point of the (3-4)th upper opening may be apart by a (3-4)th separation distance in the second non-folded area direction from a central point of the (3-4)th lower opening.

In an embodiment, the (1-3)rd separation distance, the (2-3)rd separation distance, and the (3-3)rd separation distance may be different from one another, and the (1-4)th separation distance, the (2-4)th separation distance, and the (3-4)th separation distance may be different from one another.

In an embodiment, the (1-3)rd lower opening may be provided in plural, the (1-3)rd upper opening may be provided in plural, the first foldable area may include a (1-1)st foldable area adjacent to the first non-folded area, a (1-2)nd foldable area adjacent to the second foldable area, and a (1-3)rd foldable area between the (1-1)st foldable area and the (1-2)nd foldable area, in a plan view, a central point of the (1-3)rd upper opening overlapping the (1-3)rd lower opening overlapping the (1-1)st foldable area may be apart by a (1-3-1)st separation distance from a central point of the (1-3)rd lower opening overlapping the (1-1)st foldable area, in the plan view, a central point of the (1-3)rd upper opening overlapping the (1-3)rd lower opening overlapping the (1-2)nd foldable area may be apart by a (1-3-2)nd separation distance from the central point of the (1-3)rd lower opening overlapping the (1-2)nd foldable area, in the plan view, a central point of the (1-3)rd upper opening overlapping the (1-3)rd lower opening overlapping the (1-3)rd foldable area may be apart by a (1-3-3)rd separation distance from a central point of the (1-3)rd lower opening overlapping the (1-3)rd foldable area, and the (1-3-3)rd separation distance may be greater than each of the (1-3-1)st separation distance and the (1-3-2)nd separation distance.

In an embodiment, the (1-4)th lower opening may be provided in plural, and the (1-4)th upper opening may be provided in plural, the second foldable area may include a (2-1)st foldable area adjacent to the second non-folded area, a (2-2)nd foldable area adjacent to the first foldable area, and a (2-3)rd foldable area between the (2-1)st foldable area and the (2-2)nd foldable area, in the plan view, a central point of the (1-4)th upper opening overlapping the (1-4)th lower opening overlapping the (2-1)st foldable area may be apart by a (1-4-1)st separation distance from a central point of the (1-4)th lower opening overlapping the (2-1)st foldable area, in the plan view, a central point of the (1-4)th upper opening overlapping the (1-4)th lower opening overlapping the (2-2)nd foldable area may be apart by a (1-4-2)nd separation distance from the central point of the (1-4)th lower opening overlapping the (2-2)nd foldable area, in the plan view, a central point of the (1-4)th upper opening overlapping the (1-4)th lower opening overlapping the (2-3)rd foldable area may be apart by a (1-4-3)rd separation distance from a central point of the (1-4)th lower opening overlapping the (2-3)rd foldable area, and the (1-4-3)rd separation distance may be greater than each of the (1-4-1)st separation distance and the (1-4-2)nd separation distance.

These and/or other features will become apparent and more readily appreciated from the following description of the embodiments, the accompanying drawings, and claims.

BRIEF DESCRIPTION OF THE DRAWINGS

The above and other features and advantages of illustrative embodiments of the disclosure will be more apparent from the following description taken in conjunction with the accompanying drawings, in which:

FIG. 3 is a schematic cross-sectional view of a display apparatus of FIG. 1, taken along line I-I' of FIG. 1;

FIG. 13 is a view for explaining a relative position relationship between an upper opening and a lower opening;

FIG. 14 is a schematic cross-sectional view of a portion of a display apparatus according to a comparative example;

FIG. 19 is a schematic plan view of an embodiment of a portion of a display apparatus;

DETAILED DESCRIPTION

Figure 1:
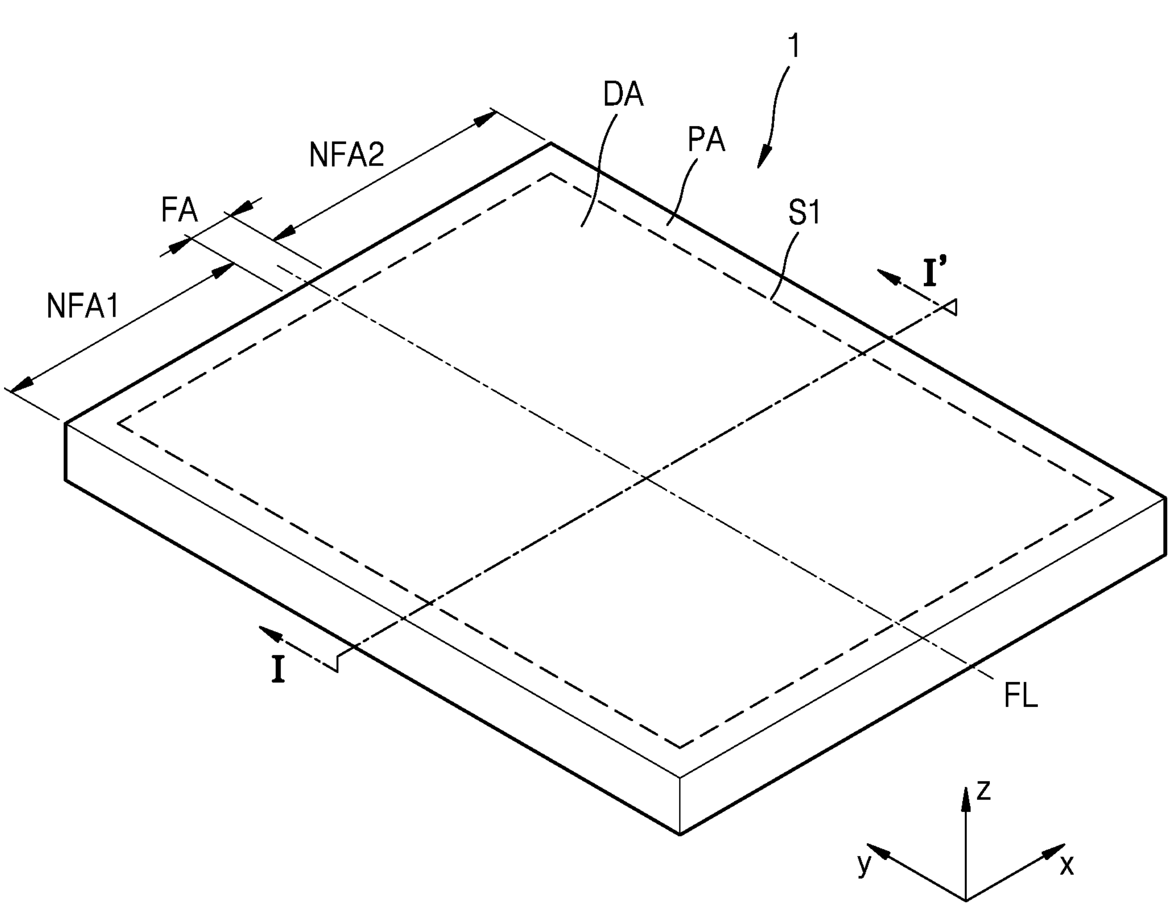
FIG. 1 is a schematic perspective view of an embodiment of a display apparatus.

Reference will now be made in detail to embodiments, illustrative embodiments of which are illustrated in the accompanying drawings, where like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. As the disclosure allows for various changes and numerous embodiments, illustrative embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

While such terms as "first" and "second" may be used to describe various components, such components must not be limited to the above terms. The above terms are used to distinguish one element from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

In the specification, "A and/or B" means A or B, or A and B. In the specification, "at least one of A and B" means A or B, or A and B.

In the specification, when various elements such as a layer, a region, a plate, and the like are disposed "on" another element, not only the elements may be disposed "directly on" the other element, but another element may be disposed therebetween.

It will be understood that when a layer, region, or element is referred to as being "connected" to another layer, region, or element, it may be "directly connected" to the other layer, region, or element or may be "indirectly connected" to the other layer, region, or element with another layer, region, or element interposed therebetween. For example, it will be understood that when a layer, region, or element is referred to as being "electrically connected" to another layer, region, or element, it may be "directly electrically connected" to the other layer, region, or element or may be "indirectly electrically connected" to the other layer, region, or element with another layer, region, or element interposed therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Hereinafter, embodiments will be described with reference to the accompanying drawings, where like reference numerals refer to like elements throughout and a repeated description thereof is omitted. Sizes of elements in the drawings may be exaggerated or reduced for convenience of explanation. As an example, the size and thickness of each element shown in the drawings are arbitrarily represented for convenience of description, and thus, the disclosure is not necessarily limited thereto.

In the specification, "in a plan view" means a case of viewing in a direction perpendicular to a substrate.

Figure 2:
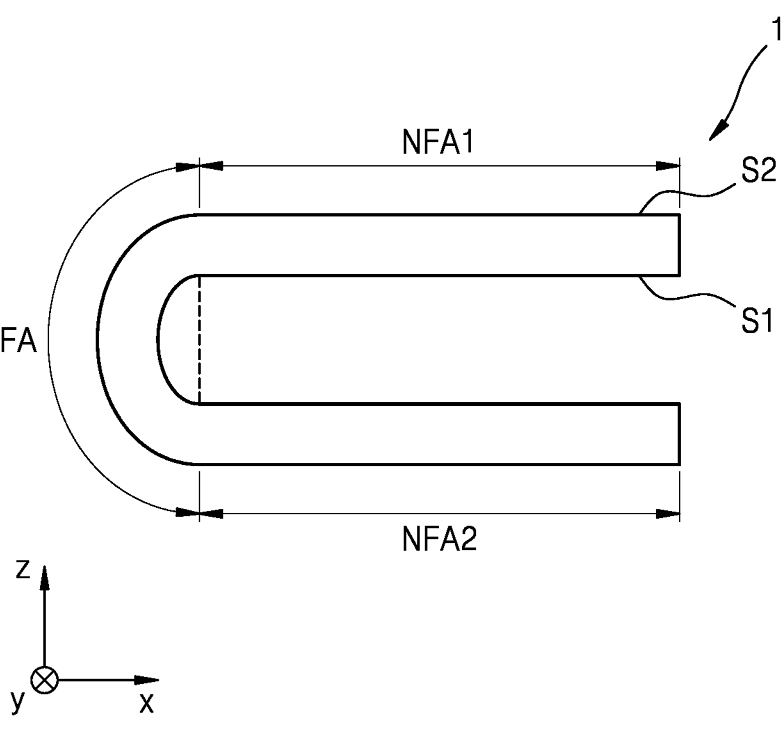
FIG. 2 is a schematic cross-sectional view of an embodiment of the display apparatus.

FIG. 1 is a schematic perspective view of an embodiment of a display apparatus 1, and FIG. 2 is a schematic cross-sectional view of the display apparatus 1. Specifically, FIG. 1 shows the display apparatus 1 before being folded, and FIG. 2 shows the display apparatus 1 folded. In the specification, the expression "before folding" means a case where the display apparatus 1 is not folded and at least a portion of the display apparatus 1 is not transformed by folding.

The display apparatus 1 may have a polygonal shape including quadrangles. In an embodiment, the display apparatus 1 may have a quadrangular shape, e.g., a rectangular shape in which a horizontal length thereof is greater than a vertical length, a rectangular shape in which a horizontal length thereof is less than a vertical length, or a square shape. In an alternative embodiment, the display apparatus 1 may have various shapes such as an elliptical shape or a circular shape. Although it is shown in FIG. 1 that the display apparatus 1 has a rectangular shape in which a horizontal length is greater than a vertical length, the disclosure is not limited thereto.

The display apparatus 1 may include a first surface S1 and a second surface S2 opposite the first surface S1. The display apparatus 1 may display images in the first surface S1. That is, the first surface S1 may include a display surface. Specifically, the first surface S1 may include a display area DA and a peripheral area PA. The display area DA is a region configured to display images. As shown in FIG. 1, the display area DA may have a polygonal shape including quadrangles. In an embodiment, the display area DA may have a rectangular shape in which a horizontal length thereof is greater than a vertical length, a rectangular shape in which a horizontal length thereof is less than a vertical length, or a square shape. In an alternative embodiment, the display area DA may have various shapes such as an elliptical shape or a circular shape. The peripheral area PA is a region configured not to display images and may surround the display area DA entirely. A driver or a main power line configured to provide electrical signals or power to pixel circuits may be disposed in the peripheral area PA. A pad may be disposed in the peripheral area PA, and the pad is a region to which electronic elements or a printed circuit board may be electrically connected. In an embodiment, the first surface S1 may be an upper surface (in a +z direction) of the display apparatus 1. The second surface S2 may be a lower surface (in a −z direction) of the display apparatus 1. In an embodiment, the display apparatus 1 may display images in also the second surface S2.

The display apparatus 1 may be folded. That is, at least a portion of the display apparatus 1 may be flexible, and when the flexible portion is bent, the display apparatus 1 may be folded. Accordingly, the display apparatus 1 may include a foldable area and a non-folded area provided to at least one side of the foldable area and not folded. In the specification, "non-folded" means not folded, which includes not only a case of being inflexible and hard to be folded, but also a case of having flexibility but not being folded. The display apparatus 1 may display images in not only the non-folded area but also the foldable area.

As shown in FIG. 1, the display apparatus 1 may include a first non-folded area NFA1, a second non-folded area NFA2, and a foldable area FA. The first non-folded area NFA1 and the second non-folded area NFA2 may be non-folded areas, and the foldable area FA may be a flexible region that is foldable.

The foldable area FA may extend in a direction crossing a virtual straight line connecting the first non-folded area NFA1 and the second non-folded area NFA2 to each other. Specifically, in the case where the display apparatus 1 is in a state before being folded, the first non-folded area NFA1 and the second non-folded area NFA2 may be apart from each other in a first direction (e.g., an x direction or a −x direction). The foldable area FA may be disposed between the first non-folded area NFA1 and the second non-folded area NFA2. Specifically, the first non-folded area NFA1 may be adjacent to one side of the foldable area FA, and the second non-folded area NFA2 may be adjacent to another side of the foldable area FA. In the case where the display apparatus 1 is in a state before being folded, the foldable area FA may extend in a second direction (e.g., a y direction or a −y direction) crossing the first direction.

A folding line FL may be provided in the foldable area FA in the second direction (e.g., the y direction or the −y direction), which is the extension direction of the foldable area FA. Accordingly, the display apparatus 1 may be folded in the foldable area FA. The foldable area FA and the folding line FL of the foldable area FA may overlap a region in which images of the display apparatus 1 are displayed. In the case where the display apparatus 1 is folded, a portion in which images are displayed may be folded.

For convenience of description, although it is shown in FIG. 1 that the first non-folded area NFA1 and the second non-folded area NFA2 have the same or similar area and the display apparatus 1 includes one foldable area FA, the disclosure is not limited thereto. In an embodiment, the first non-folded area NFA1 and the second non-folded area NFA2 may have different areas. In addition, the display apparatus 1 may include a plurality of foldable areas FA. In this case, the plurality of non-folded areas may be apart from each other, and each of the plurality of foldable areas FA may be disposed between the non-folded areas. Each foldable area FA may be folded with respect to the folding line FL, and the folding line FL may be provided in plural.

Although it is shown in FIG. 1 that the folding line FL passes through the center of the foldable area FA, and the foldable area FA is axisymmetric with respect to the folding line FL, the disclosure is not limited thereto. In an embodiment, the folding line FL may be provided asymmetrically in the foldable area FA.

As shown in FIG. 2, the display apparatus 1 may be folded such that the first surface S1 of the first non-folded area NFA1 faces the first surface S1 of the second non-folded area NFA2. In other words, when the foldable area FA of the display apparatus 1 is bent, the first surface S1 of the first non-folded area NFA1 and the first surface S1 of the second non-folded area NFA2 may face each other. Even when the display apparatus 1 is folded, the foldable area FA may extend in a direction crossing a virtual straight line connecting the first non-folded area NFA1 and the second non-folded area NFA2 to each other. Specifically, when the display apparatus 1 is folded, the foldable area FA may extend in the second direction (e.g., the y direction or the −y direction) crossing a virtual straight line (e.g., a straight line parallel to the z axis direction) connecting the first non-folded area NFA1 and the second non-folded area NFA2 to each other.

The foldable area FA may be folded and then unfolded. Accordingly, the display apparatus 1 may be unfolded. In the specification, "unfolding" means a case where the display apparatus 1 is unfolded after being folded. That is, the display apparatus 1 may be a foldable display apparatus.

In the specification, the term "folding" means a shape is not fixed but changes from the original shape to a different shape and includes being folded, curved, or bent along at least one predetermined line, that is, the folding line FL. Accordingly, although FIG. 2 shows the state in which the first surface S1 of the first non-folded area NFA1 and the first surface S1 of the second non-folded area NFA2 are folded to be parallel to each other and to face each other, the disclosure is not limited thereto. In an embodiment, the first surface S1 of the first non-folded area NFA1 and the first surface S1 of the second non-folded area NFA2 may be folded to define a preset angle (e.g., an acute angle or an obtuse angle) with the foldable area FA therebetween.

Figure 3:
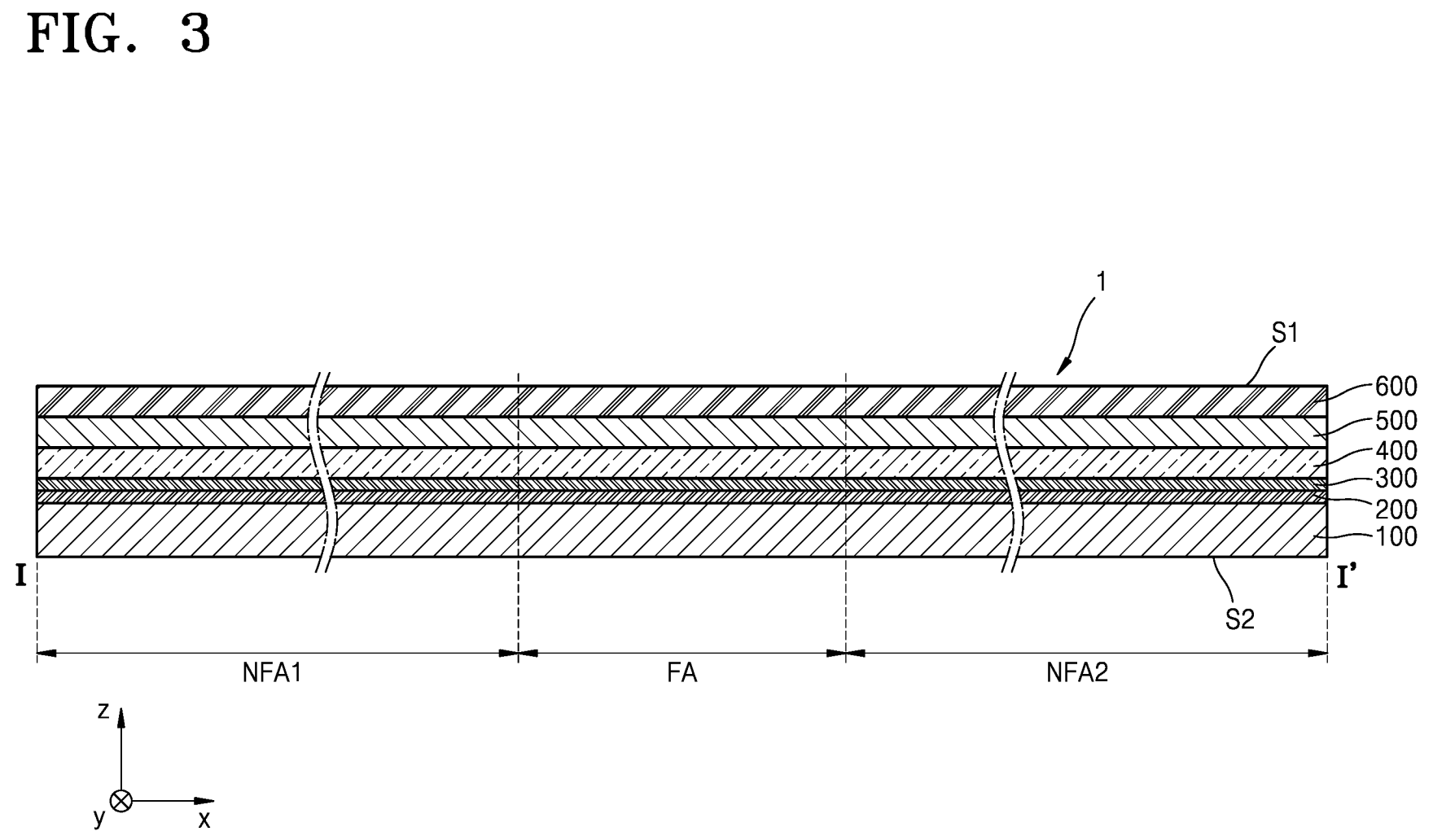

FIG. 3 is a schematic cross-sectional view of the display apparatus 1 of FIG. 1, taken along line I-I' of FIG. 1.

Referring to FIG. 3, the display apparatus 1 may include a substrate 100, a pixel circuit layer 200, a display element layer 300, an encapsulation layer 400, a touch sensor layer 500, and an anti-reflection layer 600.

The substrate 100 may include various flexible or bendable materials. In an embodiment, the substrate 100 may include glass, metal, or a polymer resin. In addition, the substrate 100 may include a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multi-layered structure including two layers each including the polymer resin, and a barrier layer including an inorganic material (such as silicon oxide ($SiO_x$), silicon nitride ($SiN_x$), and silicon oxynitride ($SiO_xN_y$) therebetween. However, various modifications may be made.

As described above, the display apparatus 1 may include the first non-folded area NFA1, the second non-folded area NFA2, and the foldable area FA. Because the display apparatus 1 includes the substrate 100, it may be understood that the substrate 100 includes the first non-folded area NFA1, the second non-folded area NFA2, and the foldable area FA. Hereinafter, for convenience of description, it will be described that the substrate 100 includes the first non-folded area NFA1, the second non-folded area NFA2, and the foldable area FA.

The pixel circuit layer 200 may be disposed on the substrate 100, and the display element layer 300 may be disposed on the pixel circuit layer 200. The pixel circuit layer 200 may include a plurality of pixel circuits. Each of the pixel circuits may include a transistor and a storage capacitor. The display element layer 300 may include a plurality of display elements respectively connected to the pixel circuits.

The encapsulation layer 400 may be disposed on the display element layer 300. In an embodiment, the encapsulation layer 400 may include at least one inorganic encapsulation layer and at least one organic encapsulation layer. The at least one inorganic encapsulation layer may include at least one inorganic material among aluminum oxide ($Al_2O_3$), titanium oxide ($TiO_2$), tantalum oxide ($Ta_2O_5$), zinc oxide ($ZnO_x$), silicon oxide ($SiO_2$), silicon nitride ($SiN_x$), and silicon oxynitride ($SiO_xN_y$). The at least one organic encapsulation layer may include a polymer-based material. The polymer-based material may include an acryl-based resin, an epoxy-based resin, polyimide, or polyethylene. In an embodiment, the at least one organic encapsulation layer may include acrylate.

The touch sensor layer 500 may be disposed on the encapsulation layer 400. The touch sensor layer 500 is a layer configured to sense a user's touch input and may sense a user's touch input using at least one of various touch methods such as a resistance layer method, a capacitance method, or the like. The touch sensor layer 500 may include sensing electrodes to sense a touch input.

The anti-reflection layer 600 may be disposed on the touch sensor layer 500. The anti-reflection layer 600 may reduce reflectivity of light (external light) incident toward the display apparatus 1 from the outside. In an embodiment, the anti-reflection layer 600 may include a light-blocking layer (e.g., a black matrix) and color filters. The color filters may be disposed by taking into account colors of light emitted respectively from the display elements of the display apparatus 1. In an embodiment, the anti-reflection layer 600 may include a red, blue, or green color filter.

Figure 4:
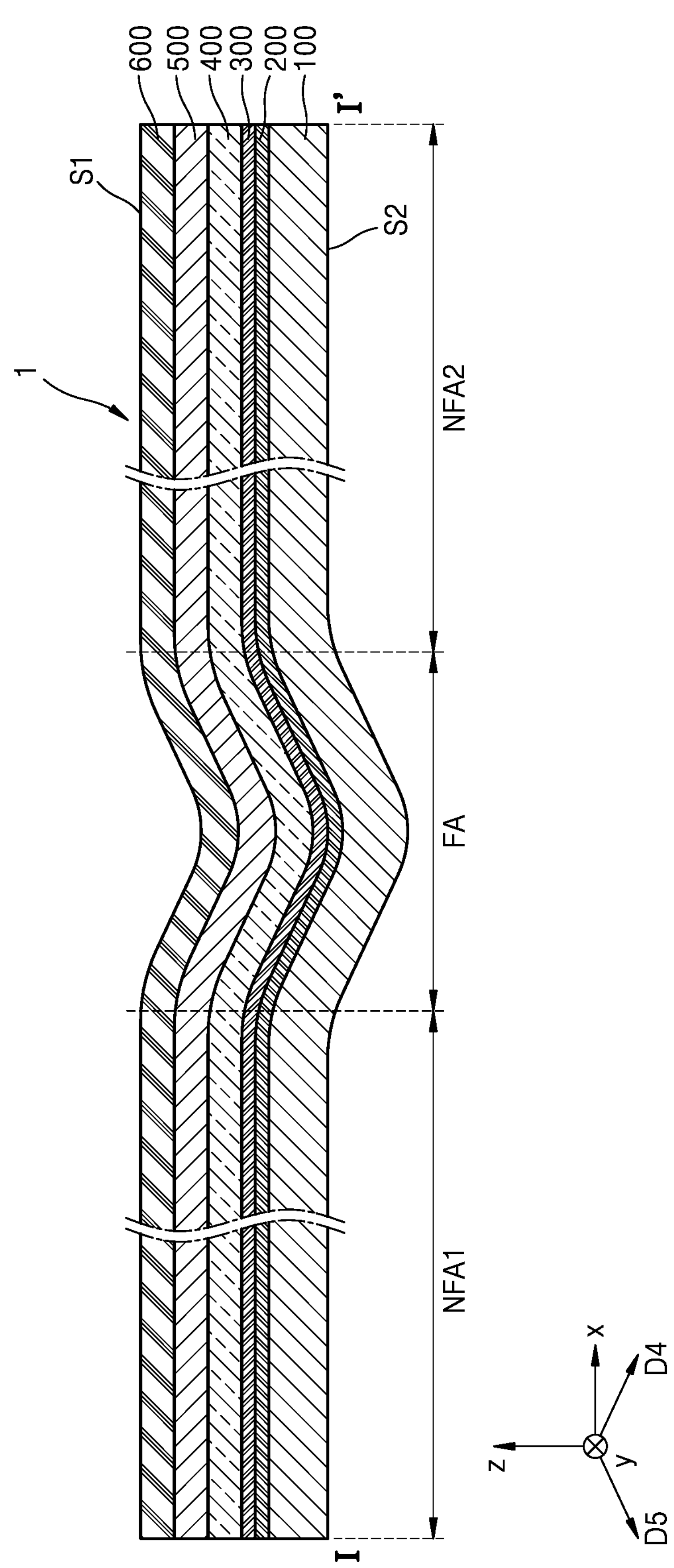
FIG. 4 is a view showing a state after the display apparatus shown in FIG. 3 is folded and unfolded a plurality of times.

In the case where the display apparatus 1 is folded and unfolded over plurality of times, the foldable area FA, which is a folded and unfolded portion, may be transformed. FIG. 4 is a view showing a state after the display apparatus shown in FIG. 3 is folded and unfolded over a plurality of times. As shown in FIG. 4, in the case where the display apparatus 1 is folded and unfolded over plurality of times, the foldable area FA may have a concave shape. Specifically, a portion of the foldable area FA adjacent to the first non-folded area NFA1 may have a shape inclined in a fourth direction (e.g., a direction between the +x direction and the −z direction, that is, a D4 direction), and a portion of the foldable area FA adjacent to the second non-folded area NFA2 may have a shape inclined in a fifth direction (e.g., a direction between the −x direction and the −z direction, that is, a D5 direction). Because the portion of the foldable area FA adjacent to the first non-folded area NFA1 is connected to the portion of the foldable area FA adjacent to the second non-folded area NFA2, the central portion of the foldable area FA may collapse downward (e.g., the −z direction) and the foldable area FA may have a concave shape.

Figure 5:
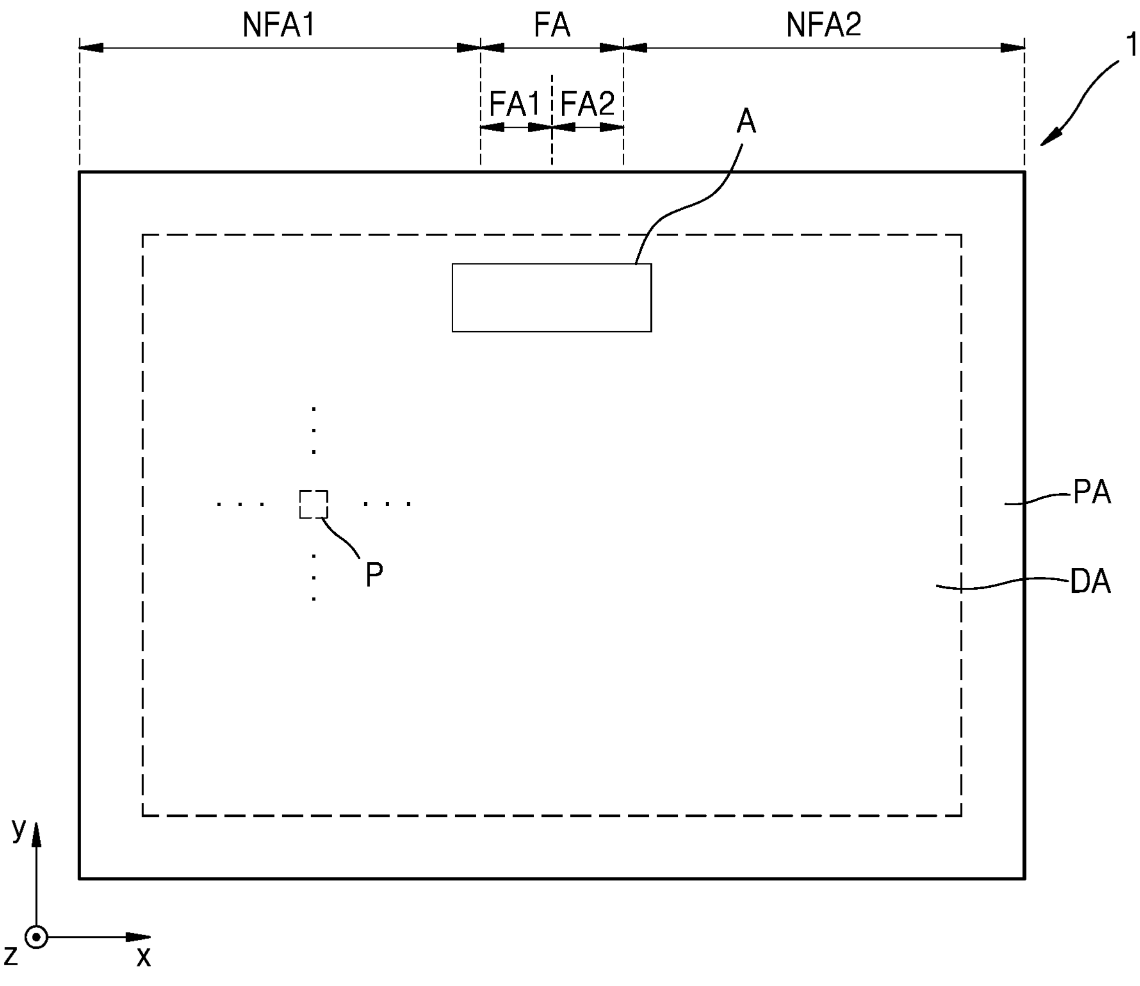
FIG. 5 is a schematic plan view of an embodiment of the display apparatus.

FIG. 5 is a schematic plan view of an embodiment of the display apparatus 1. Specifically, FIG. 5 shows the display apparatus 1 before being folded.

As described above, the display apparatus 1 may include the first non-folded area NFA1, the second non-folded area NFA2, and the foldable area FA. The foldable area FA may include a first foldable area FA1 and a second foldable area FA2. The foldable area FA may connect the first foldable area FA1 and the second foldable area FA2 to each other. The first foldable area FA1 may be a portion of the foldable area FA adjacent to the first non-folded area NFA1, and the second foldable area FA2 may be a portion of the foldable area FA adjacent to the second non-folded area NFA2.

The display apparatus 1 may include a plurality of pixels P. Each pixel P of the display apparatus 1 is a region configured to emit light of a preset color. The display apparatus 1 may display images using light emitted from the pixels P. In an embodiment, each pixel P may emit red, blue, or green light.

Figure 6:
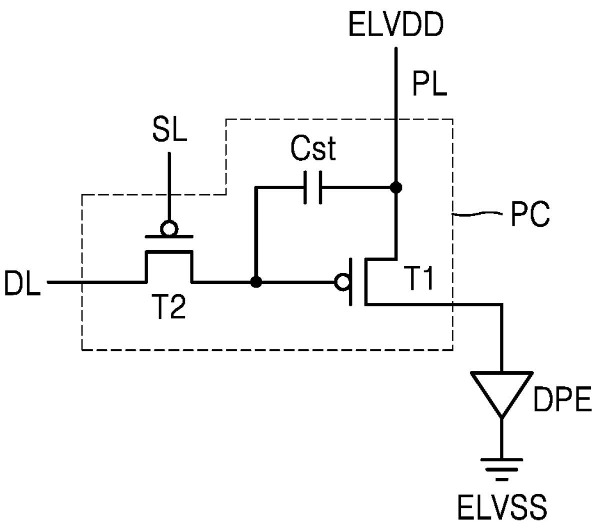
FIG. 6 is a schematic equivalent circuit diagram of an embodiment of a pixel circuit applicable to a display apparatus.

FIG. 6 is a schematic equivalent circuit diagram of an embodiment of a pixel circuit applicable to the display apparatus 1. A display element DPE is electrically connected to a pixel circuit PC. The pixel circuit PC may include a first thin-film transistor T1, a second thin-film transistor T2, and a storage capacitor Cst.

The second thin-film transistor T2 is a switching thin-film transistor, may be connected to a scan line SL and a data line DL, and configured to transfer a data voltage (or a data signal Dm) to the first thin-film transistor T1 based on a switching voltage (or a switching signal Sn), the data voltage being input from the data line DL, and the switching voltage being input from the scan line SL. The storage capacitor Cst may be connected to the second thin-film transistor T2 and a driving voltage line PL and configured to store a voltage corresponding to a difference between a voltage transferred from the second thin-film transistor T2 and a first power voltage ELVDD supplied to the driving voltage line PL.

The first thin-film transistor T1 is a driving thin-film transistor, may be connected to the driving voltage line PL and the storage capacitor Cst, and configured to control a driving current according to the voltage stored in the storage capacitor Cst, the driving current flowing from the driving voltage line PL to the display element DPE. The display element DPE may emit light having a preset brightness based on the driving current. An opposite electrode 330 (refer to FIG. 8) of the display element DPE may receive a second power voltage ELVSS.

Although it is described with reference to FIG. 6 that the pixel circuit PC includes two thin-film transistors and one storage capacitor, the disclosure is not limited thereto. The number of thin-film transistors and the number of storage capacitors may be variously changed according to the design of the pixel circuit PC. In an embodiment, the pixel circuit PC may include three or more thin-film transistors.

Figure 7:
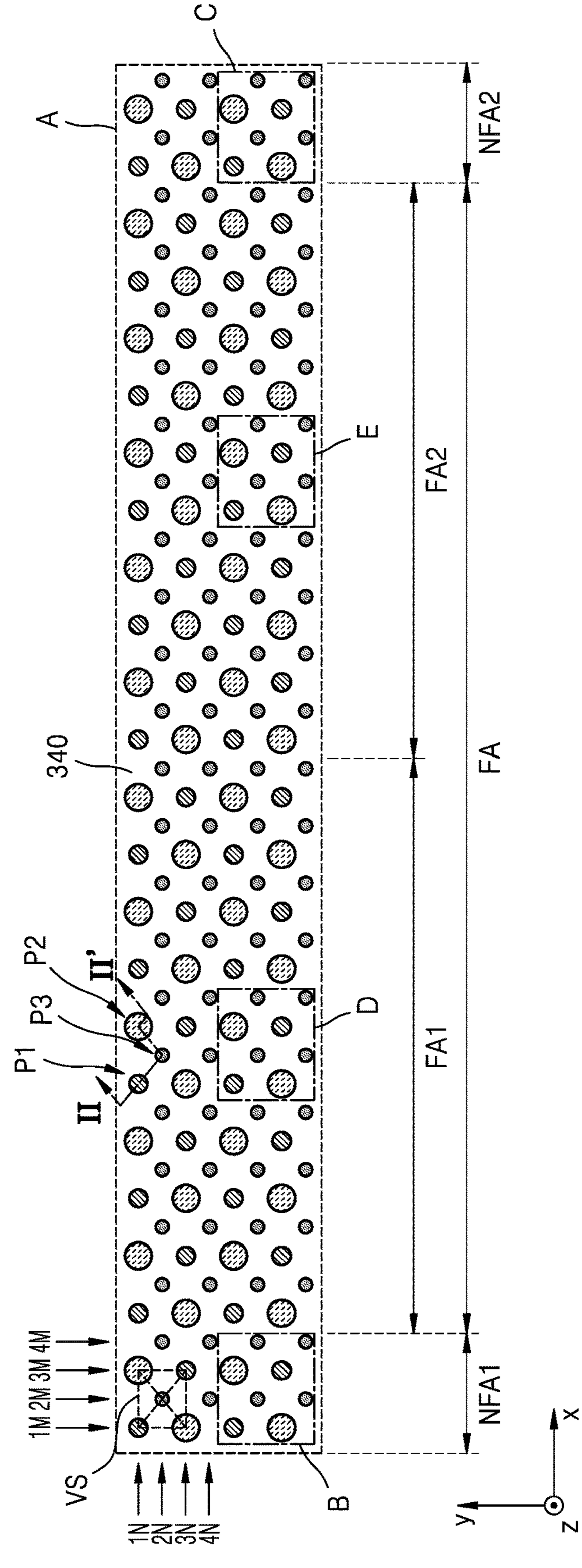
FIG. 7 is a schematic enlarged plan view of a region A of FIG. 5.
Figure 8:
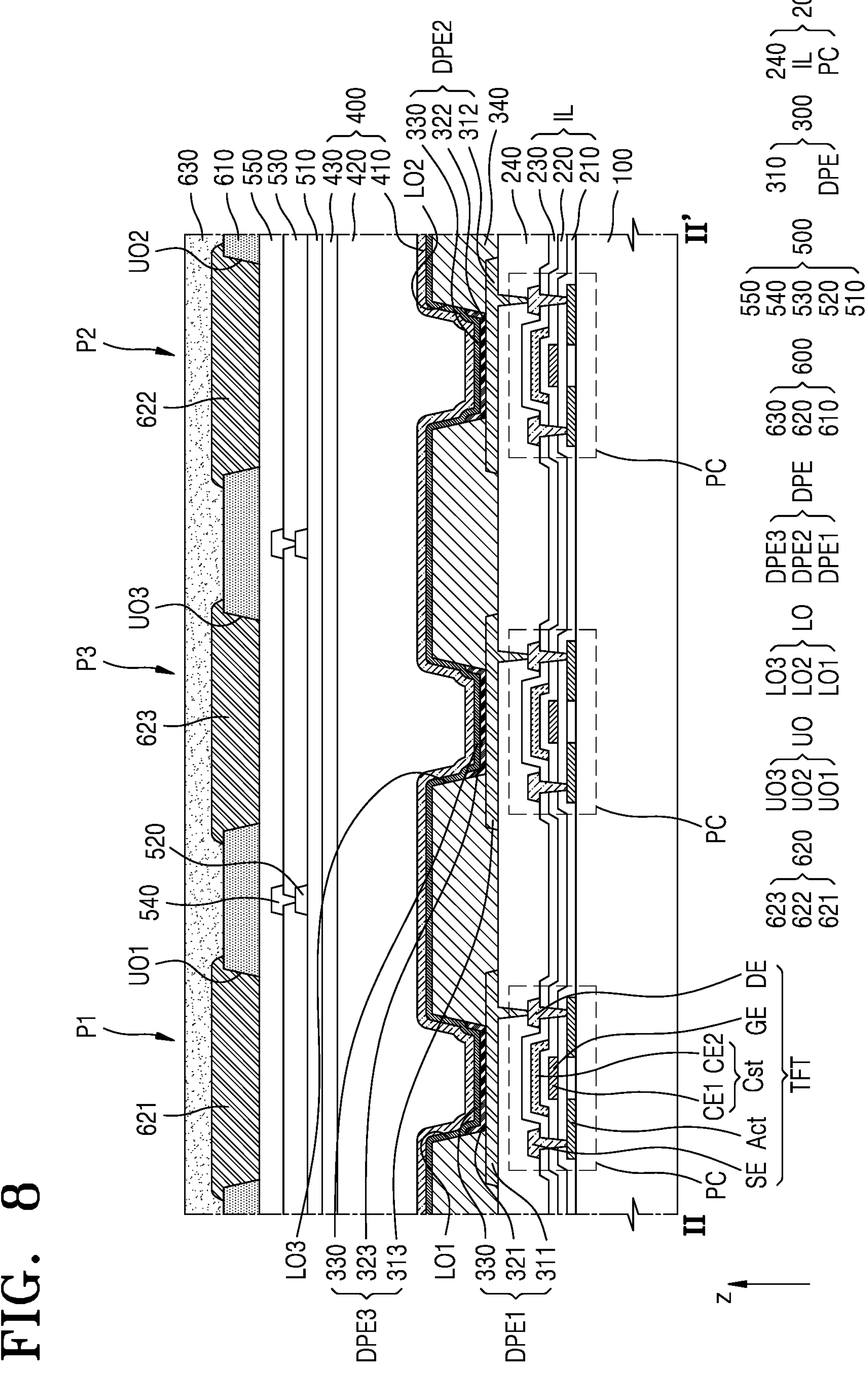
FIG. 8 is a schematic cross-sectional view of the display apparatus, taken along line II-II' of FIG. 7.

FIG. 7 is a schematic enlarged plan view of a region A of FIG. 5. FIG. 8 is a schematic cross-sectional view of the display apparatus, taken along line II-II' of FIG. 7. For convenience, FIG. 7 shows a plan view of a pixel-defining layer 340.

As shown in FIG. 7, the plurality of pixels P is arranged in the first non-folded area NFA1, the second non-folded area NFA2, the first foldable area FA1, and the second foldable area FA2. The plurality of pixels P may include a first pixel P1, a second pixel P2, and a third pixel P3 configured to emit light of different colors. Hereinafter, for convenience of description, it is described that the first pixel P1 is a red pixel, the second pixel P2 is a blue pixel, and the third pixel P3 is a green pixel. The red pixel is a pixel configured to emit red light, the blue pixel is a pixel configured to emit blue light, and the green pixel is a pixel configured to emit green light. Red light may be light in a wavelength band of about 580 nanometer (nm) to about 780 nm, blue light may be light in a wavelength band of about 400 nm to about 495 nm, and green light may be light in a wavelength band of about 495 nm to about 580 nm.

The first pixel P1 may be provided in plural, the second pixel P2 may be provided in plural, and the third pixel P3 may be provided in plural. The first pixels P1, the second pixels P2, and the third pixels P3 may be arranged in the first non-folded area NFA1, the second non-folded area NFA2, the first foldable area FA1, and the second foldable area FA2 with a preset rule.

In an embodiment, the first pixels P1, the second pixels P2, and the third pixels P3 may be arranged in a PenTile™ configuration as shown in FIG. 7. In an embodiment, the plurality of first pixels P1 and the plurality of second pixels P2 may be alternately arranged in the first row 1N, the plurality of third pixels P3 may be arranged apart from each other at a predetermined interval in a second row 2N adjacent thereto, the plurality of second pixels P2 and the plurality of first pixels P1 may be alternately arranged in a third row 3N adjacent thereto, and the plurality of third pixels P3 may be arranged apart from each other at a predetermined interval in a fourth row 4N adjacent thereto. Such pixel configuration may be repeated up to an N row. In this case, the sizes (or the areas) of the first pixel P1, the second pixel P2, and the third pixel P3 may be different from each other. Specifically, the size (or the area) of the first pixel P1 and the second pixel P2 may be greater than the size (or the area) of the third pixel P3. The size (or the area) of the second pixel P2 may be greater than the size (or the area) of the first pixel P1.

The plurality of first pixels P1 and the plurality of second pixels P2 arranged in the first row 1N, and the plurality of third pixels P3 in the second row 2N may be alternately arranged with each other. Accordingly, the plurality of first pixels P1 and the plurality of second pixels P2 may be alternately arranged in a first column 1M, the plurality of third pixels P3 may be arranged apart from each other at a preset interval in a second column 2M adjacent thereto, the plurality of second pixels P2 and the plurality of first pixels P1 may be alternately arranged in a third column 3M adjacent thereto, and the plurality of third pixels P3 may be arranged apart from each other at a preset interval in a fourth column 4M adjacent thereto. Such pixel configuration may be repeated up to an M column.

Such pixel configuration structure may be expressed, in which first pixels P1 are respectively arranged on first and third vertexes among the vertexes of a virtual quadrangle VS with a third pixel P3 centered at the center of the quadrangle, and second pixels P2 are respectively arranged on second and fourth vertexes, which are the rest of the vertexes. In this case, the virtual quadrangle VS may be variously changed to a rectangle, a rhombus, a square, or the like.

Such a pixel configuration structure may be also referred to as a pentile matrix structure or a Pentile structure. In this pixel configuration structure, rendering driving that expresses a color by sharing adjacent pixels may be applied. Accordingly, a relatively high resolution may be implemented with a relatively small number of pixels.

The first pixel P1, the second pixel P2, and the third pixel P3 shown in FIG. 7 may respectively emit red, blue, and green light using the display elements arranged in the corresponding pixels. Accordingly, the configuration of the pixels may correspond to the configuration of the display elements. In an embodiment, the position of the first pixel P1 shown in FIG. 7 may represent the position of the display element configured to emit red light. Likewise, the position of the second pixel P2 may represent the position of the display element configured to emit blue light, and the position of the third pixel P3 may represent the position of the display element configured to emit green light.

In an embodiment, the display element may be an organic light-emitting diode including an emission layer. In an alternative embodiment, the display element may be a light-emitting diode LED. The size of the light-emitting diode LED may be microscales or nanoscales. In an embodiment, the light-emitting diode may be a micro light-emitting diode. In an alternative embodiment, the light-emitting diode may be a nanorod light-emitting diode. In an alternative embodiment, the display element may be a quantum-dot light-emitting diode including a quantum-dot emission layer. In an alternative embodiment, the display element may be an inorganic light-emitting diode including an inorganic semiconductor. Hereinafter, for convenience of description, the case where the display element is an organic light-emitting diode including the emission layer is mainly described.

Referring to FIG. 8, the display apparatus 1 may include the substrate 100, the pixel circuit layer 200, the display element layer 300, the encapsulation layer 400, the touch sensor layer 500, and the anti-reflection layer 600.

The pixel circuit layer 200 may be disposed on the substrate 100 and may include the pixel circuit PC, an insulating layer IL, and a planarization layer 240. The pixel circuit PC may be provided in plural. The pixel circuit PC may include a thin-film transistor TFT and a storage capacitor Cst. The insulating layer IL may include a gate insulating layer 210, a first inter-insulating layer 220, and a second inter-insulating layer 230.

The thin-film transistor TFT may include a semiconductor layer Act, a gate electrode GE, a source electrode SE, and a drain electrode DE, the gate electrode GE overlaps a channel region of the semiconductor layer Act, and the source electrode SE and the drain electrode DE are respectively connected to a source region and a drain region of the semiconductor layer Act. The gate insulating layer 210 may be disposed between the semiconductor layer Act and the gate electrode GE, and the first inter-insulating layer 220 and the second inter-insulating layer 230 may be disposed between the gate electrode GE and the source electrode SE, or between the gate electrode GE and the drain electrode DE.

The storage capacitor Cst may overlap the thin-film transistor TFT. The storage capacitor Cst may include a lower electrode CE1 and an upper electrode CE2 overlapping each other. In an embodiment, the gate electrode GE of the thin-film transistor TFT may include the lower electrode CE1 of the storage capacitor Cst. The first inter-insulating layer 220 may be disposed between the lower electrode CE1 and the upper electrode CE2.

The semiconductor layer Act may include polycrystalline silicon. In an embodiment, the semiconductor layer Act may include amorphous silicon. In an embodiment, the semiconductor layer Act may include an oxide semiconductor of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer Act may include a channel region, a source region, and a drain region, the source region and the drain region being doped with impurities.

The gate insulating layer 210 may include an inorganic insulating material such as silicon oxide ($SiO_x$), silicon nitride ($SiN_x$), or silicon oxynitride ($SiO_xN_y$), and may have a single-layered or multi-layered structure including the above materials.

The gate electrode GE or the lower electrode CE1 may include a conductive material of a low-resistance material such as molybdenum (Mo), aluminum (Al), copper (Cu) and/or titanium (Ti), and have a single-layered structure or a multi-layered structure including the above materials.

The first inter-insulating layer 220 may include an inorganic insulating material such as silicon oxide ($SiO_x$), silicon nitride ($SiN_x$), or silicon oxynitride ($SiO_xN_y$), and may have a single-layered or multi-layered structure including the above materials.

The upper electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu), and include a single layer or a multi-layer including the above materials.

The second inter-insulating layer 230 may include an inorganic insulating material such as silicon oxide ($SiO_x$), silicon nitride ($SiN_x$), or silicon oxynitride ($SiO_xN_y$), and may have a single-layered or multi-layered structure including the above materials.

The source electrode SE and/or the drain electrode DE may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu), and include a single layer or a multi-layer including the above materials. In an embodiment, the source electrode SE and/or the drain electrode DE may each have a three-layered structure of a titanium layer/aluminum layer/titanium layer.

The planarization layer 240 may be disposed on the thin-film transistor TFT. The planarization layer 240 may generally planarize the upper surface of the thin-film transistor TFT. The planarization layer 240 may include acryl, benzocyclobutene ("BCB"), or hexamethyldisiloxane ("HMDSO"), for example. Although it is shown in FIG. 8 that the planarization layer 240 is a single layer, the planarization layer 240 may be a multi-layer. However, various modifications may be made.

The display element layer 300 may be disposed on the pixel circuit layer 200. The display element layer 300 may include a display element DPE and the pixel-defining layer 340, and the display element DPE is electrically connected to the thin-film transistor TFT. The display element DPE may be provided in plural. The plurality of display elements DPE may include a first display element DPE1, a second display element DPE2, and a third display element DPE3. The first display element DPE1 may correspond to the first pixel P1, the second display element DPE2 may correspond to the second pixel P2, and the third display element DPE3 may correspond to the third pixel P3.

Each of the plurality of display elements DPE may include a pixel electrode, an emission layer, and an opposite electrode. Specifically, the first display element DPE1 may include a first pixel electrode 311, a first emission layer 321, and an opposite electrode 330. The second display element DPE2 may include a second pixel electrode 312, a second emission layer 322, and the opposite electrode 330. The third display element DPE3 may include a third pixel electrode 313, a third emission layer 323, and the opposite electrode 330. The opposite electrode 330 may be integrally provided over the entirety of the surface of the display apparatus 1, and accordingly, commonly provided over the plurality of display elements DPE.

The first pixel electrode 311, the second pixel electrode 312, and the third pixel electrode 313 may be apart from each other on the planarization layer 240. The first pixel electrode 311, the second pixel electrode 312, and the third pixel electrode 313 include a light-transmissive conductive layer and a reflective layer, the light-transmissive conductive layer includes a light-transmissive conductive oxide such as indium tin oxide ("ITO"), indium oxide ($In_2O_3$) or indium zinc oxide ("IZO"), and the reflective layer includes metal such as Al or Ag. In an embodiment, the first pixel electrode 311, the second pixel electrode 312, and the third pixel electrode 313 may have a three-layered structure of ITO/Ag/ITO.

Each of the first pixel electrode 311, the second pixel electrode 312, and the third pixel electrode 313 may be electrically connected to the thin-film transistor TFT by contacting one of the source electrode SE and the drain electrode DE through a contact hole defined in the planarization layer 240 as shown in FIG. 8. Accordingly, each of the plurality of display elements DPE may be electrically connected to one pixel circuit PC.

The pixel-defining layer 340 may be disposed on the planarization layer 240. The pixel-defining layer 340 defines a pixel by defining an opening corresponding to each pixel, that is, a lower opening LO exposing at least the central portion of the pixel electrode.

Specifically, the pixel-defining layer 340 may define the lower opening LO. The lower opening LO may be provided in plural. The plurality of lower openings LO may define a first lower opening LO1, a second lower opening LO2, and a third lower opening LO3. The first lower opening LO1 may be an opening corresponding to the first pixel P1, the second lower opening LO2 may be an opening corresponding to the second pixel P2, and the third lower opening LO3 may be an opening corresponding to the third pixel P3.

The first lower opening LO1 may expose the central portion of the first pixel electrode 311 of the first display element DPE1, the second lower opening LO2 may expose the central portion of the second pixel electrode 312 of the second display element DPE2, and the third lower opening LO3 may expose the central portion of the third pixel electrode 313 of the third display element DPE3. In other words, the first pixel P1 may be defined by the first lower opening LO1 of the pixel-defining layer 340, the second pixel P2 may be defined by the second lower opening LO2, and the third pixel P3 may be defined by the third lower opening LO3.

The lower opening LO is a region defined by removing a portion of the pixel-defining layer 340. As shown in FIG. 8, an inner wall of the lower opening LO may include an inclined structure. In the specification, the edge of one opening means a boundary through which a layer disposed under the layer including the one opening is exposed by the one opening. In an embodiment, the edge of each of the first lower opening LO1, the second lower opening LO2, and the third lower opening LO3 may mean a boundary through which each of the first pixel electrode 311, the second pixel electrode 312, and the third pixel electrode 313 is exposed by each of the first lower opening LO1, the second lower opening LO2, and the third lower opening LO3.

In addition, as shown in FIG. 8, the pixel-defining layer 340 may prevent arcs or the like from occurring at the edge of the first pixel electrode 311, the second pixel electrode 312, or the third pixel electrode 313 by increasing a distance between the edge of the first pixel electrode 311, the second pixel electrode 312, and the third pixel electrode 313 and the opposite electrode 330 over the first pixel electrode 311, the second pixel electrode 312, and the third pixel electrode 313. The pixel-defining layer 340 may include an organic material such as polyimide or HMDSO.

The first emission layer 321 may be disposed on the first pixel electrode 311, and the first emission layer 321 emits red light. The second emission layer 322 may be disposed on the second pixel electrode 312, the second emission layer 322 emits red light, and the third emission layer 323 may be disposed on the third pixel electrode 313, and the third emission layer 323 emits green light. The first emission layer 321, the second emission layer 322, and the third emission layer 323 may include an organic material, for example. Specifically, the first emission layer 321, the second emission layer 322, and the third emission layer 323 may include a polymer organic material or a relatively low molecular weight organic material configured to emit light of a preset color (red, blue, and green).

In an embodiment, the first emission layer 321 may include a polymer organic material or a relatively low molecular weight organic material configured to emit red light, the second emission layer 322 may include a polymer organic material or a relatively low molecular weight organic material configured to emit blue light, and the third emission layer 323 may include a polymer organic material or a relatively low molecular weight organic material configured to emit green light. In an embodiment, the first emission layer 321, the second emission layer 322, and the third emission layer 323 may include a polyphenylene vinylene ("PPV")-based polymer material or a polyfluorene-based polymer material. The first emission layer 321, the second emission layer 322, and the third emission layer 323 may be formed using screen printing, inkjet printing, laser induced thermal imaging, or the like. However, the disclosure is not limited thereto.

In an embodiment, a functional layer (not shown) may be disposed under and on the first emission layer 321, the second emission layer 322, and the third emission layer 323. The functional layer may include a hole injection layer ("HIL"), a hole transport layer ("HTL"), an electron transport layer ("ETL"), and/or an electron injection layer ("EIL"). The functional layer may be one body over the first emission layer 321, the second emission layer 322, and the third emission layer 323, or be patterned to correspond to each of the first emission layer 321, the second emission layer 322, and the third emission layer 323.

The opposite electrode 330 may be unitary over the first display element DPE1, the second display element DPE2, and the third display element DPE3 to correspond to the first pixel electrode 311, the second pixel electrode 312, and the third pixel electrode 313. In an embodiment, the opposite electrode 330 may overlap the first pixel electrode 311, the second pixel electrode 312, and the third pixel electrode 313. The opposite electrode 330 may include a light-transmissive conductive layer including ITO, $In_2O_3$, or IZO, and include a semi-transmissive layer including metal such as aluminum (Al) or silver (Ag). In an embodiment, the opposite electrode 330 may be a semi-transmissive layer including magnesium (Mg) and silver (Ag).

The encapsulation layer 400 may be disposed on the display element layer 300. Because the display element DPE may be easily damaged by external moisture, oxygen, or the like, the encapsulation layer 400 may protect the display element DPE by covering the display element DPE. As shown in FIG. 8, the encapsulation layer 400 may include a first inorganic encapsulation layer 410, an organic encapsulation layer 420, and a second inorganic encapsulation layer 430.

The first inorganic encapsulation layer 410 may cover the opposite electrode 330 and may include silicon oxide ($SiO_x$), silicon nitride ($SiN_x$), and/or silicon oxynitride ($SiO_xN_y$). When desired, other layers including a capping layer may be disposed between the first inorganic encapsulation layer 410 and the opposite electrode 330. Because the first inorganic encapsulation layer 410 is formed along a structure thereunder, the upper surface of the first inorganic encapsulation layer 410 is not flat as shown in FIG. 8. The organic encapsulation layer 420 may cover the first inorganic encapsulation layer 410 and, unlike the first inorganic encapsulation layer 410, the upper surface of the organic encapsulation layer 420 may be approximately flat. The organic encapsulation layer 420 may include at least one material among polyethylene terephthalate, polyethylene naphthalate, polycarbonate, polyimide, polyethylene sulfonate, polyoxymethylene, polyarylate, and hexamethyldisiloxane. The second inorganic encapsulation layer 430 may cover the organic encapsulation layer 420 and may include silicon oxide ($SiO_x$), silicon nitride ($SiN_x$), and/or silicon oxynitride ($SiO_xN_y$).

Because the encapsulation layer 400 includes the first inorganic encapsulation layer 410, the organic encapsulation layer 420, and the second inorganic encapsulation layer 430, even when cracks occur inside the encapsulation layer 400, the cracks may not be connected between the first inorganic encapsulation layer 410 and the organic encapsulation layer 420 or between the organic encapsulation layer 420 and the second inorganic encapsulation layer 430 through the above multi-layered structure. With this configuration, forming of a path through which external moisture or oxygen penetrates the inside of a display panel of the display apparatus 1 may be prevented or reduced.

The touch sensor layer 500 may be disposed on the encapsulation layer 400. The touch sensor layer 500 may include a first touch insulating layer 510, a first touch conductive pattern 520, a second touch insulating layer 530, a second touch conductive pattern 540, and a third touch insulating layer 550.

The first touch insulating layer 510 may be disposed on the second inorganic encapsulation layer 430. In an embodiment, the first touch insulating layer 510 may be a single layer or a multi-layer including an inorganic material such as silicon oxide ($SiO_x$), silicon nitride ($SiN_x$), and/or silicon oxynitride ($SiO_xN_y$). In an embodiment, the first touch insulating layer 510 may include an organic material. In an embodiment, the first touch insulating layer 510 may be omitted.

The first touch conductive pattern 520 may be disposed on the first touch insulating layer 510 and/or the second inorganic encapsulation layer 430. In an embodiment, the first touch conductive pattern 520 may overlap the pixel-defining layer 340. The first touch conductive pattern 520 may not overlap the lower opening LO of the pixel-defining layer 340. The first touch conductive pattern 520 may include a conductive material. In an embodiment, the first touch conductive pattern 520 may include at least one of molybdenum (Mo), aluminum (Al), copper (Cu), and titanium (Ti) and have a single layer or a multi-layer including the above materials. In an embodiment, the first touch conductive pattern 520 may have a structure of Ti/Al/Ti in which a titanium layer, an aluminum layer, and a titanium layer are sequentially stacked.

The second touch insulating layer 530 may cover the first touch conductive pattern 520. The second touch insulating layer 530 may be a single layer or a multi-layer including an inorganic material such as silicon oxide ($SiO_x$), silicon nitride ($SiN_x$), and/or silicon oxynitride ($SiO_xN_y$). In an embodiment, the second touch insulating layer 530 may include an organic material.

The second touch conductive pattern 540 may be disposed on the second touch insulating layer 530. In an embodiment, the second touch conductive pattern 540 may overlap the pixel-defining layer 340. The second touch conductive pattern 540 may not overlap the lower opening LO of the pixel-defining layer 340. In an embodiment, the second touch conductive pattern 540 may be connected to the first touch conductive pattern 520 through a contact hole of the second touch insulating layer 530. The second touch conductive pattern 540 may include a conductive material. In an embodiment, the second touch conductive pattern 540 may include at least one of molybdenum (Mo), aluminum (Al), copper (Cu), and titanium (Ti) and have a single layer or a multi-layer including the above materials. In an embodiment, the second touch conductive pattern 540 may have a structure of Ti/Al/Ti in which a titanium layer, an aluminum layer, and a titanium layer are sequentially stacked.

The first touch conductive pattern 520 and the second touch conductive pattern 540 may each include a plurality of sensing electrodes (not shown) for sensing a touch input. In an embodiment, the plurality of sensing electrodes may each sense an input by a mutual capacitance method. In another embodiment, the plurality of sensing electrodes may each sense an input by a self-capacitance method.

The third touch insulating layer 550 may cover the second touch conductive pattern 540. In an embodiment, the third touch insulating layer 550 may be a single layer or a multi-layer including an inorganic material such as silicon oxide ($SiO_x$), silicon nitride ($SiN_x$), and/or silicon oxynitride ($SiO_xN_y$). In an embodiment, the third touch insulating layer 550 may include an organic material.

The anti-reflection layer 600 may be disposed on the touch sensor layer 500. The anti-reflection layer 600 may include a light-blocking layer 610, a color filter layer 620, and a color filter planarization layer 630.

The light-blocking layer 610 may be disposed on the third touch insulating layer 550. The light-blocking layer 610 may at least partially absorb external light or internal reflected light. The light-blocking layer 610 may include black pigment. The light-blocking layer 610 may overlap the first touch conductive pattern 520 and/or the second touch conductive pattern 540. Accordingly, the light-blocking layer 610 may reduce light reflected by the first touch conductive pattern 520 and/or the second touch conductive pattern 540.

The light-blocking layer 610 may define an upper opening UO overlapping the lower opening LO of the pixel-defining layer 340. The upper opening UO may be provided in plural. The plurality of upper openings UP may include a first upper opening UO1, a second upper opening UO2, and a third upper opening UO3. The plurality of upper openings UO may respectively overlap the plurality of lower openings LO. Specifically, the first upper opening UO1 may overlap the first lower opening LO1, the second upper opening UO2 may overlap the second lower opening LO2, and the third upper opening UO3 may overlap the third lower opening LO3.

The upper opening UO is a region defined by removing a portion of the light-blocking layer 610. As shown in FIG. 8, an inner wall of the upper opening UO may include an inclined structure. In the specification, the edge of one opening means a boundary through which a layer disposed under the layer defining the one opening is exposed by the one opening. In an embodiment, the edge of each of the first upper opening UO1, the second upper opening UO2, and the third upper opening UO3 may mean a boundary through which the third touch insulating layer 550 is exposed by each of the first upper opening UO1, the second upper opening UO2, and the third upper opening UO3.

The area of the upper opening UO may be greater than the area of the lower opening LO. Specifically, the area of the first upper opening UO1 may be greater than the area of the first lower opening LO1, the area of the second upper opening UO2 may be greater than the area of the second lower opening LO2, and the area of the third upper opening UO3 may be greater than the area of the third lower opening LO3. In other words, in a plan view, the edge of the upper opening UO may surround the edge of the lower opening LO.

Accordingly, the width of the upper opening UO may be greater than the width of the lower opening LO. The width of the upper opening UO may be a shortest distance between a portion of the light-blocking layer 610 defining the upper opening UO and another portion of the light-blocking layer 610 facing each other. The width of the lower opening LO may be a shortest distance between a portion of the pixel-defining layer 340 defining the lower opening LO and another portion of the pixel-defining layer 340 facing each other. Accordingly, light emitted from the display element DPE may progress in a wide angle.

A relative position relationship between the lower opening LO and the upper opening UO corresponding to the lower opening LO may change depending on positions on which the lower opening LO and the upper opening UO are disposed. A relative position relationship between the lower opening LO and the upper opening UO corresponding to the lower opening LO is described below.

The color filter 620 may fill the upper opening UO of the light-blocking layer 610. The color filter 620 may be provided in plural. The plurality of color filters 620 may include a first color filter 621, a second color filter 622, and a third color filter 623. Specifically, the first color filter 621 may fill the first upper opening UO1, the second color filter 622 may fill the second upper opening UO2, and the third color filter 623 may fill the third upper opening UO3.

In other words, the color filter 620 may overlap the upper opening UO. Specifically, the first color filter 621 may overlap the first upper opening UO1, the second color filter 622 may overlap the second upper opening UO2, and the third color filter 623 may overlap the third upper opening UO3. Accordingly, the color filter 620 may overlap the display element DPE. That is, the first color filter 621 may overlap the first display element DPE1, the second color filter 622 may overlap the second display element DPE2, and the third color filter 623 may overlap the third display element DPE3. In an embodiment, the plurality of adjacent color filters 620 may overlap each other. In another embodiment, the plurality of adjacent color filters 620 may not overlap each other.

The color filter 620 may prevent or reduce external light reflection of the display apparatus 1. In an embodiment, a red color filter configured to pass only red light may be disposed on a red pixel, a blue color filter configured to pass only blue light may be disposed on a blue pixel, and a green color filter configured to pass only green light may be disposed on a green pixel. In this case, when external light, which is white light, is incident to, e.g., the red color filter, blue light and green light may be absorbed by the red color filter, and only red light may pass through the red color filter and then be reflected by the pixel electrode and emitted to the outside through the red color filter. Accordingly, in the case of the display apparatus having the color filter, reflection of external light is reduced by approximately ⅓ compared to the case without a color filter.

Accordingly, the color filters 620 may have a color corresponding to light that may be emitted by an emission layer of the display element DPE disposed under the color filters 620. In an embodiment, in the case where a first emission layer 321 of the first display element DPE1 disposed under the first color filter 621 emit red light, the first color filter 621 may be a red color filter, in the case where a second emission layer 322 of the second display element DPE2 disposed under the second color filter 622 emit blue light, the second color filter 622 may be a blue color filter, and in the case where a third emission layer 323 of the third display element DPE3 disposed under the third color filter 623 emit green light, the third color filter 623 may be a green color filter.

The color filter 620 may include red, blue, or green pigment or dye. In an alternative embodiment, the color filter 620 may further include quantum dots in addition to the pigment or dye. In an alternative embodiment, the color filter 620 may not include pigment or dye, and may include scattering particles such as titanium oxide.

The color filter planarization layer 630 may be disposed on the color filter 620. The color filter planarization layer 630 is a colorless light-transmissive layer and may planarize the upper portion of the color filter 620. The color filter planarization layer 630 may include a colorless light-transmissive organic material such as an acryl-based resin. In an embodiment, the color filter planarization layer 630 may include an organic material including acryl, BCB, or HMDSO, for example.

Figure 9:
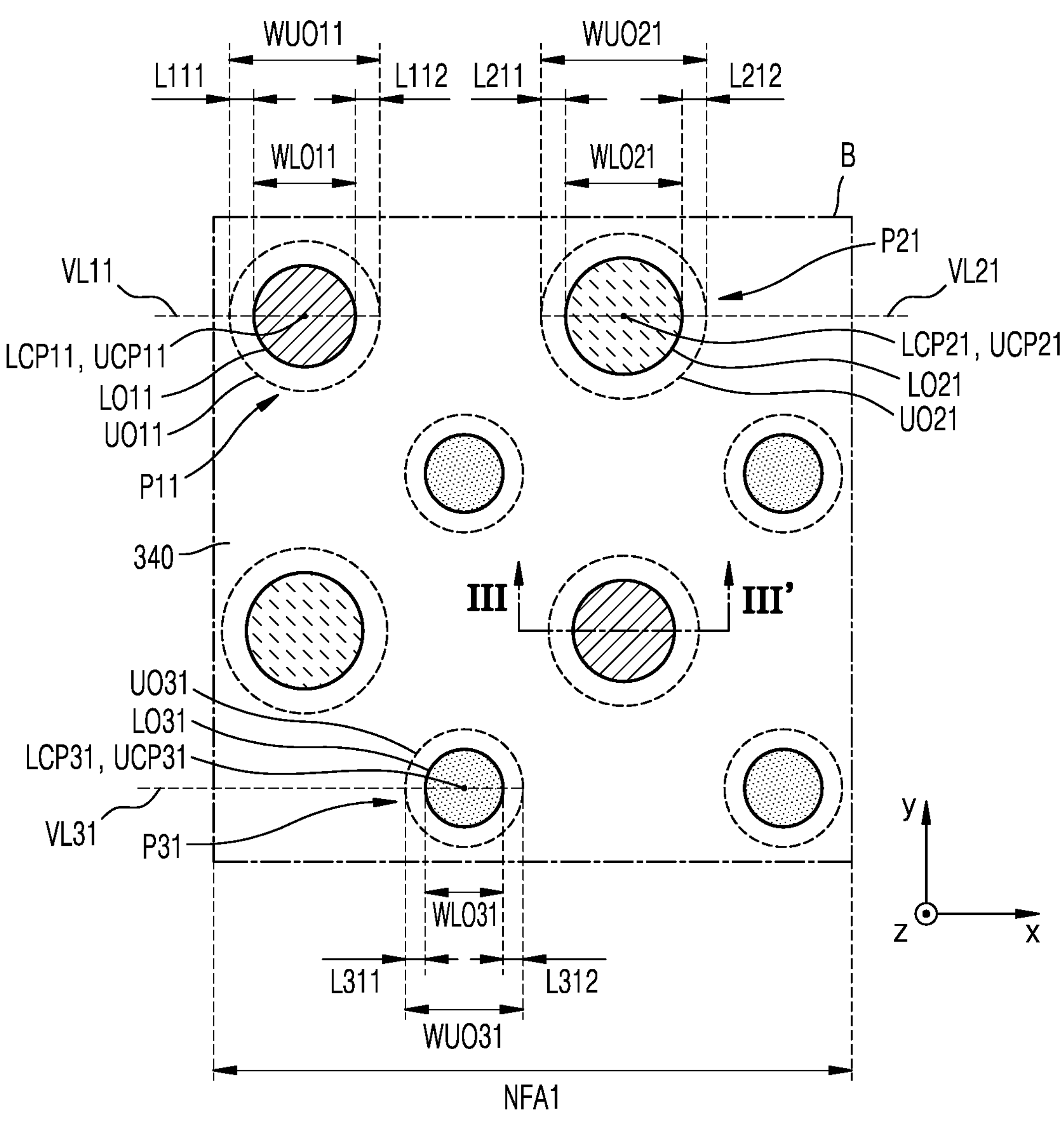
FIGS. 9 to 12 are views for explaining a relative position relationship between an upper opening and a lower opening.

FIGS. 9 to 12 are views for explaining a relative position relationship between the upper opening UO and the lower opening LO. Specifically, FIG. 9 is an enlarged schematic plan view of a region B of FIG. 7. Although FIG. 9 shows a plan view of the pixel-defining layer 340, FIG. 9 shows the upper opening UO together, for convenience of description.

As described above with reference to FIG. 7, the plurality of pixels P is arranged in the first non-folded area NFA1. The plurality of pixels P may include the first pixel P1, the second pixel P2, and the third pixel P3 configure to emit light of different colors. Hereinafter, for convenience of description, the first pixel P1 disposed in the first non-folded area NFA1 is also referred to as a (1-1)st pixel P11, the second pixel P2 disposed in the first non-folded area NFA1 is also referred to as a (2-1)st pixel P21, and the third pixel P3 disposed in the first non-folded area NFA1 is also referred to as a (3-1)st pixel P31.

As described above with reference to FIG. 8, the first lower opening LO1 may be an opening corresponding to the first pixel P1, the second lower opening LO2 may be an opening corresponding to the second pixel P2, and the third lower opening LO3 may be an opening corresponding to the third pixel P3. The first upper opening UO1 may overlap the first lower opening LO1, the second upper opening UO2 may overlap the second lower opening LO2, and the third upper opening UO3 may overlap the third lower opening LO3.

Hereinafter, for convenience of description, the first lower opening LO1 corresponding to the (1-1)st pixel P11 is also referred to as a (1-1)st lower opening LO11, and the first upper opening UO1 overlapping the (1-1)st lower opening LO11 is also referred to as a (1-1)st upper opening UO11. Similarly, the second lower opening LO2 corresponding to the (2-1)st pixel P21 is also referred to as a (2-1)st lower opening LO21, and the second upper opening UO2 overlapping the (2-1)st lower opening LO21 is also referred to as a (2-1)st upper opening UO21. The third opening LO3 corresponding to the (3-1)st pixel P31 is also referred to as a (3-1)st lower opening LO31, and the third upper opening UO3 overlapping the (3-1)st lower opening LO31 is also referred to as a (3-1)st upper opening UO31. In other words, the (1-1)st lower opening LO11, the (2-1)st lower opening LO21, and the (3-1)st lower opening LO31 may be arranged in the first non-folded area NFA1. That is, the (1-1)st lower opening LO11, the (2-1)st lower opening LO21, and the (3-1)st lower opening LO31 may overlap the first non-folded area NFA1.

Although it is shown in FIG. 9 that the lower opening LO and the upper opening UO have a circular shape, the disclosure is not limited thereto. The lower opening LO and the upper opening UO may have a polygonal shape. Hereinafter, for convenience of description, the case where the lower opening LO and the upper opening UO have a circular shape is manly described in detail.

As described above, the area of the upper opening UO may be greater than the area of the lower opening LO, and the width of the upper opening UO may be greater than the width of the lower opening LO. Specifically, as shown in FIG. 9, a width WUO11 of the (1-1)st upper opening UO11 may be greater than a width WLO11 of the (1-1)st lower opening LO11, and a width WUO21 of the (2-1)st upper opening UO21 may be greater than a width WLO21 of the (2-1)st lower opening LO21, and a width WUO31 of the (3-1)st upper opening UO31 may be greater than a width WLO31 of the (3-1)st lower opening LO31. In the case where one opening has a circular shape, the diameter of the circle may be the same as the size of the width of the one opening.

In a plan view, a central point UCP11 of the (1-1)st upper opening UO11 may be disposed at the same position as a position of a central point LCP11 of the (1-1)st lower opening LO11. In the specification, the central point of one opening may be defined as an intersection of a line defining a largest width in the first direction (e.g., the x direction or the −x direction) and a line defining a largest width in the second direction (e.g., the y direction or the −y direction). In the case where one opening has a circular shape, the center of the circle may be the center of the one opening.

Similarly, a central point UCP21 of the (2-1)st upper opening UO21 may be disposed at the same position as a position of a central point LCP21 of the (2-1)st lower opening LO21. In a plan view, a central point UCP31 of the (3-1)st upper opening UO31 may be disposed at the same position as a position of a central point LCP31 of the (3-1)st lower opening LO31. In other words, the central point UCP11 of the (1-1)st upper opening UO11 may overlap the central point LCP11 of the (1-1)st lower opening LO11, the central point UCP21 of the (2-1)st upper opening UO21 may overlap the central point LCP21 of the (2-1)st lower opening LO21, and the central point UCP31 of the (3-1)st upper opening UO31 may overlap the central point LCP31 of the (3-1)st lower opening LO31.

That is, the (1-1)st upper opening UO11 overlaps the (1-1)st lower opening LO11 and is disposed not to be shifted to one side of the (1-1)st lower opening LO11 in the first direction (e.g., the x direction or the −x direction). The (2-1)st upper opening UO21 overlaps the (2-1)st lower opening LO21 and is disposed not to be shifted to one side of the (2-1)st lower opening LO21 in the first direction (e.g., the x direction or the −x direction). The (3-1)st upper opening UO31 overlaps the (3-1)st lower opening LO31 and is disposed not to be shifted to one side of the (3-1)st lower opening LO31 in the first direction (e.g., the x direction or the −x direction).

Accordingly, as shown in FIG. 9, in a plan view, a distance between an edge point of the (1-1)st lower opening LO11 and an edge point of the (1-1)st upper opening UO11 meeting a virtual reference line VL11 may be defined such that a left side thereof and a right side thereof are the same with respect to the central point LCP11 of the (1-1)st lower opening LO11. The virtual reference line VL11 may be a virtual straight line passing through the central point LCP11 of the (1-1)st lower opening LO11 and the central point UCP11 of the (1-1)st upper opening UO11 in a plan view, and extending in the first direction (e.g., the x direction or the −x direction). Specifically, in a plan view, a distance L111 between a left edge point of the (1-1)st lower opening LO11 and a left edge point of the (1-1)st upper opening UO11 meeting the virtual reference line VL11 may be equal to a distance L112 between a right edge point of the (1-1)st lower opening LO11 and a right edge point of the (1-1)st upper opening UO11 meeting the virtual reference line VL11.

Similarly, in a plan view, a distance between an edge point of the (2-1)st lower opening LO21 and an edge point of the (2-1)st upper opening UO21 meeting a virtual reference line VL21 may be defined such that a left side thereof and a right side thereof are the same with respect to the central point LCP21 of the (2-1)st lower opening LO21. The virtual reference line VL21 may be a virtual straight line passing through the central point LCP21 of the (2-1)st lower opening LO21 and the central point UCP21 of the (2-1)st upper opening UO21 in a plan view, and extending in the first direction (e.g., the x direction or the −x direction). Specifically, in a plan view, a distance L211 between a left edge point of the (2-1)st lower opening LO21 and a left edge point of the (2-1)st upper opening UO21 meeting the virtual reference line VL21 may be equal to a distance L212 between a right edge point of the (2-1)st lower opening LO21 and a right edge point of the (2-1)st upper opening UO21 meeting the virtual reference line VL21.

Similarly, in a plan view, a distance between an edge point of the (3-1)st lower opening LO31 and an edge point of the (3-1)st upper opening UO31 meeting a virtual reference line VL31 may be defined such that a left side thereof and a right side thereof are the same with respect to the central point LCP31 of the (3-1)st lower opening LO31. The virtual reference line VL31 may be a virtual straight line passing through the central point LCP31 of the (3-1)st lower opening LO31 and the central point UCP31 of the (3-1)st upper opening UO31 in a plan view, and extending in the first direction (e.g., the x direction or the −x direction). Specifically, in a plan view, a distance L311 between a left edge point of the (3-1)st lower opening LO31 and a left edge point of the (3-1)st upper opening UO31 meeting the virtual reference line VL31 may be equal to a distance L312 between a right edge point of the (3-1)st lower opening LO31 and a right edge point of the (3-1)st upper opening UO31 meeting the virtual reference line VL31.

Figure 10:
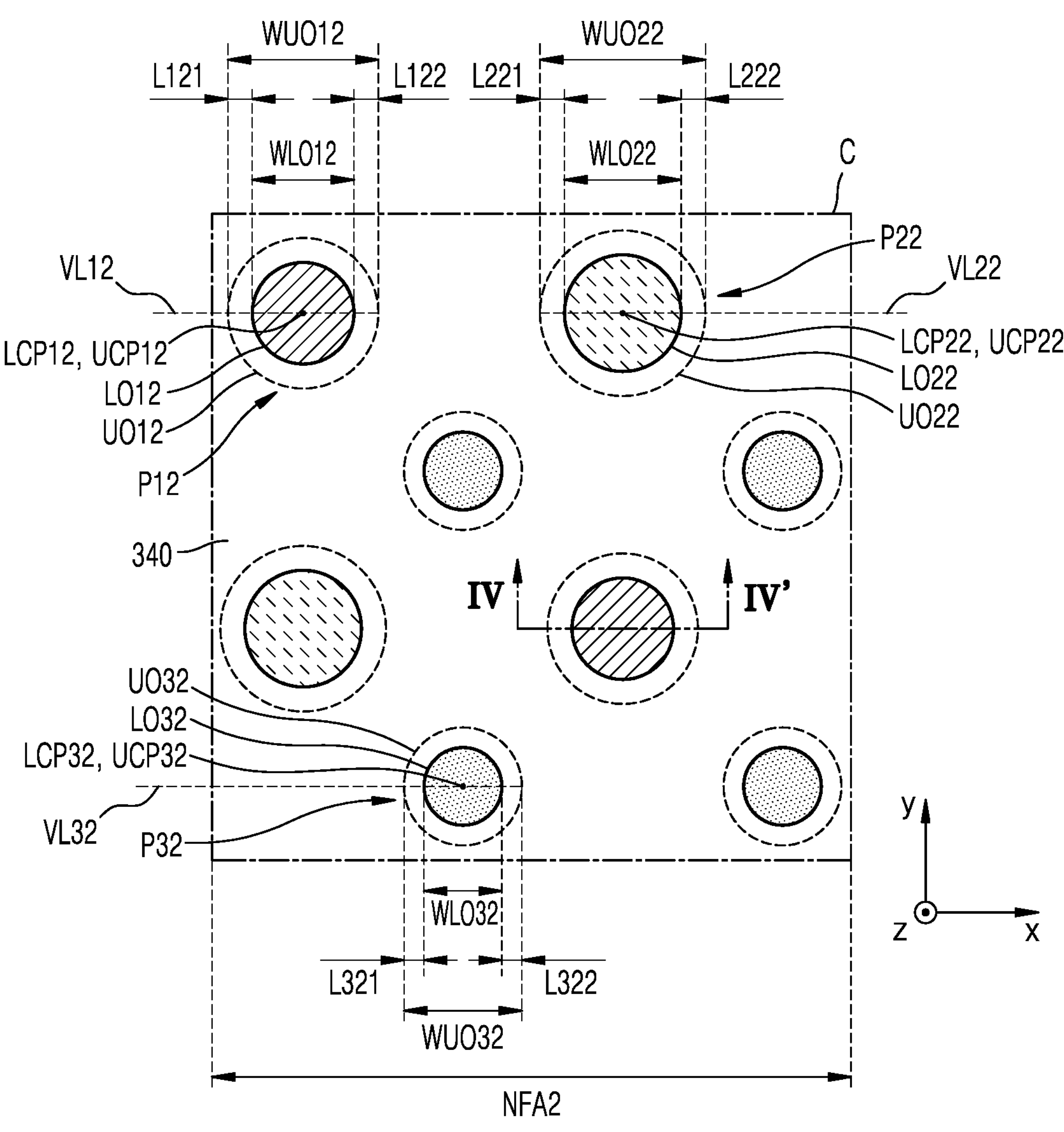

FIG. 10 is a schematic enlarged plan view of a region C of FIG. 7. Although FIG. 10 shows a plan view of the pixel-defining layer 340, FIG. 9 shows the upper opening UO together, for convenience of description.

As described above with reference to FIG. 7, the plurality of pixels P is arranged in the second non-folded area NFA2. The plurality of pixels P may include the first pixel P1, the second pixel P2, and the third pixel P3 configure to emit light of different colors. Hereinafter, for convenience of description, the first pixel P1 disposed in the second non-folded area NFA2 is also referred to as a (1-2)nd pixel P12, the second pixel P2 disposed in the second non-folded area NFA2 is also referred to as a (2-2)nd pixel P22, and the third pixel P3 disposed in the second non-folded area NFA2 is also referred to as a (3-2)nd pixel P32. Hereinafter, for convenience of description, the first lower opening LO1 corresponding to the (1-2)nd pixel P12 is also referred to as a (1-2)nd lower opening LO12, and the first upper opening UO1 overlapping the (1-2)nd lower opening LO12 is also referred to as a (1-2)nd upper opening UO12.

Similarly, the second lower opening LO2 corresponding to the (2-2)nd pixel P22 is also referred to as a (2-2)nd lower opening LO22, and the second upper opening UO2 overlapping the (2-2)nd lower opening LO22 is also referred to as a (2-2)nd upper opening UO22. The third opening LO3 corresponding to the (3-2)nd pixel P32 is also referred to as a (3-2)nd lower opening LO32, and the third upper opening UO3 overlapping the (3-2)nd lower opening LO32 is also referred to as a (3-2)nd upper opening UO32. In other words, the (1-2)nd lower opening LO12, the (2-2)nd lower opening LO22, and the (3-2)nd lower opening LO32 may be arranged in the second non-folded area NFA2. That is, the (1-2)nd lower opening LO12, the (2-2)nd lower opening LO22, and the (3-2)nd lower opening LO32 may overlap the second non-folded area NFA2.

A relative position relationship between the (1-2)nd lower opening LO12 and the (1-2)nd upper opening UO12 may be the same as a relative position relationship between the (1-1)st lower opening LO11 and the (1-1)st upper opening UO11 described above with reference to FIG. 9. Similarly, a relative position relationship between the (2-2)nd lower opening LO22 and the (2-2)nd upper opening UO22 may be the same as a relative position relationship between the (2-1)st lower opening LO21 and the (2-1)st upper opening UO21, and a relative position relationship between the (3-2)nd lower opening LO32 and the (3-2)nd upper opening UO32 may be the same as a relative position relationship between the (3-1)st lower opening LO31 and the (3-1)st upper opening UO31.

As shown in FIG. 10, in a plan view, a central point UCP12 of the (1-2)nd upper opening UO12 may be disposed at the same position as a position of a central point LCP12 of the (1-2)nd lower opening LO12. Similarly, a central point UCP22 of the (2-2)nd upper opening UO22 may be disposed at the same position as a position of a central point LCP22 of the (2-2)nd lower opening LO22. In a plan view, a central point UCP32 of the (3-2)nd upper opening UO32 may be disposed at the same position as a position of a central point LCP32 of the (3-2)nd lower opening LO32. In other words, the central point UCP12 of the (1-2)nd upper opening UO12 may overlap the central point LCP12 of the (1-2)nd lower opening LO12, the central point UCP22 of the (2-2)nd upper opening UO22 may overlap the central point LCP22 of the (2-2)nd lower opening LO22, and the central point UCP32 of the (3-2)nd upper opening UO32 may overlap the central point LCP32 of the (3-2)nd lower opening LO32.

A width WUO12 of the (1-2)nd upper opening UO12 may be the same as a width WUO11 of the (1-1)st upper opening UO11, and a width WLO12 of the (1-2)nd lower opening LO12 may be the same as a width WLO11 of the (1-1)st lower opening LO11. A width WUO22 of the (2-2)nd upper opening UO22 may be the same as a width WUO21 of the (2-1)st upper opening UO21, and a width WLO22 of the (2-2)nd lower opening LO22 may be the same as a width WLO21 of the (2-1)st lower opening LO21. A width WUO32 of the (3-2)nd upper opening UO32 may be the same as a width WUO31 of the (3-1)st upper opening UO31, and a width WLO32 of the (3-2)nd lower opening LO32 may be the same as a width WLO31 of the (3-1)st lower opening LO31.

That is, the (1-2)nd upper opening UO12 overlaps the (1-2)nd lower opening LO12 and is disposed not to be shifted to one side of the (1-2)nd lower opening LO12 in the first direction (e.g., the x direction or the −x direction). The (2-2)nd upper opening UO22 overlaps the (2-2)nd lower opening LO22 and is disposed not to be shifted to one side of the (2-2)nd lower opening LO22 in the first direction (e.g., the x direction or the −x direction). The (3-2)nd upper opening UO32 overlaps the (3-2)nd lower opening LO32 and is disposed not to be shifted to one side of the (3-2)nd lower opening LO32 in the first direction (e.g., the x direction or the −x direction).

Accordingly, as shown in FIG. 10, in a plan view, a distance between an edge point of the (1-2)nd lower opening LO12 and an edge point of the (1-2)nd upper opening UO12 meeting the virtual reference line VL12 may be defined such that a left side thereof and a right side thereof are the same with respect to the central point LCP12 of the (1-2)nd lower opening LO12. The virtual reference line VL12 may be a virtual straight line passing through the central point LCP12 of the (1-2)nd lower opening LO12 and the central point UCP12 of the (1-2)nd upper opening UO12 in a plan view, and extending in the first direction (e.g., the x direction or the −x direction). Specifically, in a plan view, a distance L121 between a left edge point of the (1-2)nd lower opening LO12 and a left edge point of the (1-2)nd upper opening UO12 meeting the virtual reference line VL12 may be equal to a distance L122 between a right edge point of the (1-2)nd lower opening LO12 and a right edge point of the (1-2)nd upper opening UO12 meeting the virtual reference line VL12.

Similarly, in a plan view, a distance between an edge point of the (2-2)nd lower opening LO22 and an edge point of the (2-2)nd upper opening UO22 meeting a virtual reference line VL22 may be defined such that a left side thereof and a right side thereof are the same with respect to the central point LCP22 of the (2-2)nd lower opening LO22. The virtual reference line VL22 may be a virtual straight line passing through the central point LCP22 of the (2-2)nd lower opening LO22 and the central point UCP22 of the (2-2)nd upper opening UO22 in a plan view, and extending in the first direction (e.g., the x direction or the −x direction). Specifically, in a plan view, a distance L221 between a left edge point of the (2-2)nd lower opening LO22 and a left edge point of the (2-2)nd upper opening UO22 meeting the virtual reference line VL22 may be equal to a distance L222 between a right edge point of the (2-2)nd lower opening LO22 and a right edge point of the (2-2)nd upper opening UO22 meeting the virtual reference line VL22.

Similarly, in a plan view, a distance between an edge point of the (3-2)nd lower opening LO32 and an edge point of the (3-2)nd upper opening UO32 meeting a virtual reference line VL32 may be defined such that a left side thereof and a right side thereof are the same with respect to the central point LCP32 of the (3-2)nd lower opening LO32. The virtual reference line VL32 may be a virtual straight line passing through the central point LCP32 of the (3-2)nd lower opening LO32 and the central point UCP32 of the (3-2)nd upper opening UO32 in a plan view, and extending in the first direction (e.g., the x direction or the −x direction). Specifically, in a plan view, a distance L321 between a left edge point of the (3-2)nd lower opening LO32 and a left edge point of the (3-2)nd upper opening UO32 meeting the virtual reference line VL32 may be equal to a distance L322 between a right edge point of the (3-2)nd lower opening LO32 and a right edge point of the (3-2)nd upper opening UO32 meeting the virtual reference line VL32.

Figure 11:
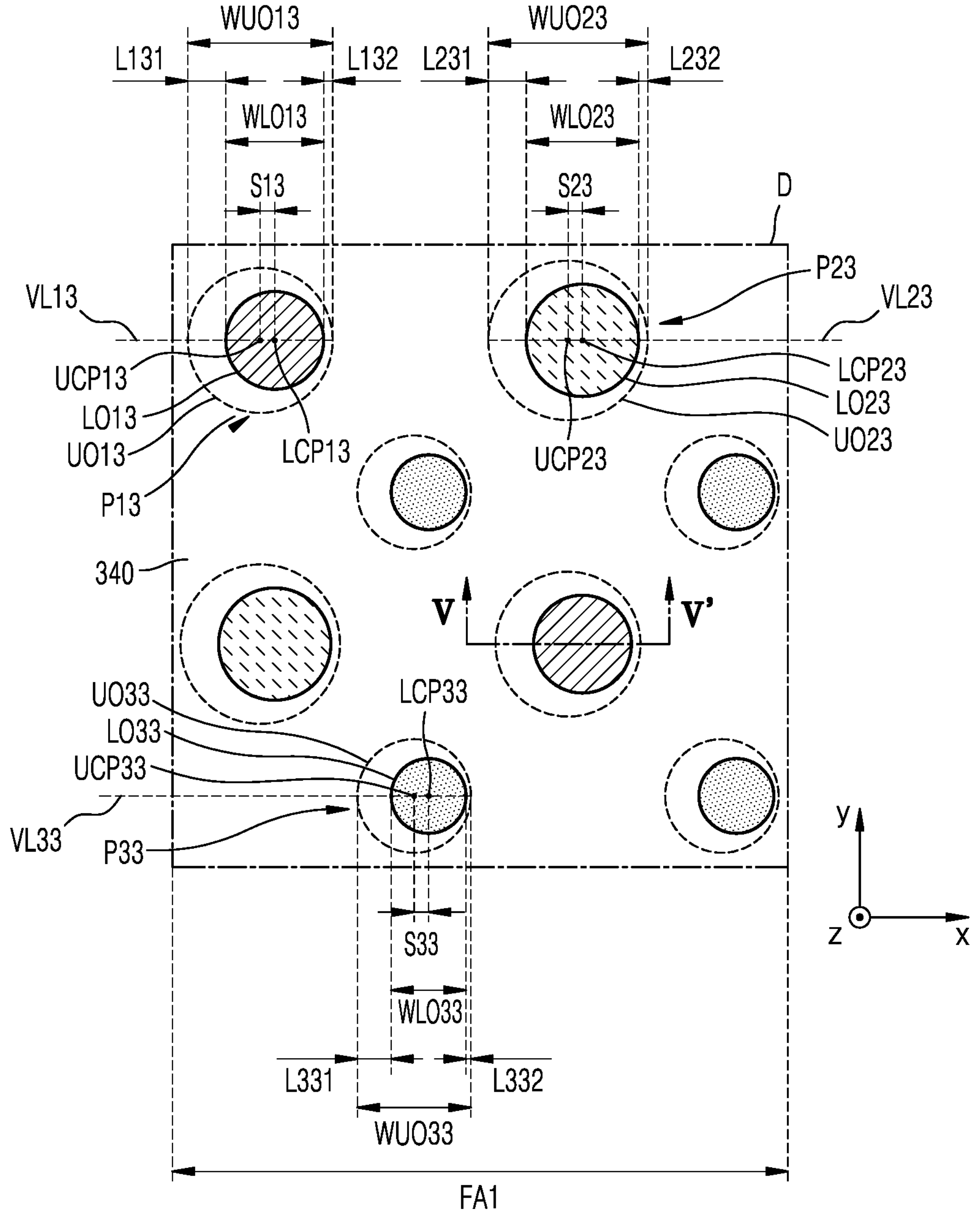

FIG. 11 is a schematic enlarged plan view of a region D of FIG. 7. Although FIG. 11 shows a plan view of the pixel-defining layer 340, FIG. 9 shows the upper opening UO together, for convenience of description.

As described above with reference to FIG. 7, the plurality of pixels P is arranged in the first foldable area FA1. The plurality of pixels P may include the first pixel P1, the second pixel P2, and the third pixel P3 configure to emit light of different colors. Hereinafter, for convenience of description, the first pixel P1 disposed in the first foldable area FA1 is also referred to as a (1-3)rd pixel P13, the second pixel P2 disposed in the first foldable area FA1 is also referred to as a (2-3)rd pixel P23, and the third pixel P3 arranged in the first foldable area FA1 is also referred to as a (3-3)rd pixel P33. Hereinafter, for convenience of description, the first lower opening LO1 corresponding to the (1-3)rd pixel P13 is also referred to as a (1-3)rd lower opening LO13, and the first upper opening UO1 overlapping the (1-3)rd lower opening LO13 is also referred to as a (1-3)rd upper opening UO13.

Similarly, the second lower opening LO2 corresponding to the (2-3)rd pixel P23 is also referred to as a (2-3)rd lower opening LO23, and the second upper opening UO2 overlapping the (2-3)rd lower opening LO23 is also referred to as a (2-3)rd upper opening UO23. The third lower opening LO3 corresponding to the (3-3)rd pixel P33 is also referred to as a (3-3)rd lower opening LO33, and the third upper opening UO3 overlapping the (3-3)rd lower opening LO33 is also referred to as a (3-3)rd upper opening UO33. In other words, the (1-3)rd lower opening LO13, the (2-3)rd lower opening LO23, and the (3-3)rd lower opening LO33 may be arranged in the first foldable area FA1. That is, the (1-3)rd lower opening LO13, the (2-3)rd lower opening LO23, and the (3-3)rd lower opening LO33 may overlap the first foldable area FA1.

A relative position relationship between the (1-3)rd lower opening LO13 and the (1-3)rd upper opening UO13 may be different from a relative position relationship between the (1-1)st lower opening LO11 and the (1-1)st upper opening UO11 described above with reference to FIG. 9. Similarly, a relative position relationship between the (2-3)rd lower opening LO23 and the (2-3)nd upper opening UO23 may be different from a relative position relationship between the (2-1)st lower opening LO21 and the (2-1)st upper opening UO21, and a relative position relationship between the (3-3)rd lower opening LO33 and the (3-3)rd upper opening UO33 may be different from a relative position relationship between the (3-1)st lower opening LO31 and the (3-1)st upper opening UO31.

A width WUO13 of the (1-3)rd upper opening UO13 may be the same as a width WUO11 of the (1-1)st upper opening UO11, and a width WLO13 of the (1-3)rd lower opening LO13 may be the same as a width WLO11 of the (1-1)st lower opening LO11. A width WUO23 of the (2-3)rd upper opening UO23 may be the same as a width WUO21 of the (2-1)st upper opening UO21, and a width WLO23 of the (2-3)rd lower opening LO23 may be the same as a width WLO21 of the (2-1)st lower opening LO21. A width WUO33 of the (3-3)rd upper opening UO33 may be the same as a width WUO31 of the (3-1)st upper opening UO31, and a width WLO33 of the (3-3)rd lower opening LO33 may be the same as a width WLO31 of the (3-1)st lower opening LO31.

As shown in FIG. 11, in a plan view, a central point UCP13 of the (1-3)rd upper opening UO13 and a central point LCP13 of the (1-3)rd lower opening LO13 may be apart from each other in the first direction (e.g., the x direction or the −x direction). Specifically, in a plan view, the central point UCP13 of the (1-3)rd upper opening UO13 may be disposed apart in a direction (also referred to as a first non-folded area direction) to the first non-folded area NFA1 by a (1-3)rd separation distance S13 from the central point LCP13 of the (1-3)rd lower opening LO13.

Similarly, in a plan view, a central point UCP23 of the (2-3)rd upper opening UO23 and a central point LCP23 of the (2-3)rd lower opening LO23 may be apart from each other in the first direction (e.g., the x direction or the −x direction). Specifically, in a plan view, the central point UCP23 of the (2-3)rd upper opening UO23 may be disposed apart in a direction to the first non-folded area NFA1 by a (2-3)rd separation distance S23 from the central point LCP23 of the (2-3)rd lower opening LO23. In a plan view, a central point UCP33 of the (3-3)rd upper opening UO33 and a central point LCP33 of the (3-3)rd lower opening LO33 may be apart from each other in the first direction (e.g., the x direction or the −x direction). Specifically, in a plan view, the central point UCP33 of the (3-3)rd upper opening UO33 may be disposed apart in a direction to the first non-folded area NFA1 by a (3-3)rd separation distance S33 from the central point LCP33 of the (3-3)rd lower opening LO33.

That is, the (1-3)rd upper opening UO13 may be shifted to one side facing the first non-folded area NFA1 of the (1-3)rd lower opening LO13 in the first direction (e.g., the x direction or the −x direction). Similarly, the (2-3)rd upper opening UO23 may be shifted to one side facing the first non-folded area NFA1 of the (2-3)rd lower opening LO23 in the first direction (e.g., the x direction or the −x direction). The (3-3)rd upper opening UO33 may be shifted to one side facing the first non-folded area NFA1 of the (3-3)rd lower opening LO33 in the first direction (e.g., the x direction or the −x direction). In other words, in a plan view, the central point UCP13 of the (1-3)rd upper opening UO13 may be disposed closer to the first non-folded area NFA1 than the central point LCP13 of the (1-3)rd lower opening LO13 is to the first non-folded area NFA1. Similarly, in a plan view, the central point UCP23 of the (2-3)rd upper opening UO23 may be disposed closer to the first non-folded area NFA1 than the central point LCP23 of the (2-3)rd lower opening LO23 is to the first non-folded area NFA1. In a plan view, the central point UCP33 of the (3-3)rd upper opening UO33 may be disposed closer to the first non-folded area NFA1 than the central point LCP33 of the (3-3)rd lower opening LO33 is to the first non-folded area NFA1.

Accordingly, as shown in FIG. 11, in a plan view, a distance between an edge point of the (1-3)rd lower opening LO13 and an edge point of the (1-3)rd upper opening UO13 meeting the virtual reference line VL13 may be defined such that a left side thereof and a right side thereof are different from each other with respect to the central point LCP13 of the (1-3)rd lower opening LO13. The virtual reference line VL13 may be a virtual straight line passing through the central point LCP13 of the (1-3)rd lower opening LO13 and the central point UCP13 of the (1-3)rd upper opening UO13 in a plan view, and extending in the first direction (e.g., the x direction or the −x direction). Specifically, in a plan view, a distance L131 between a left edge point of the (1-3)rd lower opening LO13 and a left edge point of the (1-3)rd upper opening UO13 meeting the virtual reference line VL13 may be greater than a distance L132 between a right edge point of the (1-3)rd lower opening LO13 and a right edge point of the (1-3)rd upper opening UO13 meeting the virtual reference line VL13.

Similarly, in a plan view, a distance between an edge point of the (2-3)rd lower opening LO23 and an edge point of the (2-3)rd upper opening UO23 meeting a virtual reference line VL23 may be defined such that a left side thereof and a right side thereof are different from each other with respect to the central point LCP23 of the (2-3)rd lower opening LO23. The virtual reference line VL23 may be a virtual straight line passing through the central point LCP23 of the (2-3)rd lower opening LO23 and the central point UCP23 of the (2-3)rd upper opening UO23 in a plan view, and extending in the first direction (e.g., the x direction or the −x direction). Specifically, in a plan view, a distance L231 between a left edge point of the (2-3)rd lower opening LO23 and a left edge point of the (2-3)rd upper opening UO23 meeting the virtual reference line VL23 may be greater than a distance L232 between a right edge point of the (2-3)rd lower opening LO23 and a right edge point of the (2-3)rd upper opening UO23 meeting the virtual reference line VL23.

Similarly, in a plan view, a distance between an edge point of the (3-3)rd lower opening LO33 and an edge point of the (3-3)rd upper opening UO33 meeting a virtual reference line VL33 may be defined such that a left side thereof and a right side thereof are different from each other with respect to the central point LCP33 of the (3-3)rd lower opening LO33. The virtual reference line VL33 may be a virtual straight line passing through the central point LCP33 of the (3-3)rd lower opening LO33 and the central point UCP33 of the (3-3)rd upper opening UO33 in a plan view, and extending in the first direction (e.g., the x direction or the −x direction). Specifically, in a plan view, a distance L331 between a left edge point of the (3-3)rd lower opening LO33 and a left edge point of the (3-3)rd upper opening UO33 meeting the virtual reference line VL33 may be greater than a distance L332 between a right edge point of the (3-3)rd lower opening LO33 and a right edge point of the (3-3)rd upper opening UO33 meeting the virtual reference line VL33.

Figure 12:
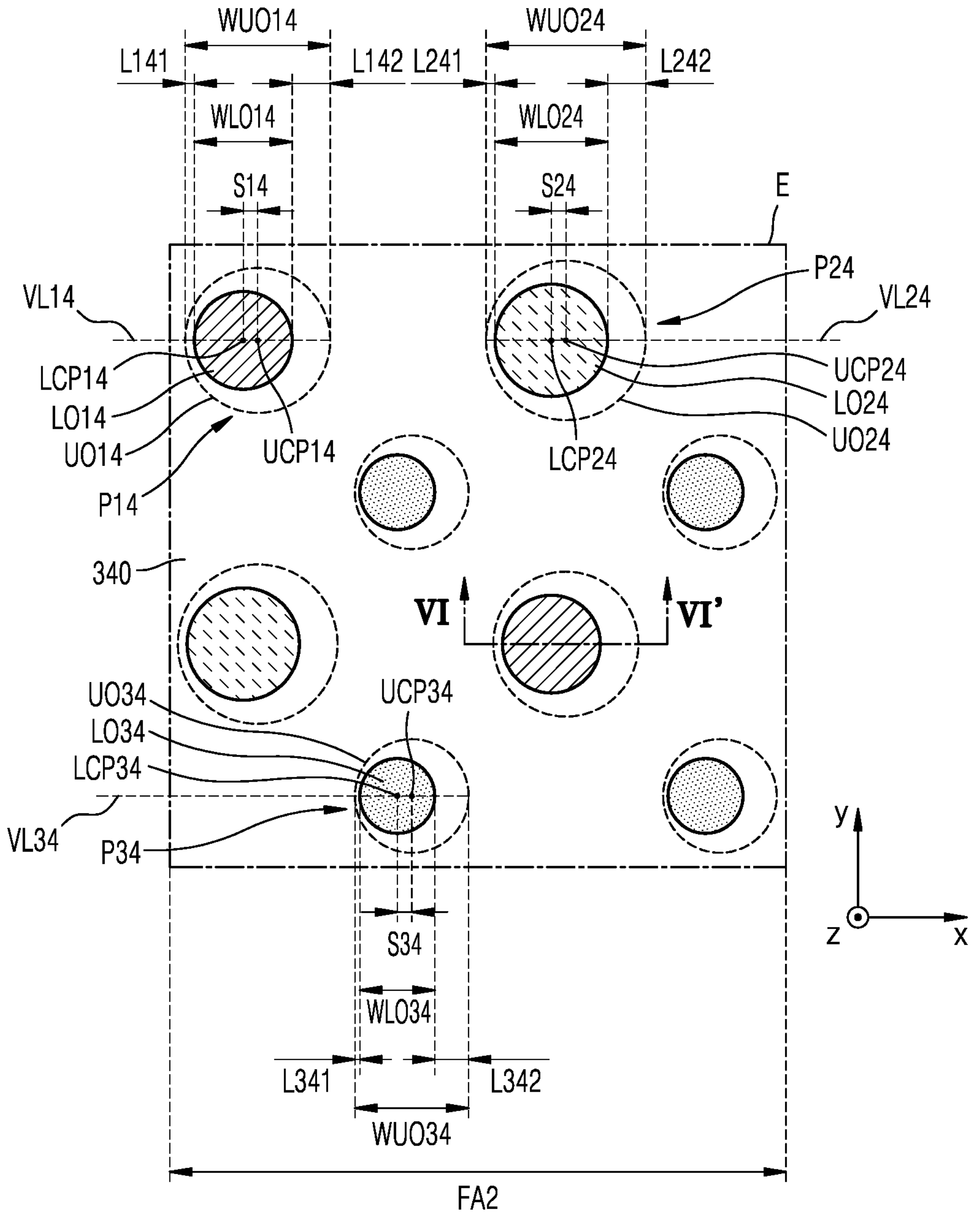

FIG. 12 is a schematic enlarged plan view of a region E of FIG. 7. Although FIG. 12 shows a plan view of the pixel-defining layer 340, FIG. 9 shows the upper opening UO together, for convenience of description.

As described above with reference to FIG. 7, the plurality of pixels P is arranged in the second foldable area FA2. The plurality of pixels P may include the first pixel P1, the second pixel P2, and the third pixel P3 configure to emit light of different colors. Hereinafter, for convenience of description, the first pixel P1 disposed in the second foldable area FA2 is also referred to as a (1-4)th pixel P14, the second pixel P2 disposed in the second foldable area FA2 is also referred to as a (2-4)th pixel P24, and the third pixel P3 disposed in the second foldable area FA2 is also referred to as a (3-4)th pixel P34. Hereinafter, for convenience of description, the first lower opening LO1 corresponding to the (1-4)th pixel P14 is also referred to as a (1-4)th lower opening LO14, and the first upper opening UO1 overlapping the (1-4)th lower opening LO14 is also referred to as a (1-4)th upper opening UO14.

Similarly, the second lower opening LO2 corresponding to the (2-4)th pixel P24 is also referred to as a (2-4)th lower opening LO24, and the second upper opening UO2 overlapping the (2-4)th lower opening LO24 is also referred to as a (2-4)th upper opening UO24. The third opening LO3 corresponding to the (3-4)th pixel P34 is also referred to as a (3-4)th lower opening LO34, and the third upper opening UO3 overlapping the (3-4)th lower opening LO34 is also referred to as a (3-4)th upper opening UO34. In other words, the (1-4)th lower opening LO14, the (2-4)th lower opening LO24, and the (3-4)th lower opening LO34 may be arranged in the second foldable area FA2. That is, the (1-4)th lower opening LO14, the (2-4)rd lower opening LO24, and the (3-4)th lower opening LO34 may overlap the second foldable area FA2.

A relative position relationship between the (1-4)th lower opening LO14 and the (1-4)th upper opening UO14 may be different from a relative position relationship between the (1-1)st lower opening LO11 and the (1-1)st upper opening UO11 described above with reference to FIG. 9. Similarly, a relative position relationship between the (2-4)th lower opening LO24 and the (2-4)th upper opening UO24 may be different from a relative position relationship between the (2-1)st lower opening LO21 and the (2-1)st upper opening UO21, and a relative position relationship between the (3-4)th lower opening LO34 and the (3-4)th upper opening UO34 may be different from a relative position relationship between the (3-1)st lower opening LO31 and the (3-1)st upper opening UO31.

A width WUO14 of the (1-4)th upper opening UO14 may be the same as the width WUO11 of the (1-1)st upper opening UO11, and a width WLO14 of the (1-4)th lower opening LO14 may be the same as the width WLO11 of the (1-1)st lower opening LO11. A width WUO24 of the (2-4)th upper opening UO24 may be the same as a width WUO21 of the (2-1)st upper opening UO21, and a width WLO24 of the (2-4)th lower opening LO24 may be the same as the width WLO21 of the (2-1)st lower opening LO21. A width WUO34 of the (3-4)th upper opening UO34 may be the same as a width WUO31 of the (3-1)st upper opening UO31, and a width WLO34 of the (3-4)nd lower opening LO34 may be the same as the width WLO31 of the (3-1)st lower opening LO31.

As shown in FIG. 12, in a plan view, a central point UCP14 of the (1-4)th upper opening UO14 and a central point LCP14 of the (1-4)th lower opening LO14 may be apart from each other in the first direction (e.g., the x direction or the −x direction). Specifically, in a plan view, the central point UCP14 of the (1-4)th upper opening UO14 may be disposed apart in a direction (also referred to as a second non-folded area direction) to the second non-folded area NFA2 by a (1-4)th separation distance S14 from the central point LCP14 of the (1-4)th lower opening LO14.

Similarly, in a plan view, a central point UCP24 of the (2-4)th upper opening UO24 and a central point LCP24 of the (2-4)th lower opening LO24 may be apart from each other in the first direction (e.g., the x direction or the −x direction). Specifically, in a plan view, the central point UCP24 of the (2-4)th upper opening UO24 may be disposed apart in a direction to the second non-folded area NFA2 by a (2-4)th separation distance S24 from the central point LCP24 of the (2-4)th lower opening LO24. In a plan view, a central point UCP34 of the (3-4)th upper opening UO34 and a central point LCP34 of the (3-4)th lower opening LO34 may be apart from each other in the first direction (e.g., the x direction or the −x direction). Specifically, in a plan view, the central point UCP34 of the (3-4)th upper opening UO34 may be disposed apart in a direction to the second non-folded area NFA2 by a (3-4)th separation distance S34 from the central point LCP34 of the (3-4)th lower opening LO34.

That is, the (1-4)th upper opening UO14 may be shifted to one side facing the second non-folded area NFA2 of the (1-4)th lower opening LO14 in the first direction (e.g., the x direction or the −x direction). Similarly, the (2-4)th upper opening UO24 may be shifted to one side facing the second non-folded area NFA2 of the (2-4)th lower opening LO24 in the first direction (e.g., the x direction or the −x direction). The (3-4)th upper opening UO34 may be shifted to one side facing the second non-folded area NFA2 of the (3-4)th lower opening LO34 in the first direction (e.g., the x direction or the −x direction). In other words, in a plan view, the central point UCP14 of the (1-4)th upper opening UO14 may be disposed closer to the second non-folded area NFA2 than the central point LCP14 of the (1-4)th lower opening LO14 is to the second non-folded area NFA2. Similarly, in a plan view, the central point UCP24 of the (2-4)th upper opening UO24 may be disposed closer to the second non-folded area NFA2 than the central point LCP24 of the (2-4)th lower opening LO24 is to the second non-folded area NFA2. In a plan view, the central point UCP34 of the (3-4)th upper opening UO34 may be disposed closer to the second non-folded area NFA2 than the central point LCP34 of the (3-4)th lower opening LO34 is to the second non-folded area NFA2.

Accordingly, as shown in FIG. 12, in a plan view, a distance between an edge point of the (1-4)th lower opening LO14 and an edge point of the (1-4)th upper opening UO14 meeting the virtual reference line VL14 may be defined such that a left side thereof and a right side thereof are different from each other with respect to the central point LCP14 of the (1-4)th lower opening LO14. The virtual reference line VL14 may be a virtual straight line passing through the central point LCP14 of the (1-4)th lower opening LO14 and the central point UCP14 of the (1-4)th upper opening UO14 in a plan view, and extending in the first direction (e.g., the x direction or the −x direction). Specifically, in a plan view, a distance L141 between a left edge point of the (1-4)th lower opening LO14 and a left edge point of the (1-4)th upper opening UO14 meeting the virtual reference line VL14 may be shorter than a distance L142 between a right edge point of the (1-4)th lower opening LO14 and a right edge point of the (1-4)th upper opening UO14 meeting the virtual reference line VL14. In other words, in a plan view, the distance L142 may be greater than the distance L141.

Similarly, in a plan view, a distance between an edge point of the (2-4)th lower opening LO24 and an edge point of the (2-4)th upper opening UO24 meeting a virtual reference line VL24 may be defined such that a left side thereof and a right side thereof are different from each other with respect to the central point LCP24 of the (2-4)th lower opening LO24. The virtual reference line VL24 may be a virtual straight line passing through the central point LCP24 of the (2-4)th lower opening LO24 and the central point UCP24 of the (2-4)th upper opening UO24 in a plan view, and extending in the first direction (e.g., the x direction or the −x direction). Specifically, in a plan view, a distance L241 between a left edge point of the (2-4)th lower opening LO24 and a left edge point of the (2-4)th upper opening UO24 meeting the virtual reference line VL24 may be shorter than a distance L242 between a right edge point of the (2-4)th lower opening LO24 and a right edge point of the (2-4)th upper opening UO24 meeting the virtual reference line VL24. In other words, in a plan view, the distance L242 may be greater than the distance L241.

Similarly, in a plan view, a distance between an edge point of the (3-4)th lower opening LO34 and an edge point of the (3-4)th upper opening UO34 meeting a virtual reference line VL34 may be defined such that a left side thereof and a right side thereof are different from each other with respect to the central point LCP34 of the (3-4)th lower opening LO34. The virtual reference line VL34 may be a virtual straight line passing through the central point LCP34 of the (3-4)th lower opening LO34 and the central point UCP34 of the (3-4)th upper opening UO34 in a plan view, and extending in the first direction (e.g., the x direction or the −x direction). Specifically, in a plan view, a distance L341 between a left edge point of the (3-4)th lower opening LO34 and a left edge point of the (3-4)th upper opening UO34 meeting the virtual reference line VL34 may be shorter than a distance L342 between a right edge point of the (3-4)th lower opening LO34 and a right edge point of the (3-4)th upper opening UO34 meeting the virtual reference line VL34. In other words, in a plan view, the distance L342 may be greater than the distance L341.

Figure 13:
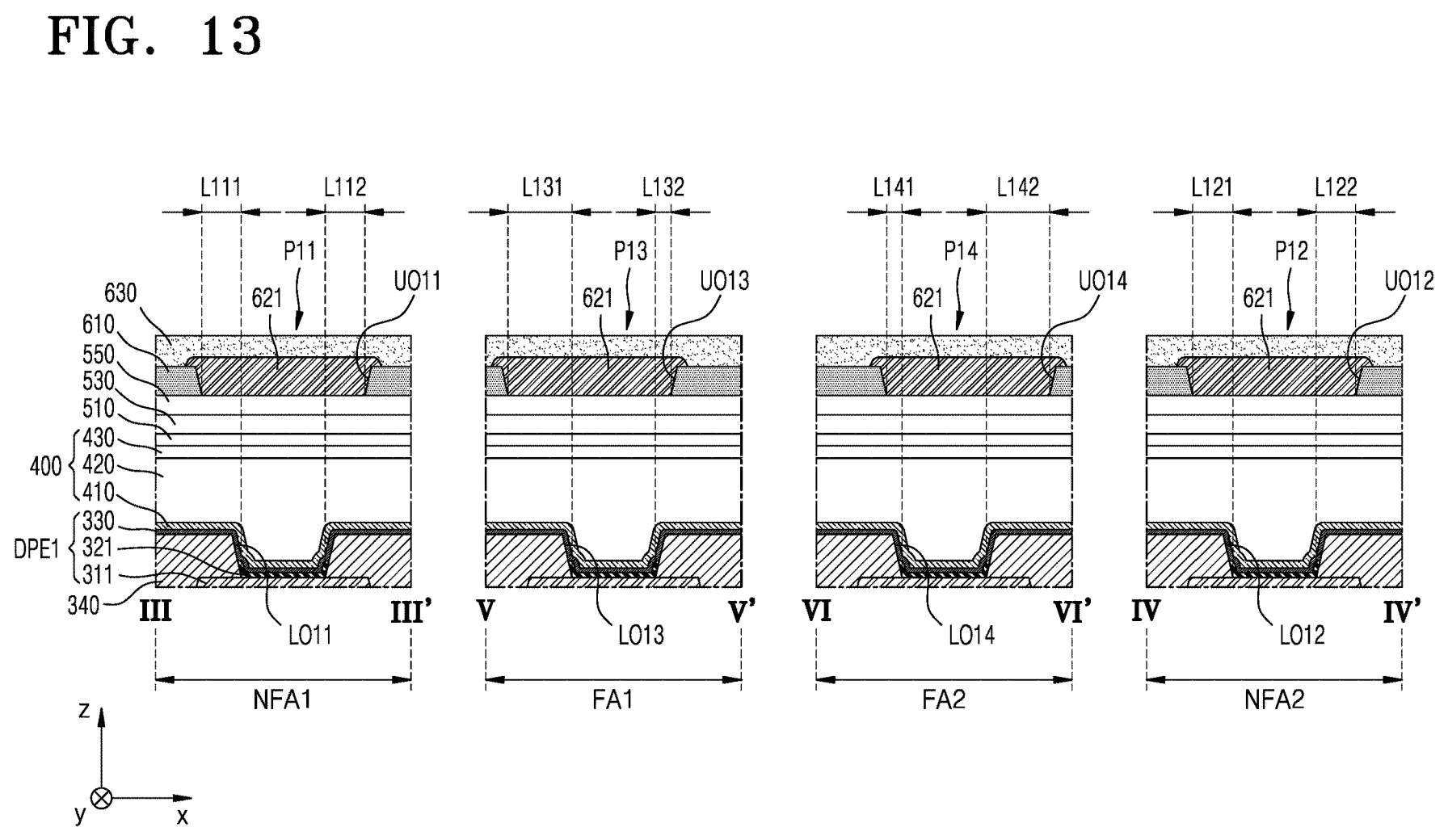

Accordingly, a relative position relationship between the lower opening LO and the upper opening UO corresponding to the lower opening LO may change depending on positions on which the lower opening LO and the upper opening UO are disposed. FIG. 13 is a view for explaining a relative position relationship between the upper opening UO and the lower opening LO. Specifically, FIG. 13 is a schematic cross-sectional view, taken along line III-III' of FIG. 9, taken along line IV-IV' of FIG. 10, taken along line V-V' of FIG. 11, and taken along line VI-VI' of FIG. 12. For convenience of illustration, the substrate 100 and the pixel circuit layer 200 are omitted. The (1-1)st pixel P11 is the first pixel P1 disposed in the first non-folded area NFA1, the (1-2)nd pixel P12 is the first pixel P1 disposed in the second non-folded area NFA2, the (1-3)rd pixel P13 is the first pixel P1 disposed in the first foldable area FA1, and the (1-4)th pixel P14 is the first pixel P1 arranged in the second foldable area FA2.

As described above with reference to FIGS. 9 to 12, the (1-1)st upper opening UO11 may overlap the (1-1)st lower opening LO11 and be defined not to be shifted to one side of the (1-1)st lower opening LO11 in the first direction (e.g., the x direction or the −x direction). The (1-2)nd upper opening UO12 overlaps the (1-2)nd lower opening LO12 and is defined not to be shifted to one side of the (1-2)nd lower opening LO12 in the first direction (e.g., the x direction or the −x direction). Unlike this, the (1-3)rd upper opening UO13 may overlap the (1-3)rd lower opening LO13 and be defined to be shifted to one side facing the first non-folded area NFA1 of the (1-3)rd lower opening LO13 in the first direction (e.g., the x direction or the −x direction). The (1-4)th upper opening UO14 may overlap the (1-4)th lower opening LO14 and be defined to be shifted to one side facing the second non-folded area NFA2 of the (1-4)th lower opening LO14 in the first direction (e.g., the x direction or the −x direction). The description of the relative position relationship between the first lower opening LO1 and the first upper opening UO1 is applicable to a relative position relationship between the second lower opening LO2 and the second upper opening UO2, and a relative position relationship between the third lower opening LO3 and the third upper opening UO3. Accordingly, with regard to this, repeated descriptions are omitted.

Figure 14:
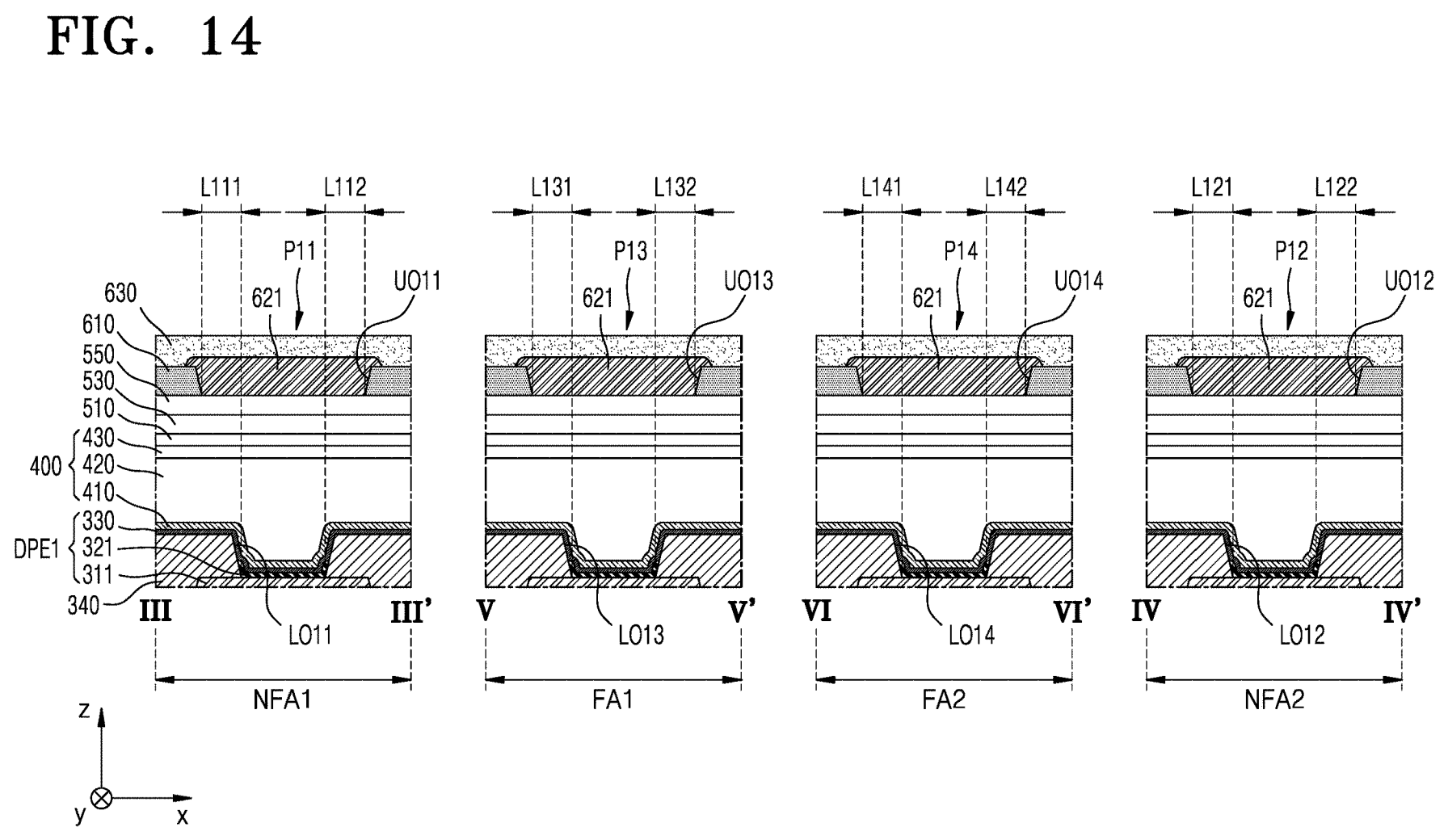
Figure 15:
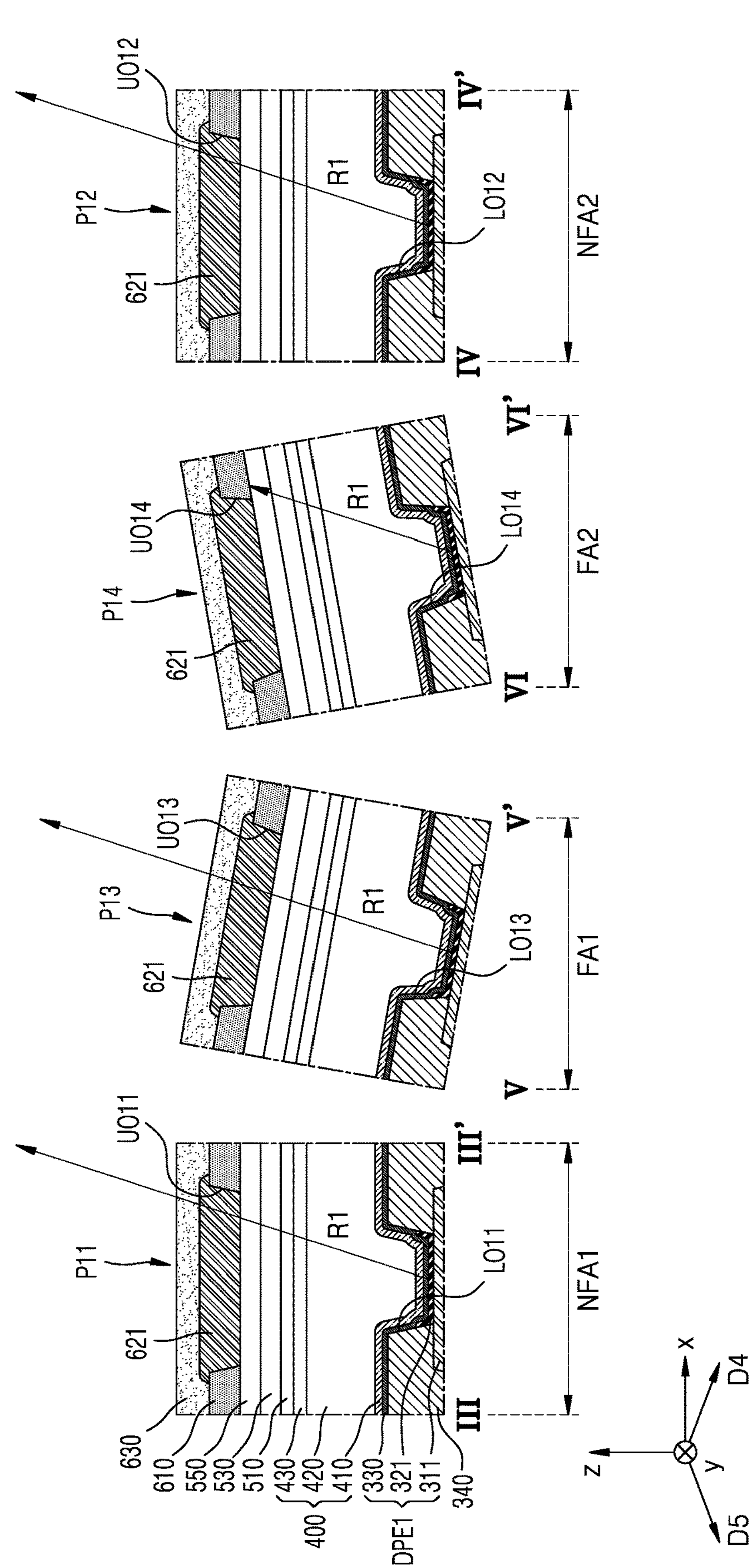
FIG. 15 is a view for explaining a brightness deviation in a display apparatus according to a comparative example.

FIG. 14 is a schematic cross-sectional view of a portion of the display apparatus according to a comparative example. FIG. 15 is a view for explaining a brightness deviation in the display apparatus according to a comparative example. Specifically, FIG. 15 is a schematic cross-sectional view of a state after a portion of the display apparatus of FIG. 14 is folded and unfolded over a plurality of times. In FIGS. 14 and 15, for convenience of illustration, the substrate 100 and the pixel circuit layer 200 are omitted.

As shown in FIG. 14, even in the case of a display apparatus according to a comparative example, a (1-1)st upper opening UO11 may be defined not to be shifted to one side of a (1-1)st lower opening LO11 in the first direction (e.g., the x direction or the −x direction), and a (1-2)nd upper opening UO12 may be defined not to be shifted to one side of a (1-2)nd lower opening LO12 in the first direction (e.g., the x direction or the −x direction). However, in the case of the display apparatus according to the comparative example, even in the case of the display apparatus according to the comparative example, a (1-3)rd upper opening UO13 may be defined not to be shifted to one side of a (1-3)rd lower opening LO13 in the first direction (e.g., the x direction or the −x direction), and a (1-4)th upper opening UO14 may be defined not to be shifted to one side of a (1-4)th lower opening LO14 in the first direction (e.g., the x direction or the −x direction).

In other words, in the case of the display apparatus according to the comparative example, with regard to the (1-3)rd pixel P13, the distance L131 and the distance L132 may be the same, and with regard to the (1-4)th pixel P14, the distance L141 and the distance L142 may be the same. In addition, with regard to the (1-1)st pixel, the distance L111 and the distance L112 may the same, and with regard to the (1-2)nd pixel, the distance L121 and the distance L122 may the same.

As shown in FIG. 15, the first emission layer 321 corresponding to the (1-1)st pixel P11, the (1-2)nd pixel P12, the (1-3)rd pixel P13, and the (1-4)th pixel P14 may generate light, and the light may be emitted to the outside of the display apparatus. As described above with reference to FIG. 4, in the case where the display apparatus 1 is folded and unfolded over plurality of times, the foldable area FA may have a concave shape. Specifically, the second foldable area FA2 may be inclined in a fourth direction D4 and inclined in a fifth direction D5. In a display apparatus according to a comparative example, the (1-3)rd upper opening UO13 may overlap the (1-3)rd lower opening LO13 and be defined not to be shifted to one side of the (1-3)rd lower opening LO13 in the first direction (e.g., the x direction or the −x direction), and the (1-4)th upper opening UO14 may overlap the (1-4)th lower opening LO14 and be defined not to be shifted to one side of the (1-4)th lower opening LO14 in the first direction (e.g., the x direction or the −x direction).

In this case, light characteristics of the display apparatus may be different depending on the region of the display apparatus. Specifically, as shown in FIG. 15, because a portion of light R1 generated from the first emission layer 321 in the second foldable area FA2 is blocked by the light-blocking layer 610, the light cannot be emitted to the right of the display apparatus. That is, the amount of light R1 generated from the first emission layer 321 in the second foldable area FA2 and emitted to the right of the display apparatus may be less than the amount of light R1 generated from the first emission layer 321 in the first foldable area FA1 and emitted to the right of the display apparatus.

Figure 16:
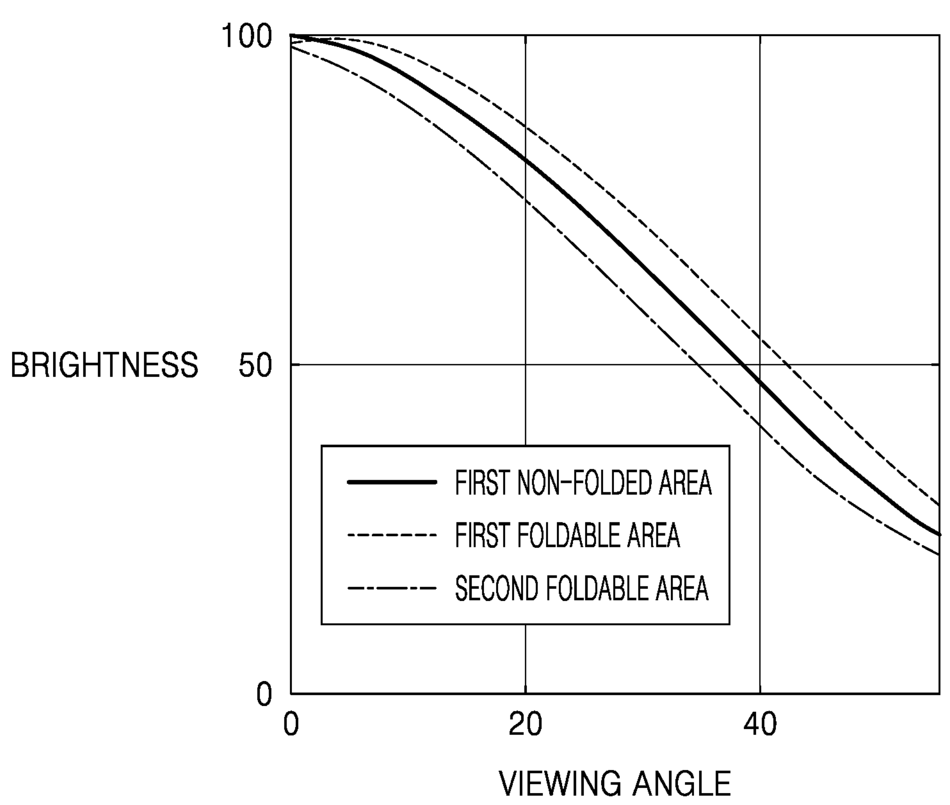
FIG. 16 is a graph showing brightness depending on viewing angles in a display apparatus according to a comparative example.

FIG. 16 is a graph showing brightness depending on viewing angles in a display apparatus according to a comparative example. Brightness of a display apparatus according to a comparative example was measured under a state in which the first foldable area FA1 and the second foldable area FA2 are transformed when the display apparatus is folded and unfolded over a plurality of times. Specifically, brightness of each of the first non-folded area NFA1, the first foldable area FA1, and the second foldable area FA2 was measured on the right of the display apparatus. A horizontal axis of the graph of FIG. 16 represents a viewing angle, and a unit of the viewing angle is degree (°). A vertical axis of the graph of FIG. 16 represents brightness, and a unit of the brightness is percent (%). That is, the brightness in FIG. 16 represents a ratio of brightness of the first non-folded area NFA1, the first foldable area FA1, or the second foldable area FA2 over brightness of the first non-folded area NFA1 at a viewing angle of 0°. It is assumed that brightness of the first non-folded area NFA1 at a viewing angle of 0° is 100%. Brightness of the second non-folded area NFA2 was equal or similar to brightness of the first non-folded area NFA1.

As shown in FIG. 16, a difference in brightness between the first non-folded area NFA1 and the first foldable area FA1, and a difference in brightness between the first non-folded area NFA1 and the second foldable area FA2 change depending on a viewing angle. That is, when viewed from the front surface of the display apparatus (e.g., the viewing angle is 0°), brightness of the first non-folded area NFA1, the first foldable area FA1, and the second foldable area FA2 are similar to each other. However, when viewed from the right side of the display apparatus (e.g., the viewing angle increases), brightness of the first foldable area FA1 is greater than brightness of the first non-folded area NFA1, and brightness of the second foldable area FA2 is less than brightness of the first non-folded area NFA1. That is, because the first foldable area FA1 is inclined to the right, brightness of the first foldable area FA1 is greater than brightness of the first non-folded area NFA1. Because a portion of light R1 generated from the first emission layer 321 in the second foldable area FA2 that is inclined to the left is blocked by the light-blocking layer 610 and is not emitted to the right of the display apparatus, brightness of the second foldable area FA2 is less than brightness of the first non-folded area NFA1.

Figure 17:
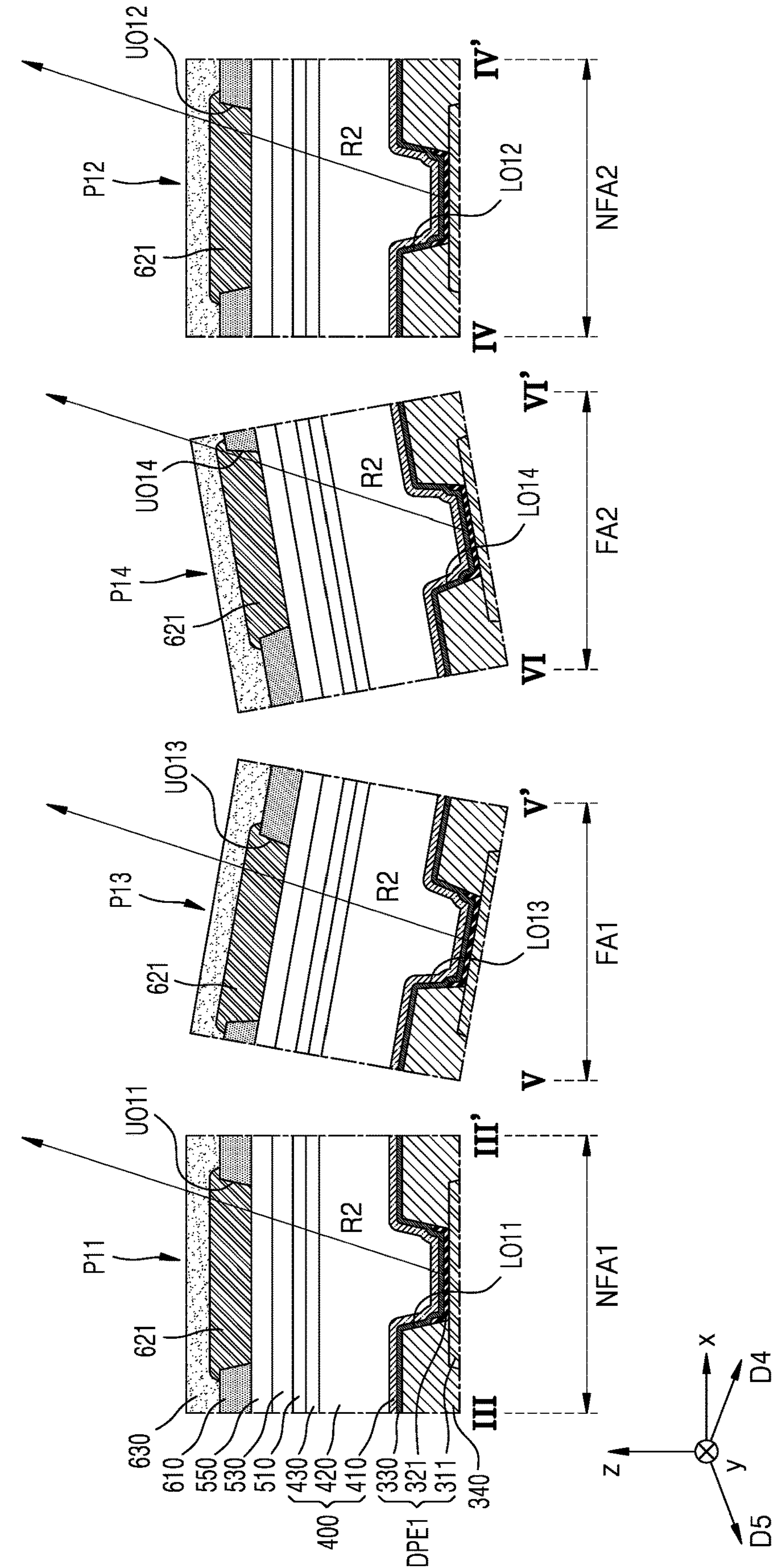
FIG. 17 is a view for explaining an embodiment of reduction in brightness deviation in a display apparatus.

FIG. 17 is a view for explaining an embodiment of reduction in brightness deviation in the display apparatus 1. Specifically, FIG. 17 is a schematic cross-sectional view of a state after a portion of the display apparatus 1 of FIG. 13 is folded and unfolded over a plurality of times. However, in FIG. 17, for convenience of illustration, the substrate 100 and the pixel circuit layer 200 are omitted.

As shown in FIG. 17, the first emission layer 321 corresponding to the (1-1)st pixel P11, the (1-2)nd pixel P12, the (1-3)rd pixel P13, and the (1-4)th pixel P14 may generate light, and the light may be emitted to the outside of the display apparatus. As described above with reference to FIG. 4, in the case where the display apparatus 1 is folded and unfolded over plurality of times, the foldable area FA may have a concave shape. Specifically, the first foldable area FA1 may be inclined in a fourth direction D4 and inclined in a fifth direction D5. In an embodiment, the (1-3)rd upper opening UO13 may be shifted to one side facing the first non-folded area NFA1 of the (1-3)rd lower opening LO13 in the first direction (e.g., the x direction or the −x direction), and the (1-4)th upper opening UO14 may be shifted to one side facing the second non-folded area NFA2 of the (1-4)th lower opening LO14 in the first direction (e.g., the x direction or the −x direction).

In this case, as shown in FIG. 17, the degree by which a portion of light R2 generated from the first emission layer 321 in the second foldable area FA2 is blocked by the light-blocking layer 610, may be reduced. That is, a difference between the amount of light R2 generated from the first emission layer 321 in the second foldable area FA2 and emitted to the right of the display apparatus, and the amount of light R2 generated from the first emission layer 321 in the first non-folded area NFA1, the second non-folded area NFA2, or the first foldable area FA1 and emitted to the right of the display apparatus, may be reduced.

Figure 18:
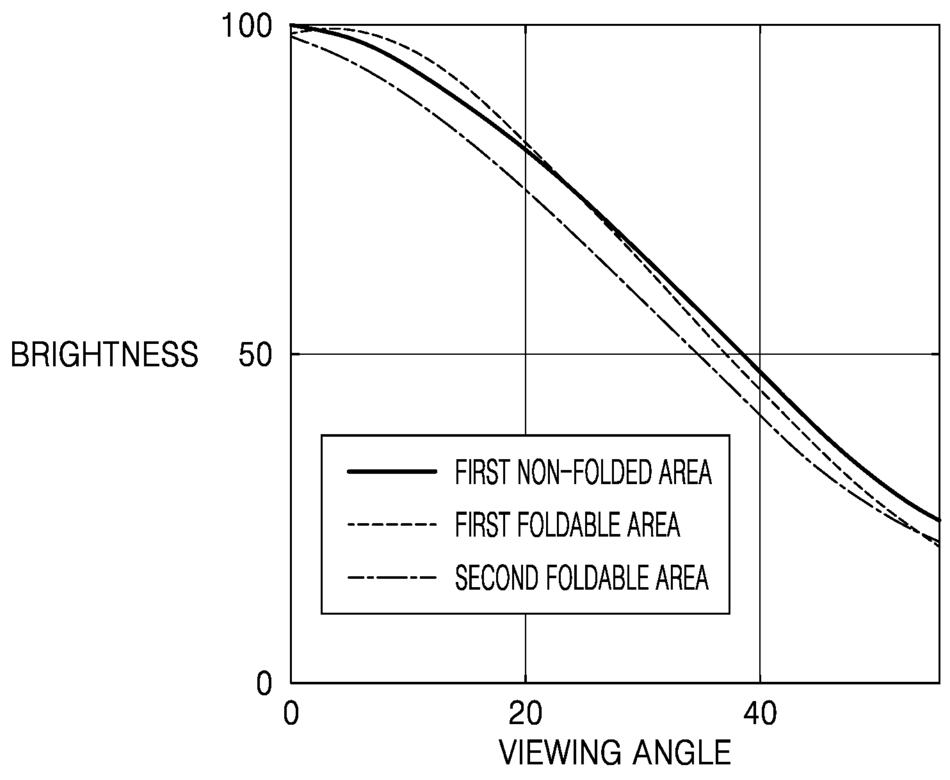
FIG. 18 is a graph showing an embodiment of brightness depending on viewing angles in a display apparatus.

FIG. 18 is a graph showing an embodiment of brightness depending on viewing angles in a display apparatus 1. Brightness of a display apparatus in an embodiment was measured under a state in which the first foldable area FA1 and the second foldable area FA2 are transformed when the display apparatus is folded and unfolded over a plurality of times. Specifically, brightness of each of the first non-folded area NFA1, the first foldable area FA1, and the second foldable area FA2 was measured on the right of the display apparatus 1. A horizontal axis of the graph of FIG. 18 represents a viewing angle, and a unit of the viewing angle is degree (°). A vertical axis of the graph of FIG. 18 represents brightness, and a unit of the brightness is percent (%). That is, the brightness in FIG. 18 represents a ratio of brightness of the first non-folded area NFA1, the first foldable area FA1, or the second foldable area FA2 over brightness of the first non-folded area NFA1 at a viewing angle of 0°. It is assumed that brightness of the first non-folded area NFA1 at a viewing angle of 0° is 100%. Brightness of the second non-folded area NFA2 was equal or similar to brightness of the first non-folded area NFA1.

Even in an embodiment, a difference in brightness between the first non-folded area NFA1 and the first foldable area FA1, and a difference in brightness between the first non-folded area NFA1 and the second foldable area FA2 change depending on a viewing angle. However, in an embodiment, compared to a comparative example, a difference in brightness between the first non-folded area NFA1 and the first foldable area FA1, and a difference in brightness between the first non-folded area NFA1 and the second foldable area FA2 may be reduced.

Specifically, the (1-3)rd upper opening UO13 may be shifted to one side facing the first non-folded area NFA1 of the (1-3)rd lower opening LO13 in the first direction (e.g., the x direction or the −x direction). Accordingly, because a portion of light R2 generated from the first emission layer 321 in the first foldable area FA1 is blocked by the light-blocking layer 610, the light R2 cannot be emitted to the right of the display apparatus. This effect may increase when the viewing angle increases. Accordingly, a difference in brightness between the first non-folded area NFA1 and the first foldable area FA1 may be reduced. The (1-4)th upper opening UO14 may be shifted to one side facing the second non-folded area NFA2 of the (1-4)th lower opening LO14 in the first direction (e.g., the x direction or the −x direction). Accordingly, the degree by which light R2 generated from the first emission layer 321 in the second foldable area FA2 is blocked by the light-blocking layer 610 may be reduced. Accordingly, a difference in brightness between the first non-folded area NFA1 and the second foldable area FA2 may be reduced. In other words, a difference in light characteristics between the non-folded area and the foldable area may be reduced. Accordingly, the display quality of the display apparatus 1 may be improved.

In an embodiment, the (1-3)rd separation distance S13, the (2-3)rd separation distance S23, and the (3-3)rd separation distance S33 may be different from one another. In an embodiment, the (2-3)rd separation distance S23 may be greater than the (1-3)rd separation distance S13, and the (1-3)rd separation distance S13 may be greater than the (3-3)rd separation distance S33. Similarly, the (1-4)th separation distance S14, the (2-4)th separation distance S24, and the (3-4)th separation distance S34 may be different from one another. In an embodiment, the (2-4)th separation distance S24 may be greater than the (1-4)th separation distance S14, and the (1-4)th separation distance S14 may be greater than the (3-4)th separation distance S34.

Accordingly, a color deviation between the first non-folded area NFA1 and the first foldable area FA1, or between the first non-folded area NFA1 and the second foldable area FA2 may be reduced. Specifically, compared to the case where the (1-3)rd separation distance S13, the (2-3)rd separation distance S23, and the (3-3)rd separation distance S33 are the same, a color deviation between the first non-folded area NFA1 and the first foldable area FA1 may be relatively small in the case where the (1-3)rd separation distance S13, the (2-3)rd separation distance S23, and the (3-3)rd separation distance S33 are different from one another. Similarly, compared to the case where the (1-4)th separation distance S14, the (2-4)th separation distance S24, and the (3-4)th separation distance S34 are the same, a color deviation between the first non-folded area NFA1 and the second foldable area FA2 may be relatively small in the case where the (1-4)th separation distance S14, the (2-4)th separation distance S24, and the (3-4)th separation distance S34 are different from one another. In other words, a difference in light characteristics between the non-folded area and the foldable area may be reduced. Accordingly, the display quality of the display apparatus 1 may be improved.

In an embodiment, in the case where the (1-3)rd separation distance S13, the (2-3)rd separation distance S23, and the (3-3)rd separation distance S33 are the same, which is about 4.8 micrometers (μ), and the (1-4)th separation distance S14, the (2-4)th separation distance S24, and the (3-4)th separation distance S34 are the same, which is about 4.8 μm, a color deviation between the first non-folded area NFA1 and the first foldable area FA1 at a viewing angle of about 30° viewed from the right of the display apparatus 1 was about 0.0049. In this case, a color deviation between the first non-folded area NFA1 and the second foldable area FA2 at a viewing angle of about 30° viewed from the right of the display apparatus 1 was about 0.0027. In contrast, in the case where the (1-3)rd separation distance S13, the (2-3)rd separation distance S23, and the (3-3)rd separation distance S33 are respectively about 5.0 μm, about 5.8 μm, and about 4.7 μm, and the (1-4)th separation distance S14, the (2-4)th separation distance S24, and the (3-4)th separation distance S34 are respectively about 5.0 μm, about 5.8 μm, and about 4.7 μm, a color deviation between the first non-folded area NFA1 and the first foldable area FA1 at a viewing angle of about 30° viewed from the right of the display apparatus 1 was about 0.0001. Even in this case, a color deviation between the first non-folded area NFA1 and the second foldable area FA2 at a viewing angle of about 30° viewed from the right of the display apparatus 1 was about 0.0027. In the specification, a color deviation was obtained by measuring a distance between a coordinate corresponding to the first non-folded area NFA1 and a coordinate corresponding to the first foldable area FA1, or a shortest distance between a coordinate corresponding to the first non-folded area NFA1 and a coordinate corresponding to the second foldable area FA2 based on a Commission Internationale de l'Elcairage ("CIE") 1976 color coordinate system.

Figure 19:
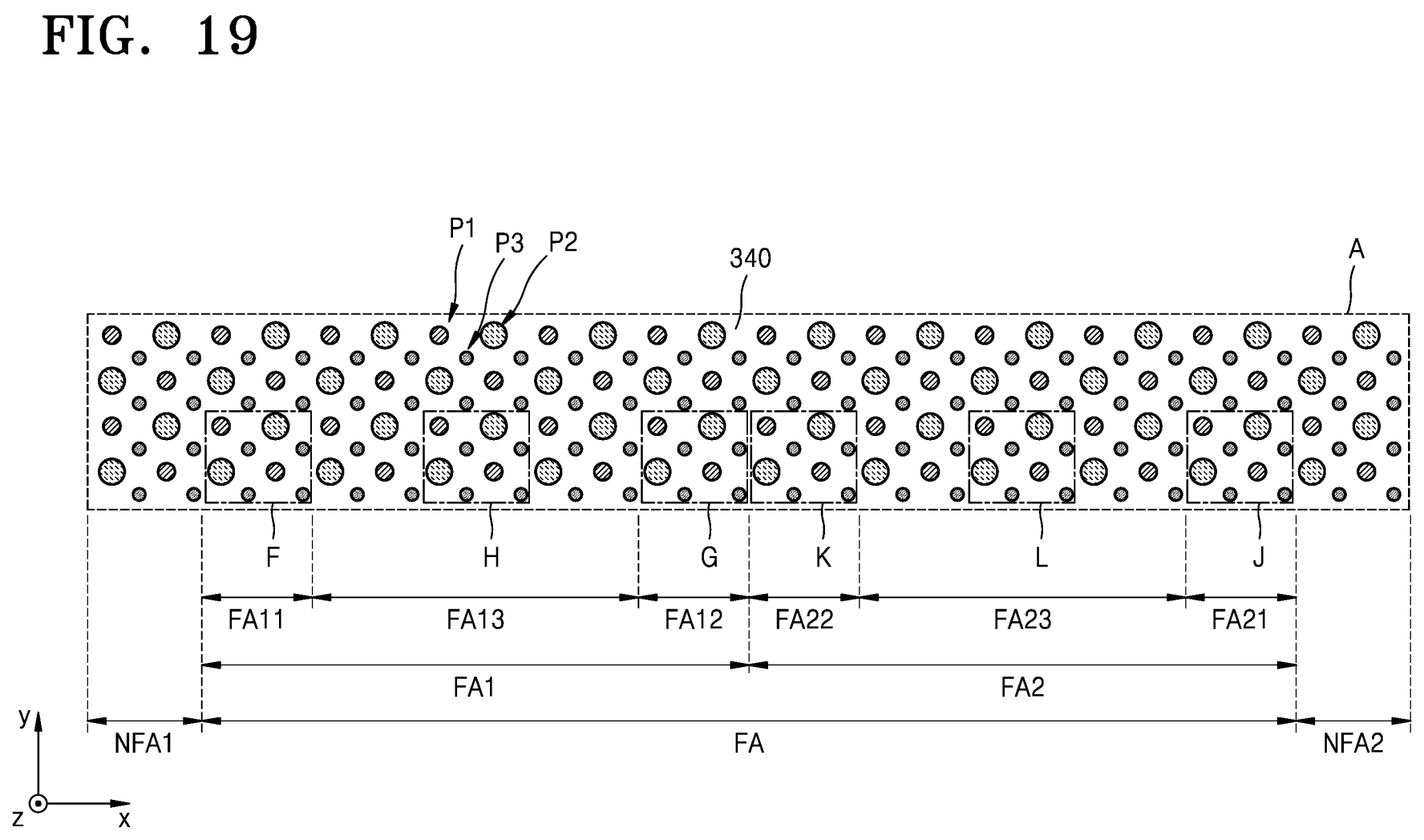

As shown in FIG. 10, which is a schematic plan view of a portion of the display apparatus 1 in an embodiment, the first foldable area FA1 may include a (1-1)st foldable area FA11, a (1-2)nd foldable area FA12, and a (1-3)rd foldable area FA13. Similarly, the second foldable area FA2 may include a (2-1)st foldable area FA21, a (2-2)nd foldable area FA22, and a (2-3)rd foldable area FA23. FIG. 9 is a schematic plan view of a display apparatus 1 in an embodiment. Specifically, FIG. 19 is an enlarged schematic plan view of the region A of the display apparatus 1 FIG. 5. FIG. 19 shows a plan view of the pixel-defining layer 340.

As shown in FIG. 19, the (1-1)st foldable area FA11 may be a region adjacent to the first non-folded area NFA1, and the (1-2)nd foldable area FA12 may be a region adjacent to the second foldable area FA2. The (1-3)rd foldable area FA13 may be a region between the (1-1)st foldable area FA11 and the (1-2)nd foldable area FA12. The (2-1)st foldable area FA21 may be a region adjacent to the second non-folded area NFA2, and the (2-2)nd foldable area FA22 may be a region adjacent to the first foldable area FA1. The (2-3)rd foldable area FA23 may be a region between the (2-1)st foldable area FA21 and the (2-2)nd foldable area FA22.

Figure 20:
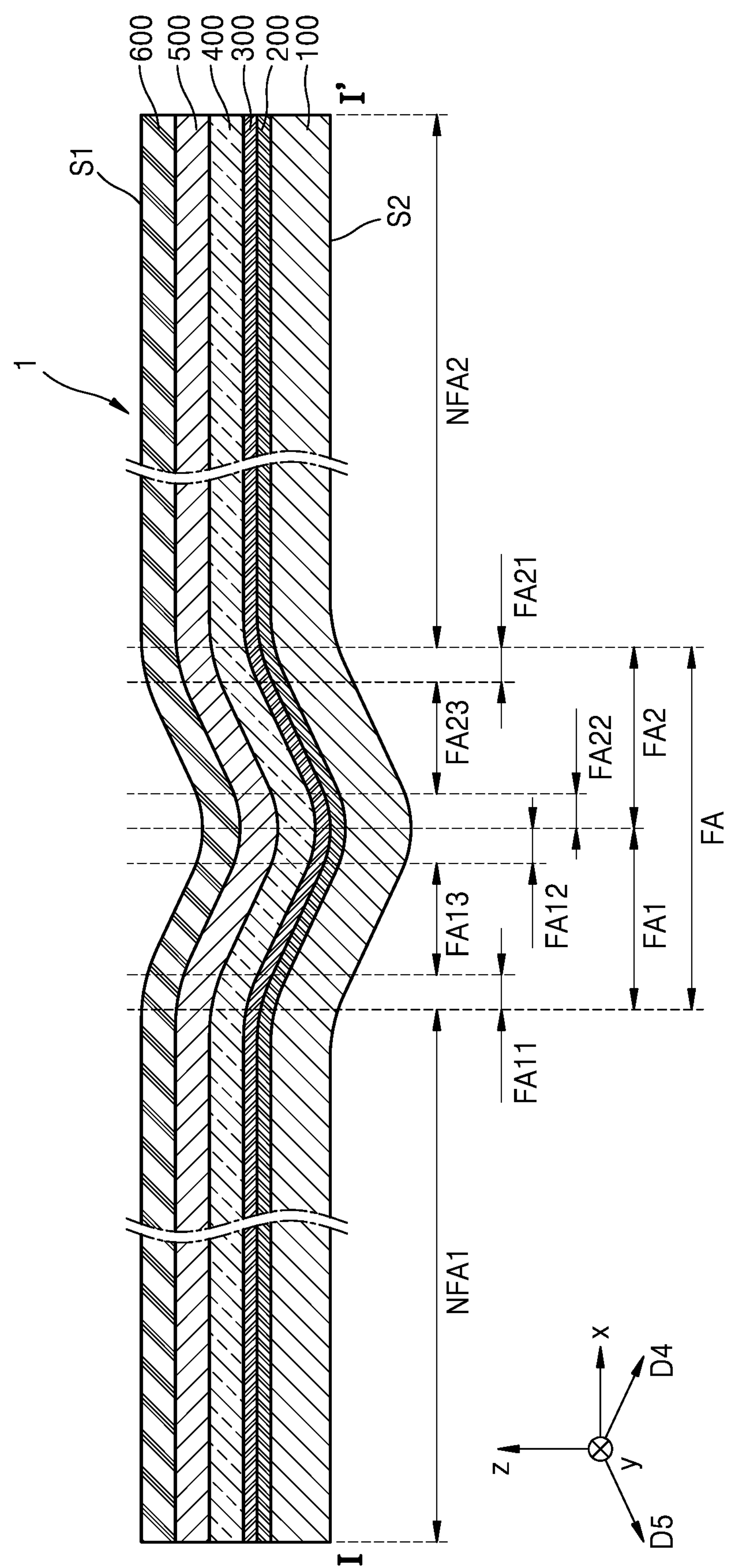
FIG. 20 is a view showing a state after the display apparatus shown in FIG. 3 is folded and unfolded a plurality of times.

In the case where the display apparatus 1 is folded and unfolded over a plurality of times, degrees by which the (1-1)st foldable area FA11, the (1-2)nd foldable area FA12, and the (1-3)rd foldable area FA13 are transformed may be different from one another. As shown in FIG. 20 which is a view showing a state after the display apparatus 1 shown in FIG. 3 is folded and unfolded over a plurality of times, the upper surface of the (1-1)st foldable area FA11 and the upper surface of the (1-2)nd foldable area FA12 may be less inclined than the upper surface of the (1-3)rd foldable area FA13 with respect to a plane (e.g., an xy-plane) parallel to the upper surface of the first non-folded area NFA1. The degree by which the upper surface of the (1-1)st foldable area FA11 is inclined may be similar to the degree by which the upper surface of the (1-2)nd foldable area FA12 is inclined with respect to a plane (e.g., an xy-plane) parallel to the upper surface of the first non-folded area NFA1.

Similarly, in the case where the display apparatus 1 is folded and unfolded over a plurality of times, degrees by which the (2-1)st foldable area FA21, the (2-2)nd foldable area FA22, and the (2-3)rd foldable area FA23 are transformed may be different from one another. The upper surface of the (2-1)st foldable area FA21 and the upper surface of the (2-2)nd foldable area FA22 may be less inclined than the upper surface of the (2-3)rd foldable area FA23 with respect to a plane (e.g., an xy-plane) parallel to the upper surface of the second non-folded area NFA2. The degree by which the upper surface of the (2-1)st foldable area FA21 is inclined may be similar to the degree by which the upper surface of the (2-2)nd foldable area FA22 is inclined with respect to a plane (e.g., an xy-plane) parallel to the upper surface of the second non-folded area NFA2.

Because the degrees by which the (1-1)st foldable area FA11, the (1-2)nd foldable area FA12, and the (1-3)rd foldable area FA13 are transformed are different from one another, a relative position relationship between the lower opening LO and the upper opening UO corresponding to the lower opening LO may change depending on the positions on which the lower opening LO and the upper opening UO are arranged.

Figure 21:
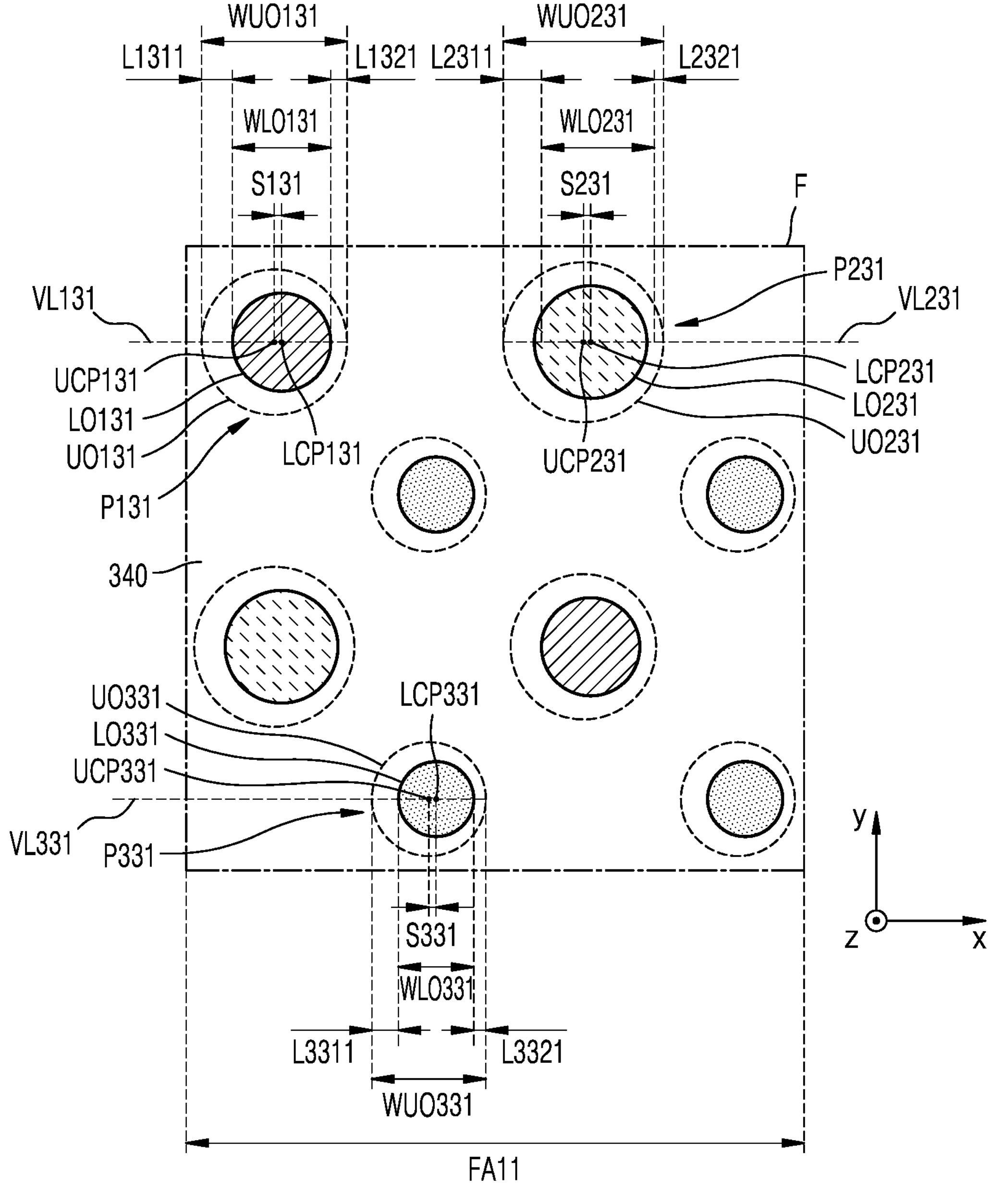
FIGS. 21 to 23 are views for explaining a relative position relationship between an upper opening and a lower opening.
Figure 22:
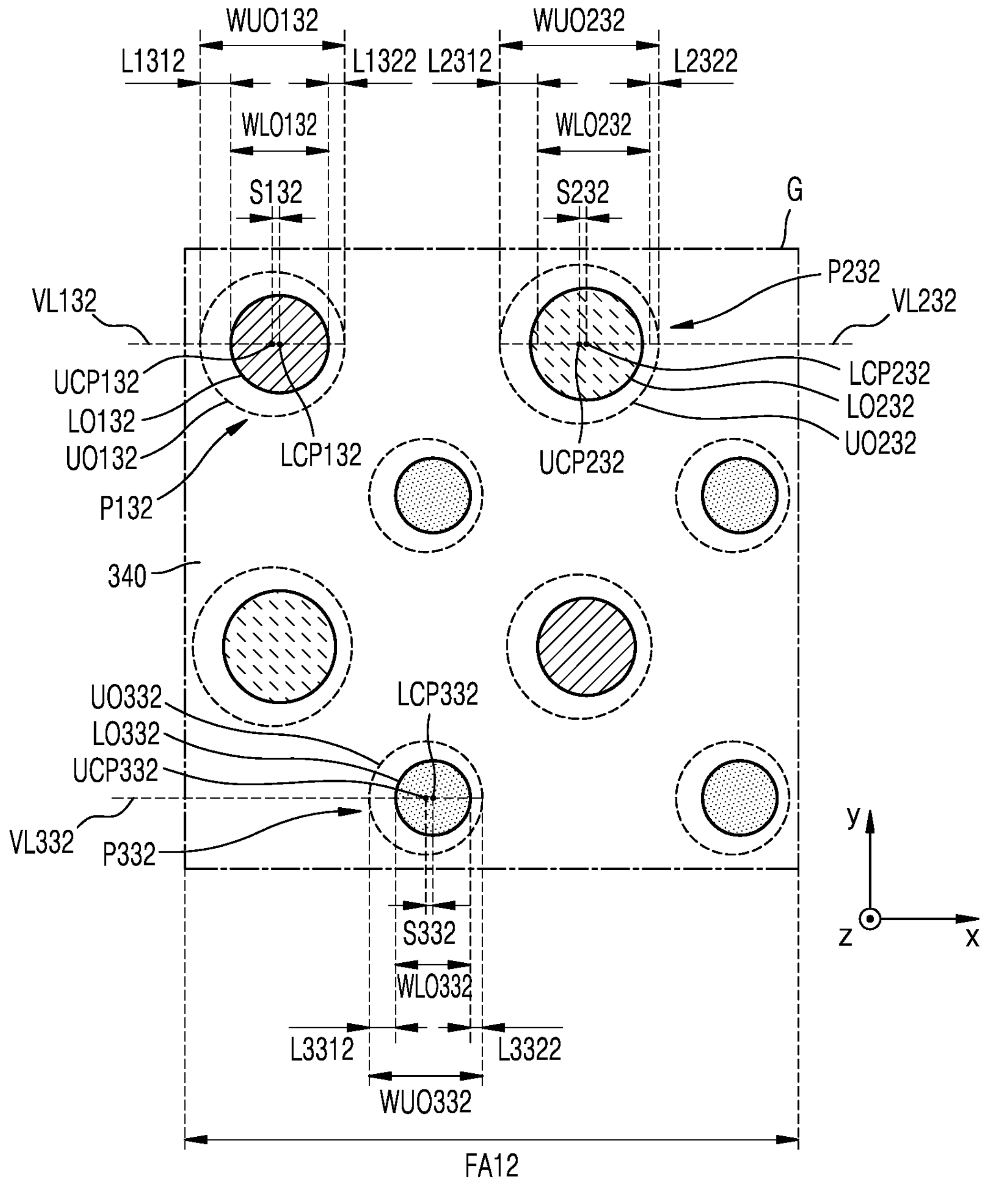
Figure 23:
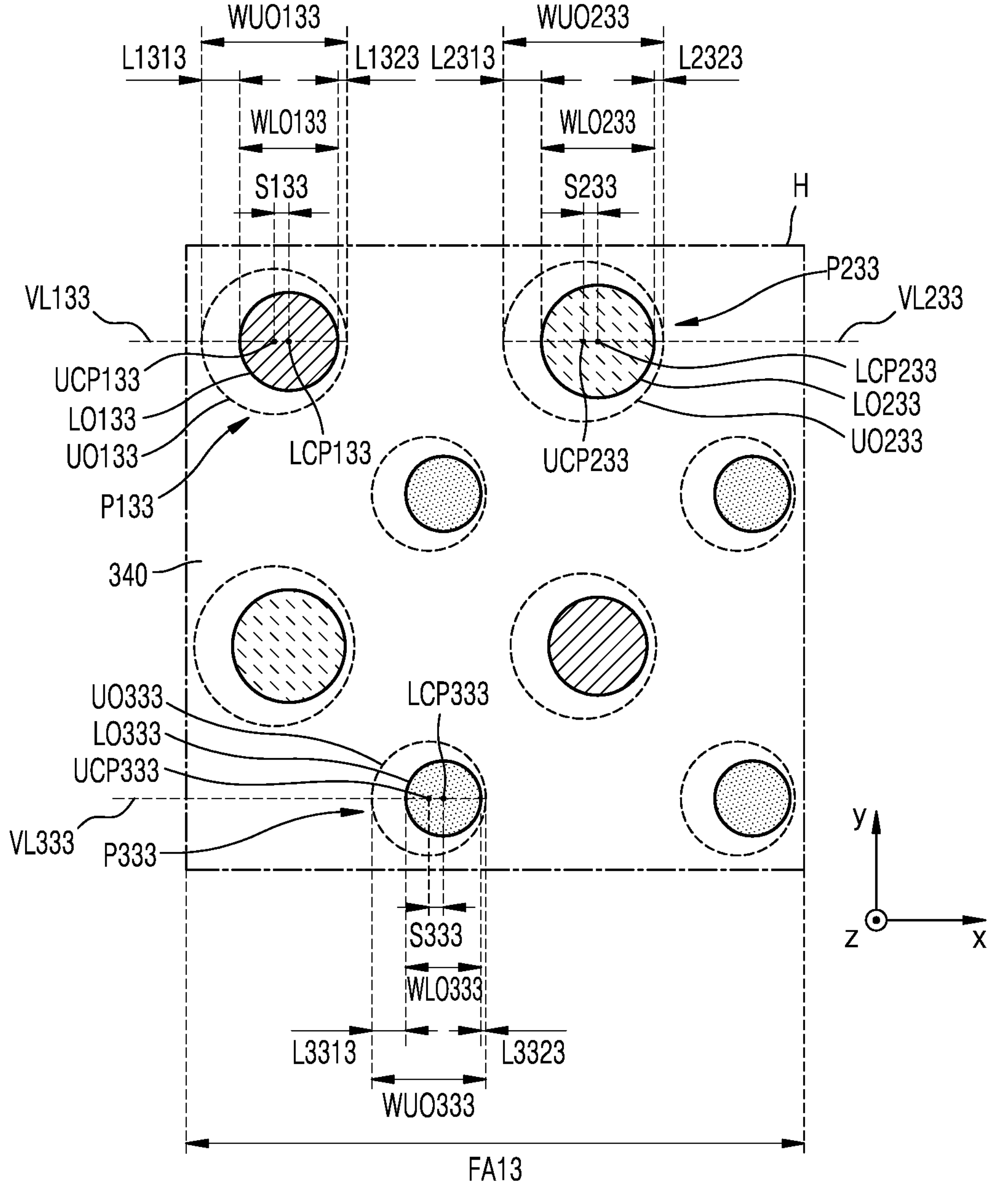

FIGS. 21 to 23 are views for explaining a relative position relationship between the upper opening UO and the lower opening LO. Specifically, FIG. 21 is a schematic enlarged plan view of a region F of FIG. 19, FIG. 22 is a schematic enlarged plan view of a region G of FIG. 19, and FIG. 23 is a schematic enlarged plan view of a region H of FIG. 19. Although FIGS. 21 to 23 shows a plan view of the pixel-defining layer 340, the upper opening UO is shown together, for convenience of description.

As described above with reference to FIG. 11, the plurality of (1-3)rd pixels P13, the plurality of (2-3)rd pixels P23, and the plurality of (3-3)rd pixels P33 are arranged in the first foldable area FA1. Hereinafter, for convenience of description, the (1-3)rd pixel P13 disposed in the (1-1)st foldable area FA11 is also referred to as a (1-3-1)st pixel P131, the (2-3)rd pixel P23 disposed in the (1-1)st foldable area FA11 is also referred to as a (2-3-1)st pixel P231, and the (3-3)rd pixel P33 disposed in the (1-1)st foldable area FA11 is also referred to as a (3-3-1)st pixel P331. The (1-3)rd lower opening LO13 corresponding to the (1-3-1)st pixel P131 is also referred to as a (1-3-1)st lower opening LO131, and the (1-3)rd upper opening UO13 overlapping the (1-3-1)st lower opening LO131 is also referred to as a (1-3-1)st upper opening UO131.

The (2-3)rd lower opening LO23 corresponding to the (2-3-1)st pixel P231 is also referred to as a (2-3-1)st lower opening LO231, and the (2-3)rd upper opening UO23 overlapping the (2-3-1)st lower opening LO231 is also referred to as a (2-3-1)st upper opening UO231. The (3-3)rd lower opening LO33 corresponding to the (3-3-1)st pixel P331 is also referred to as a (3-3-1)st lower opening LO331, and the (3-3)rd upper opening UO33 overlapping the (3-3-1)st lower opening LO331 is also referred to as a (3-3-1)st upper opening UO331. In other words, the (1-3-1)st lower opening LO131, the (2-3-1)st lower opening LO231, and the (3-3-1)st lower opening LO331 may be arranged in the (1-1)st foldable area FA11. That is, the (1-3-1)st lower opening LO131, the (2-3-1)st lower opening LO231, and the (3-3-1)st lower opening LO331 may overlap the (1-1)st foldable area FA11.

Similarly, the (1-3)rd pixel P13 disposed in the (1-2)nd foldable area FA12 is also referred to as a (1-3-2)nd pixel P132, the (2-3)rd pixel P23 disposed in the (1-2)nd foldable area FA12 is also referred to as a (2-3-2)nd pixel P232, and the (3-3)rd pixel P33 disposed in the (1-2)nd foldable area FA12 is also referred to as a (3-3-2)nd pixel P332. The (1-3)rd lower opening LO13 corresponding to the (1-3-2)nd pixel P132 is also referred to as a (1-3-2)nd lower opening LO132, and the (1-3)rd upper opening UO13 overlapping the (1-3-2)nd lower opening LO132 is also referred to as a (1-3-2)nd upper opening UO132. The (2-3)rd lower opening LO23 corresponding to the (2-3-2)nd pixel P232 is also referred to as a (2-3-2)nd lower opening LO232, and the (2-3)rd upper opening UO23 overlapping the (2-3-2)nd lower opening LO232 is also referred to as a (2-3-2)nd upper opening UO232. The (3-3)rd lower opening LO33 corresponding to the (3-3-2)nd pixel P332 is also referred to as a (3-3-2)nd lower opening LO332, and the (3-3)rd upper opening UO33 overlapping the (3-3-2)nd lower opening LO332 is also referred to as a (3-3-2)st upper opening UO332. The (1-3-2)nd lower opening LO132, the (2-3-2)nd lower opening LO232, and the (3-3-2)nd lower opening LO332 may overlap the (1-2)nd foldable area FA12.

Similarly, the (1-3)rd pixel P13 disposed in the (1-3)rd foldable area FA13 is also referred to as a (1-3-3)rd pixel P133, the (2-3)rd pixel P23 disposed in the (1-3)rd foldable area FA13 is also referred to as a (2-3-3)rd pixel P233, and the (3-3)rd pixel P33 disposed in the (1-3)rd foldable area FA13 is also referred to as a (3-3-3)rd pixel P333. The (1-3)rd lower opening LO13 corresponding to the (1-3-3)rd pixel P133 is also referred to as a (1-3-3)rd lower opening LO133, and the (1-3)rd upper opening UO13 overlapping the (1-3-3)rd lower opening LO133 is also referred to as a (1-3-3)rd upper opening UO133. The (2-3)rd lower opening LO23 corresponding to the (2-3-3)rd pixel P233 is also referred to as a (2-3-3)rd lower opening LO233, and the (2-3)rd upper opening UO23 overlapping the (2-3-3)rd lower opening LO233 is also referred to as a (2-3-3)rd upper opening UO233. The (3-3)rd lower opening LO33 corresponding to the (3-3-3)nd pixel P333 is also referred to as a (3-3-3)rd lower opening LO333, and the (3-3)rd upper opening UO33 overlapping the (3-3-3)rd lower opening LO333 is also referred to as a (3-3-3)rd upper opening UO333. The (1-3-3)rd lower opening LO133, the (2-3-3)rd lower opening LO233, and the (3-3-3)rd lower opening LO333 may overlap the (1-3)rd foldable area FA13.

A width WUO131 of the (1-3-1)st upper opening UO131, a width WUO132 of the (1-3-2)nd upper opening UO132, and a width WUO133 of the (1-3-3)rd upper opening UO133 may be equal to the width WUO11 of the (1-1)st upper opening UO11, and a width WLO131 of the (1-3-1)st lower opening LO131, a width WLO132 of the (1-3-2)nd lower opening LO132, and a width WLO133 of the (1-3-3)rd lower opening LO133 may be equal to the width WLO11 of the (1-1)st lower opening LO11. A width WUO231 of the (2-3-1)st upper opening UO231, a width WUO232 of the (2-3-2)nd upper opening UO232, and a width WUO233 of the (2-3-3)rd upper opening UO233 may be equal to the width WUO21 of the (2-1)st upper opening UO21, and a width WLO231 of the (2-3-1)st lower opening LO231, a width WLO232 of the (2-3-2)nd lower opening LO232, and a width WLO233 of the (2-3-3)rd lower opening LO233 may be equal to the width WLO21 of the (2-1)st lower opening LO21. A width WUO331 of the (3-3-1)st upper opening UO331, a width WUO332 of the (3-3-2)nd upper opening UO332, and a width WUO333 of the (3-3-3)rd upper opening UO333 may be equal to the width WUO31 of the (3-1)st upper opening UO31, and a width WLO331 of the (3-3-1)st lower opening LO331, a width WLO332 of the (3-3-2)nd lower opening LO332, and a width WLO333 of the (3-3-3)rd lower opening LO333 may be equal to the width WLO31 of the (3-1)st lower opening LO31.

As shown in FIG. 21, in a plan view, a central point UCP131 of the (1-3-1)st upper opening UO131 may be disposed apart in a direction to the first non-folded area NFA1 by a (1-3-1)st separation distance S131 from a central point LCP131 of the (1-3-1)st lower opening LO131. Similarly, in a plan view, the central point UCP231 of the (2-3-1)st upper opening UO231 may be disposed apart in a direction to the first non-folded area NFA1 by a (2-3-1)st separation distance S231 from a central point LCP231 of the (2-3-1)st lower opening LO231. In a plan view, a central point UCP331 of the (3-3-1)st upper opening UO331 may be disposed apart in a direction to the first non-folded area NFA1 by a (3-3-1)st separation distance S331 from a central point LCP331 of the (3-3-1)st lower opening LO331.

Accordingly, in a plan view, a distance L1311 between a left edge point of the (1-3-1)st lower opening LO131 and a left edge point of the (1-3-1)st upper opening UO131 meeting a virtual reference line VL131 may be greater than a distance L1321 between a right edge point of the (1-3-1)st lower opening LO131 and a right edge point of the (1-3-1)st upper opening UO131 meeting the virtual reference line VL131. The virtual reference line VL131 may be a virtual straight line passing through the central point LCP131 of the (1-3-1)st lower opening LO131 and the central point UCP131 of the (1-3-1)st upper opening UO131 in a plan view, and extending in the first direction (e.g., the x direction or the −x direction).

Similarly, in a plan view, a distance L2311 between a left edge point of the (2-3-1)st lower opening LO231 and a left edge point of the (2-3-1)st upper opening UO231 meeting a virtual reference line VL231 may be greater than a distance L2321 between a right edge point of the (2-3-1)st lower opening LO231 and a right edge point of the (2-3-1)st upper opening UO231 meeting the virtual reference line VL231. The virtual reference line VL231 may be a virtual straight line passing through the central point LCP231 of the (2-3-1)st lower opening LO231 and the central point UCP231 of the (2-3-1)st upper opening UO231 in a plan view, and extending in the first direction (e.g., the x direction or the −x direction). In a plan view, a distance L3311 between a left edge point of the (3-3-1)st lower opening LO331 and a left edge point of the (3-3-1)st upper opening UO331 meeting the virtual reference line VL331 may be greater than a distance L3321 between a right edge point of the (3-3-1)st lower opening LO331 and a right edge point of the (3-3-1)st upper opening UO331 meeting the virtual reference line VL331.

As shown in FIG. 22, in a plan view, a central point UCP132 of the (1-3-2)nd upper opening UO132 may be disposed apart in a direction to the first non-folded area NFA1 by a (1-3-2)nd separation distance S132 from a central point LCP132 of the (1-3-2)nd lower opening LO132. Similarly, in a plan view, a central point UCP232 of the (2-3-2)nd upper opening UO232 may be disposed apart in a direction to the first non-folded area NFA1 by a (2-3-2)nd separation distance S232 from a central point LCP232 of the (2-3-2)nd lower opening LO232. In a plan view, a central point UCP332 of the (3-3-2)nd upper opening UO332 may be disposed apart in a direction to the first non-folded area NFA1 by a (3-3-2)nd separation distance S332 from a central point LCP332 of the (3-3-2)nd lower opening LO332.

Accordingly, in a plan view, a distance L1312 between a left edge point of the (1-3-2)nd lower opening LO132 and a left edge point of the (1-3-2)nd upper opening UO132 meeting a virtual reference line VL132 may be greater than a distance L1322 between a right edge point of the (1-3-2)nd lower opening LO132 and a right edge point of the (1-3-2)nd upper opening UO132 meeting the virtual reference line VL132. The virtual reference line VL132 may be a virtual straight line passing through the central point LCP132 of the (1-3-2)nd lower opening LO132 and the central point UCP132 of the (1-3-2)nd upper opening UO132 in a plan view, and extending in the first direction (e.g., the x direction or the −x direction).

Similarly, in a plan view, a distance L2312 between a left edge point of the (2-3-2)nd lower opening LO232 and a left edge point of the (2-3-2)nd upper opening UO232 meeting a virtual reference line VL232 may be greater than a distance L2322 between a right edge point of the (2-3-2)nd lower opening LO232 and a right edge point of the (2-3-2)nd upper opening UO232 meeting the virtual reference line VL232. The virtual reference line VL232 may be a virtual straight line passing through the central point LCP232 of the (2-3-2)nd lower opening LO232 and the central point UCP232 of the (2-3-2)nd upper opening UO232 in a plan view, and extending in the first direction (e.g., the x direction or the −x direction). In a plan view, a distance L3312 between a left edge point of the (3-3-2)nd lower opening LO332 and a left edge point of the (3-3-2)nd upper opening UO332 meeting a virtual reference line VL332 may be greater than a distance L3322 between a right edge point of the (3-3-2)nd lower opening LO332 and a right edge point of the (3-3-2)nd upper opening UO332 meeting the virtual reference line VL332.

As shown in FIG. 23, in a plan view, a central point UCP133 of the (1-3-3)rd upper opening UO133 may be disposed apart in a direction to the first non-folded area NFA1 by a (1-3-3)rd separation distance S133 from a central point LCP133 of the (1-3-3)rd lower opening LO133. Similarly, in a plan view, a central point UCP233 of the (2-3-3)rd upper opening UO233 may be disposed apart in a direction to the first non-folded area NFA1 by a (2-3-3)rd separation distance S233 from a central point LCP233 of the (2-3-3)rd lower opening LO233. In a plan view, the central point UCP333 of the (3-3-3)rd upper opening UO333 may be disposed apart in a direction to the first non-folded area NFA1 by a (3-3-3)rd separation distance S333 from the central point LCP333 of the (3-3-3)rd lower opening LO333.

Accordingly, in a plan view, a distance L1313 between a left edge point of the (1-3-3)rd lower opening LO133 and a left edge point of the (1-3-3)rd upper opening UO133 meeting a virtual reference line VL133 may be greater than a distance L1323 between a right edge point of the (1-3-3)rd lower opening LO133 and a right edge point of the (1-3-3)rd upper opening UO133 meeting the virtual reference line VL133. The virtual reference line VL133 may be a virtual straight line passing through the central point LCP133 of the (1-3-3)rd lower opening LO133 and the central point UCP133 of the (1-3-3)rd upper opening UO133 in a plan view, and extending in the first direction (e.g., the x direction or the −x direction).

Similarly, in a plan view, a distance L2313 between a left edge point of the (2-3-3)rd lower opening LO233 and a left edge point of the (2-3-3)rd upper opening UO233 meeting a virtual reference line VL233 may be greater than a distance L2323 between a right edge point of the (2-3-3)rd lower opening LO233 and a right edge point of the (2-3-3)rd upper opening UO233 meeting the virtual reference line VL233. The virtual reference line VL233 may be a virtual straight line passing through the central point LCP233 of the (2-3-3)rd lower opening LO233 and the central point UCP233 of the (2-3-3)rd upper opening UO233 in a plan view, and extending in the first direction (e.g., the x direction or the −x direction). In a plan view, a distance L3313 between a left edge point of the (3-3-3)rd lower opening LO333 and a left edge point of the (3-3-3)rd upper opening UO333 meeting a virtual reference line VL333 may be greater than a distance L3323 between a right edge point of the (3-3-3)rd lower opening LO333 and a right edge point of the (3-3-3)rd upper opening UO333 meeting the virtual reference line VL333.

In an embodiment, the (1-3-3)rd separation distance S133 may be greater than each of the (1-3-1)st separation distance S131 and the (1-3-2)nd separation distance S132. Similarly, the (2-3-3)rd separation distance S233 may be greater than each of the (2-3-1)st separation distance S231 and the (2-3-2)nd separation distance S232. The (3-3-3)rd separation distance S333 may be greater than each of the (3-3-1)st separation distance S331 and the (3-3-2)nd separation distance S332. In other words, the distance L1313 may be greater than each of the distance L1311 and the distance L1312. Similarly, the distance L2313 may be greater than each of the distance L2311 and the distance L2312. The distance L3313 may be greater than each of the distance L3311 and the distance L3312.

As described above, the upper surface of the (1-1)st foldable area FA11 and the upper surface of the (1-2)nd foldable area FA12 may be less inclined than the upper surface of the (1-3)rd foldable area FA13 with respect to a plane (e.g., an xy-plane) parallel to the upper surface of the first non-folded area NFA1. That is, in the case of the (1-3-3)rd pixel P133, the (2-3-3)rd pixel P233, and the (3-3-3)rd pixel P333 arranged in the (1-3)rd foldable area FA13 in which a degree of transformation is large, the upper opening UO and the lower opening LO may be arranged such that a separation distance between the upper opening UO and the lower opening LO is large. In the case of the (1-3-1)st pixel P131, the (2-3-1)st pixel P231, the (3-3-1)st pixel P331, the (1-3-1)st pixel P131, the (2-3-2)nd pixel P232, and the (3-3-2)nd pixel P332 arranged in the (1-1)st foldable area FA11 or the (1-2)nd foldable area FA12 in which a degree of transformation is small, the upper opening UO and the lower opening LO may be arranged such that a separation distance between the upper opening UO and the lower opening LO is small. Accordingly, a difference in brightness between the first non-folded area NFA1 and the first foldable area FA1 may be reduced by appropriately adjusting the position of the light-blocking layer 610 configured to block light emitted to the outside of the display apparatus 1, and the light is generated from the emission layer in the first foldable area FA1. In other words, a difference in light characteristics between the non-folded area and the foldable area may be reduced. Accordingly, the display quality of the display apparatus 1 may be improved.

Figure 24:
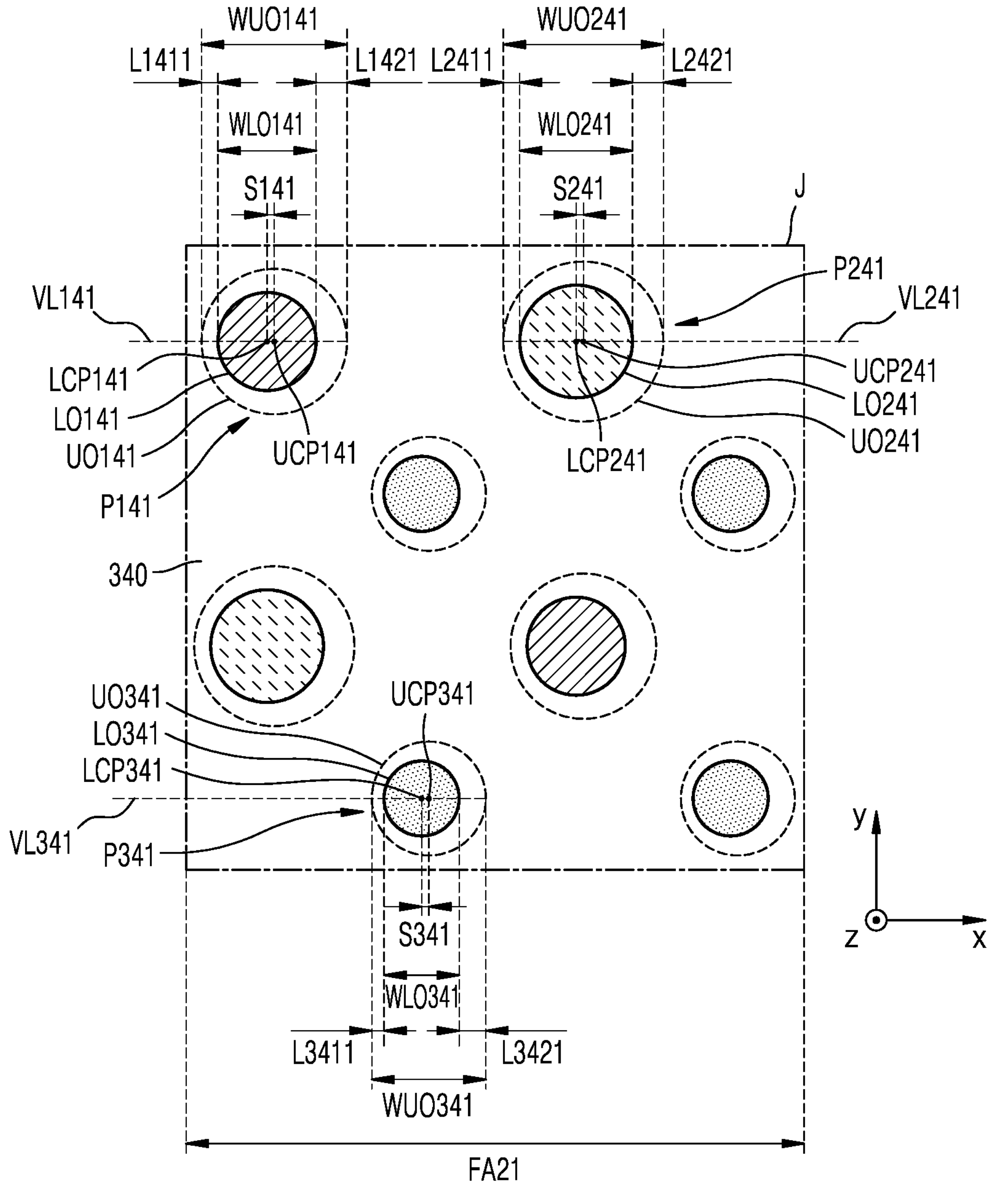
FIGS. 24 to 26 are views for explaining a relative position relationship between an upper opening and a lower opening.
Figure 25:
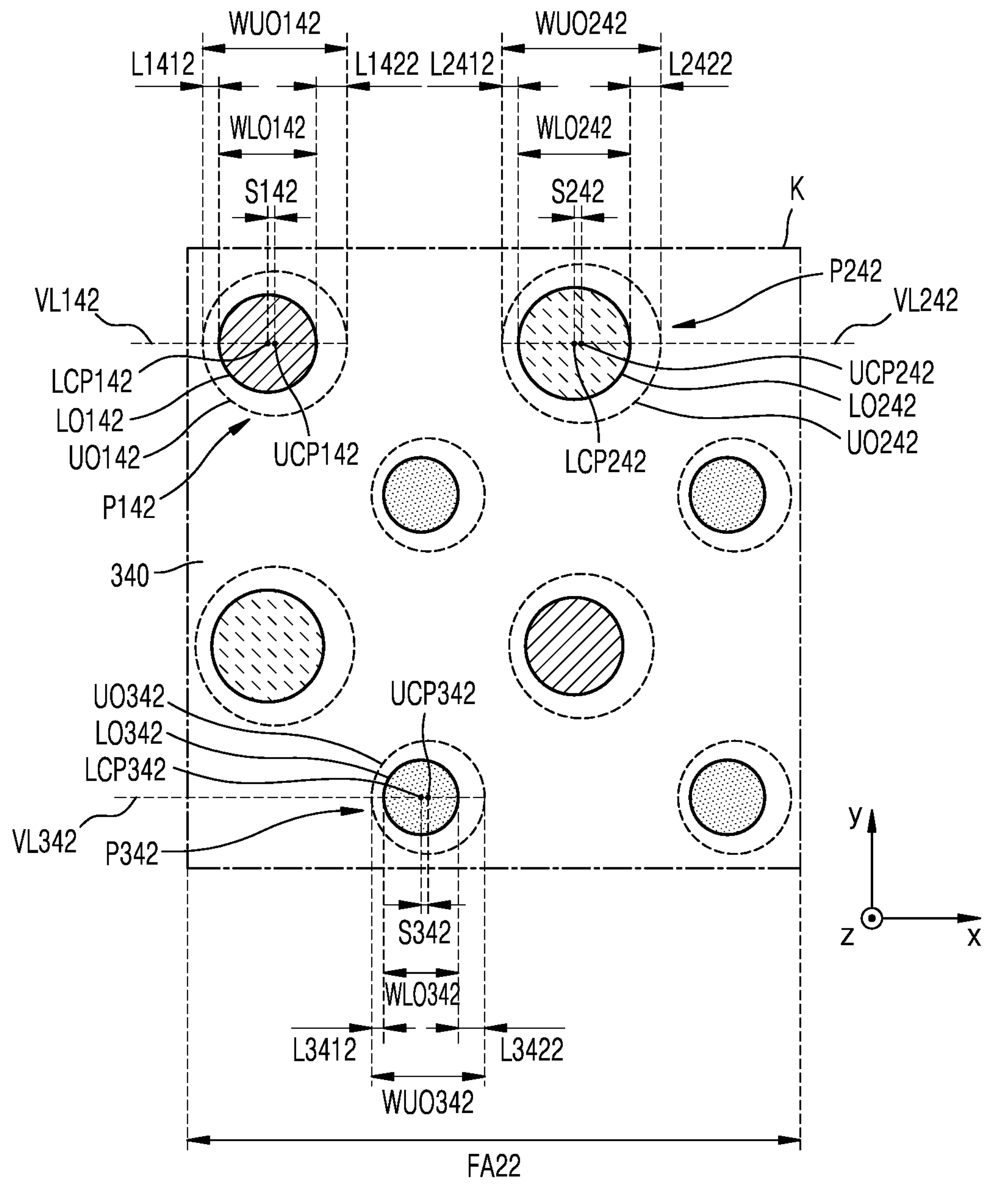
Figure 26:
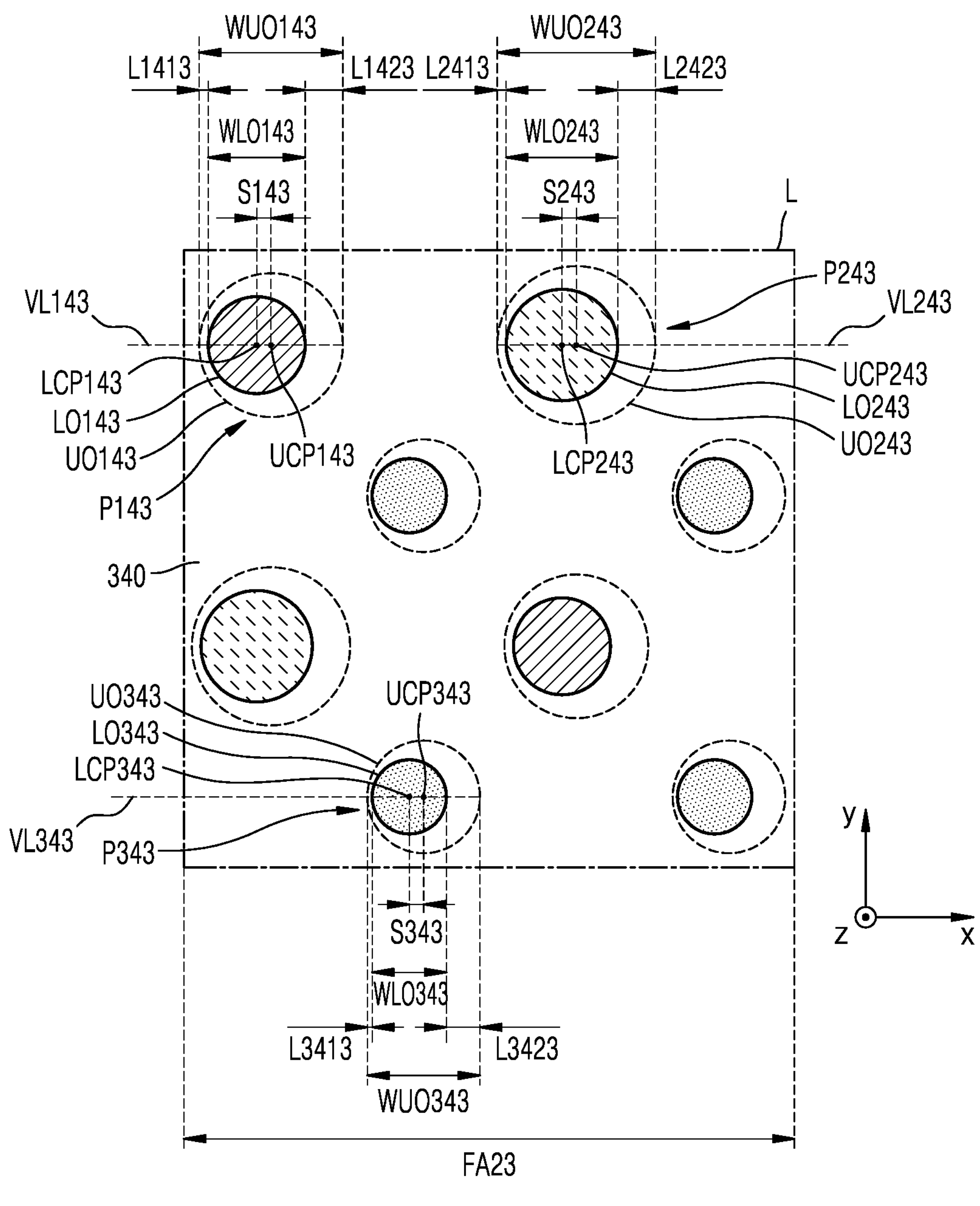

FIGS. 24 to 26 are views for explaining a relative position relationship between the upper opening UO and the lower opening LO. Specifically, FIG. 24 is a schematic enlarged plan view of a region J of FIG. 19, FIG. 25 is a schematic enlarged plan view of a region K of FIG. 19, and FIG. 26 is a schematic enlarged plan view of a region L of FIG. 19. Although FIGS. 24 to 26 show a plan view of the pixel-defining layer 340, the upper opening UO is shown together, for convenience of description.

As described above with reference to FIG. 12, the plurality of (1-4)th pixels P14, the plurality of (2-4)th pixels P24, and the plurality of (3-4)th pixels P34 are arranged in the second foldable area FA2. Hereinafter, for convenience of description, the (1-4)th pixel P14 disposed in the (2-1)st foldable area FA21 is also referred to as a (1-4-1)st pixel P141, the (2-4)th pixel P24 disposed in the (2-1)st foldable area FA21 is also referred to as a (2-4-1)st pixel P241, and the (3-4)th pixel P34 disposed in the (2-1)st foldable area FA21 is also referred to as a (3-4-1)st pixel P341. The (1-4)th lower opening LO14 corresponding to the (1-4)th pixel P141 is also referred to as a (1-4)th lower opening LO141, and the (1-4)th upper opening UO14 overlapping the (1-4)th lower opening LO141 is also referred to as a (1-4)th upper opening UO141.

The (2-4)th lower opening LO24 corresponding to the (2-4-1)st pixel P241 is also referred to as a (2-4-1)st lower opening LO241, and the (2-4)th upper opening UO24 overlapping the (2-4-1)st lower opening LO241 is also referred to as a (2-4-1)st upper opening UO241. The (3-4)th lower opening LO34 corresponding to the (3-4-1)st pixel P341 is also referred to as a (3-4-1)st lower opening LO341, and the (3-4)th upper opening UO34 overlapping the (3-4-1)st lower opening LO341 is also referred to as a (3-4-1)st upper opening UO341. In other words, the (1-4)th lower opening LO141, the (2-4-1)st lower opening LO241, and the (3-4-1)st lower opening LO341 may be arranged in the (2-1)st foldable area FA21. That is, the (1-4)th lower opening LO141, the (2-4-1)st lower opening LO241, and the (3-4-1)st lower opening LO341 may overlap the (2-1)st foldable area FA21.

Similarly, the (1-4)th pixel P14 disposed in the (2-2)nd foldable area FA22 is also referred to as a (1-4-2)nd pixel P142, the (2-4)th pixel P24 disposed in the (2-2)nd foldable area FA22 is also referred to as a (2-4-2)nd pixel P242, and the (3-4)th pixel P34 disposed in the (2-2)nd foldable area FA22 is also referred to as a (3-4-2)nd pixel P342. The (1-4)th lower opening LO14 corresponding to the (1-4-2)nd pixel P142 is also referred to as a (1-4-2)nd lower opening LO142, and the (1-4)th upper opening UO14 overlapping the (1-4-2)nd lower opening LO142 is also referred to as a (1-4-2)nd upper opening UO142. The (2-4)th lower opening LO24 corresponding to the (2-4-2)nd pixel P242 is also referred to as a (2-4-2)nd lower opening LO242, and the (2-4)th upper opening UO24 overlapping the (2-4-2)nd lower opening LO242 is also referred to as a (2-4-2)nd upper opening UO242. The (3-4)th lower opening LO34 corresponding to the (3-4-2)st pixel P342 is also referred to as a (3-4-2)nd lower opening LO342, and the (3-4)th upper opening UO34 overlapping the (3-4-2)nd lower opening LO342 is also referred to as a (3-4-2)nd upper opening UO342. The (1-4-2)nd lower opening LO142, the (2-4-2)nd lower opening LO242, and the (3-4-2)nd lower opening LO342 may overlap the (2-2)nd foldable area FA22.

Similarly, the (1-4)th pixel P14 disposed in the (2-3)rd foldable area FA23 is also referred to as a (1-4-3)rd pixel P143, the (2-4)th pixel P24 disposed in the (2-3)rd foldable area FA23 is also referred to as a (2-4-3)rd pixel P243, and the (3-4)th pixel P34 disposed in the (2-3)rd foldable area FA23 is also referred to as a (3-4-3)rd pixel P343. The (1-4)th lower opening LO14 corresponding to the (1-4-3)rd pixel P143 is also referred to as a (1-4-3)rd lower opening LO143, and the (1-4)th upper opening UO14 overlapping the (1-4-3)rd lower opening LO143 is also referred to as a (1-4-3)rd upper opening UO143. The (2-4)th lower opening LO24 corresponding to the (2-4-3)rd pixel P243 is also referred to as a (2-4-3)rd lower opening LO243, and the (2-4)th upper opening UO24 overlapping the (2-4-3)rd lower opening LO243 is also referred to as a (2-4-3)rd upper opening UO243. The (3-4)th lower opening LO34 corresponding to the (3-4-3)nd pixel P343 is also referred to as a (3-4-3)rd lower opening LO343, and the (3-4)th upper opening UO34 overlapping the (3-4-3)th lower opening LO343 is also referred to as a (3-4-3)th upper opening UO343. The (1-4-3)rd lower opening LO143, the (2-4-3)rd lower opening LO243, and the (3-4-3)rd lower opening LO343 may overlap the (2-3)rd foldable area FA23.

A width WUO141 of the (1-4)th upper opening UO141, a width WUO142 of the (1-4-2)nd upper opening UO142, and a width WUO143 of the (1-4-3)rd upper opening UO143 may be equal to the width WUO11 of the (1-1)st upper opening UO11, and a width WLO141 of the (1-4)th lower opening LO141, a width WLO142 of the (1-4-2)nd lower opening LO142, and a width WLO143 of the (1-4-3)rd lower opening LO143 may be equal to the width WLO11 of the (1-1)st lower opening LO11. A width WUO241 of the (2-4-1)st upper opening UO241, a width WUO242 of the (2-4-2)nd upper opening UO242, and a width WUO243 of the (2-4-3)rd upper opening UO243 may be equal to the width WUO21 of the (2-1)st upper opening UO21, and a width WLO241 of the (2-4-1)st lower opening LO241, a width WLO242 of the (2-4-2)nd lower opening LO242, and a width WLO243 of the (2-4-3)rd lower opening LO243 may be equal to the width WLO21 of the (2-1)st lower opening LO21. A width WUO341 of the (3-4-1)st upper opening UO341, a width WUO342 of the (3-4-2)nd upper opening UO342, and a width WUO343 of the (3-4-3)rd upper opening UO343 may be equal to the width WUO31 of the (3-1)st upper opening UO31, and a width WLO341 of the (3-4-1)st lower opening LO341, a width WLO342 of the (3-4-2)nd lower opening LO342, and a width WLO343 of the (3-4-3)rd lower opening LO343 may be equal to the width WLO31 of the (3-1)st lower opening LO31.

As shown in FIG. 24, in a plan view, a central point UCP141 of the (1-4-1)st upper opening UO141 may be disposed apart in a direction to the second non-folded area NFA2 by a (1-4)th separation distance S141 from a central point LCP141 of the (1-4-1)st lower opening LO141. Similarly, in a plan view, the central point UCP241 of the (2-4-1)st upper opening UO241 may be disposed apart in a direction to the second non-folded area NFA2 by a (2-4-1)st separation distance S241 from a central point LCP241 of the (2-4-1)st lower opening LO241. In a plan view, the central point UCP341 of the (3-4-1)st upper opening UO341 may be disposed apart in a direction to the second non-folded area NFA2 by a (3-4-1)st separation distance S341 from the central point LCP341 of the (3-4-1)st lower opening LO341.

Accordingly, in a plan view, a distance L1421 between a right edge point of the (1-4)th lower opening LO141 and a right edge point of the (1-4)th upper opening UO141 meeting a virtual reference line VL141 may be greater than a distance L1411 between a left edge point of the (1-4)th lower opening LO141 and a left edge point of the (1-4)th upper opening UO141 meeting the virtual reference line VL141. The virtual reference line VL141 may be a virtual straight line passing through the central point LCP141 of the (1-4)th lower opening LO141 and the central point UCP141 of the (1-4-1)st upper opening UO141 in a plan view, and extending in the first direction (e.g., the x direction or the −x direction).

Similarly, in a plan view, a distance L2421 between a right edge point of the (2-4-1)st lower opening LO241 and a right edge point of the (2-4-1)st upper opening UO241 meeting a virtual reference line VL241 may be greater than a distance L2411 between a left edge point of the (2-4-1)st lower opening LO241 and a left edge point of the (2-4-1)st upper opening UO241 meeting the virtual reference line VL241. The virtual reference line VL241 may be a virtual straight line passing through the central point LCP241 of the (2-4-1)st lower opening LO241 and the central point UCP241 of the (2-4-1)st upper opening UO241 in a plan view, and extending in the first direction (e.g., the x direction or the −x direction). In a plan view, a distance L3421 between a right edge point of the (3-4-1)st lower opening LO341 and a right edge point of the (3-4-1)st upper opening UO341 meeting a virtual reference line VL341 may be greater than a distance L3411 between a left edge point of the (3-4-1)st lower opening LO341 and a left edge point of the (3-4-1)st upper opening UO341 meeting the virtual reference line VL341.

As shown in FIG. 25, in a plan view, a central point UCP142 of the (1-4-2)nd upper opening UO142 may be disposed apart in a direction to the second non-folded area NFA2 by a (1-4-2)nd separation distance S142 from a central point LCP142 of the (1-4-2)nd lower opening LO142. Similarly, in a plan view, the central point UCP242 of the (2-4-2)nd upper opening UO242 may be disposed apart in a direction to the second non-folded area NFA2 by a (2-4-2)nd separation distance S242 from a central point LCP242 of the (2-4-2)nd lower opening LO242. In a plan view, the central point UCP342 of the (3-4-2)nd upper opening UO342 may be disposed apart in a direction to the second non-folded area NFA2 by a (3-4-2)nd separation distance S342 from the central point LCP342 of the (3-4-2)nd lower opening LO342.

Accordingly, in a plan view, a distance L1422 between a right edge point of the (1-4-2)nd lower opening LO142 and a right edge point of the (1-4-2)nd upper opening UO142 meeting a virtual reference line VL142 may be greater than a distance L1412 between a left edge point of the (1-4-2)nd lower opening LO142 and a left edge point of the (1-4-2)nd upper opening UO142 meeting the virtual reference line VL142. The virtual reference line VL142 may be a virtual straight line passing through the central point LCP142 of the (1-4-2)nd lower opening LO142 and the central point UCP142 of the (1-4-2)nd upper opening UO142 in a plan view, and extending in the first direction (e.g., the x direction or the −x direction).

Similarly, in a plan view, a distance L2422 between a right edge point of the (2-4-2)nd lower opening LO242 and a right edge point of the (2-4-2)nd upper opening UO242 meeting a virtual reference line VL242 may be greater than a distance L2412 between a left edge point of the (2-4-2)nd lower opening LO242 and a left edge point of the (2-4-2)nd upper opening UO242 meeting the virtual reference line VL242. The virtual reference line VL242 may be a virtual straight line passing through the central point LCP242 of the (2-4-2)nd lower opening LO242 and the central point UCP242 of the (2-4-2)nd upper opening UO242 in a plan view, and extending in the first direction (e.g., the x direction or the −x direction). In a plan view, a distance L3422 between a right edge point of the (3-4-2)nd lower opening LO342 and a right edge point of the (3-4-2)nd upper opening UO342 meeting a virtual reference line VL342 may be greater than a distance L3412 between a left edge point of the (3-4-2)nd lower opening LO342 and a left edge point of the (3-4-2)nd upper opening UO342 meeting the virtual reference line VL342.

As shown in FIG. 26, in a plan view, a central point UCP143 of the (1-4-3)rd upper opening UO143 may be disposed apart in a direction to the second non-folded area NFA2 by a (1-4-3)rd separation distance S143 from a central point LCP143 of the (1-4-3)rd lower opening LO143. Similarly, in a plan view, the central point UCP243 of the (2-4-3)rd upper opening UO243 may be disposed apart in a direction to the second non-folded area NFA2 by a (2-4-3)rd separation distance S243 from a central point LCP243 of the (2-4-3)rd lower opening LO243. In a plan view, the central point UCP343 of the (3-4-3)rd upper opening UO343 may be disposed apart in a direction to the second non-folded area NFA2 by a (3-4-3)rd separation distance S343 from the central point LCP343 of the (3-4-3)rd lower opening LO343.

Accordingly, in a plan view, a distance L1423 between a right edge point of the (1-4-3)rd lower opening LO143 and a right edge point of the (1-4-3)rd upper opening UO143 meeting a virtual reference line VL143 may be greater than a distance L1413 between a left edge point of the (1-4-3)rd lower opening LO143 and a left edge point of the (1-4-3)rd upper opening UO143 meeting the virtual reference line VL143. The virtual reference line VL143 may be a virtual straight line passing through the central point LCP143 of the (1-4-3)rd lower opening LO143 and the central point UCP143 of the (1-4-3)rd upper opening UO143 in a plan view, and extending in the first direction (e.g., the x direction or the −x direction).

Similarly, in a plan view, a distance L2423 between a right edge point of the (2-4-3)rd lower opening LO243 and a right edge point of the (2-4-3)rd upper opening UO243 meeting a virtual reference line VL243 may be greater than a distance L2413 between a left edge point of the (2-4-3)rd lower opening LO243 and a left edge point of the (2-4-3)rd upper opening UO243 meeting the virtual reference line VL243. The virtual reference line VL243 may be a virtual straight line passing through the central point LCP243 of the (2-4-3)rd lower opening LO243 and the central point UCP243 of the (2-4-3)rd upper opening UO243 in a plan view, and extending in the first direction (e.g., the x direction or the −x direction). In a plan view, a distance L3423 between a right edge point of the (3-4-3)rd lower opening LO343 and a right edge point of the (3-4-3)rd upper opening UO343 meeting a virtual reference line VL343 may be greater than a distance L3413 between a left edge point of the (3-4-3)rd lower opening LO343 and a left edge point of the (3-4-3)rd upper opening UO343 meeting the virtual reference line VL343.

In an embodiment, the (1-4-3)rd separation distance S143 may be greater than each of the (1-4)th separation distance S141 and the (1-4-2)nd separation distance S142. Similarly, the (2-4-3)rd separation distance S243 may be greater than each of the (2-4-1)st separation distance S241 and the (2-4-2)nd separation distance S242. The (3-4-3)rd separation distance S343 may be greater than each of the (3-4-1)st separation distance S341 and the (3-4-2)nd separation distance S342. In other words, the distance L1423 may be greater than each of the distance L1421 and the distance L1422. Similarly, the distance L2423 may be greater than each of the distance L2421 and the distance L2422. The distance L3423 may be greater than each of the distance L3421 and the distance L3422.

As described above, the upper surface of the (2-1)st foldable area FA21 and the upper surface of the (2-2)nd foldable area FA22 may be less inclined than the upper surface of the (2-3)rd foldable area FA23 with respect to a plane (e.g., an xy-plane) parallel to the upper surface of the second non-folded area NFA2. That is, in the case of the (1-4-3)rd pixel P143, the (2-4-3)rd pixel P243, and the (3-4-3)rd pixel P343 arranged in the (2-3)rd foldable area FA23 in which a degree of transformation is large, the upper opening UO and the lower opening LO may be arranged such that a separation distance between the upper opening UO and the lower opening LO is large. In the case of the (1-4-1)st pixel P141, the (2-4-1)st pixel P241, the (3-4-1)st pixel P341, the (1-4-2)nd pixel P142, the (2-4-2)nd pixel P242, and the (3-4-2)nd pixel P342 arranged in the (1-1)st foldable area FA21 or the (2-2)nd foldable area FA22 in which a degree of transformation is small, the upper opening UO and the lower opening LO may be arranged such that a separation distance between the upper opening UO and the lower opening LO is small. Accordingly, a difference in brightness between the first non-folded area NFA1 and the second foldable area FA2 may be reduced by appropriately adjusting the position of the light-blocking layer 610 configured to block light emitted to the outside of the display apparatus 1, and the light is generated from the emission layer in the second foldable area FA2. In other words, a difference in light characteristics between the non-folded area and the foldable area may be reduced. Accordingly, the display quality of the display apparatus 1 may be improved.

Figure 27:
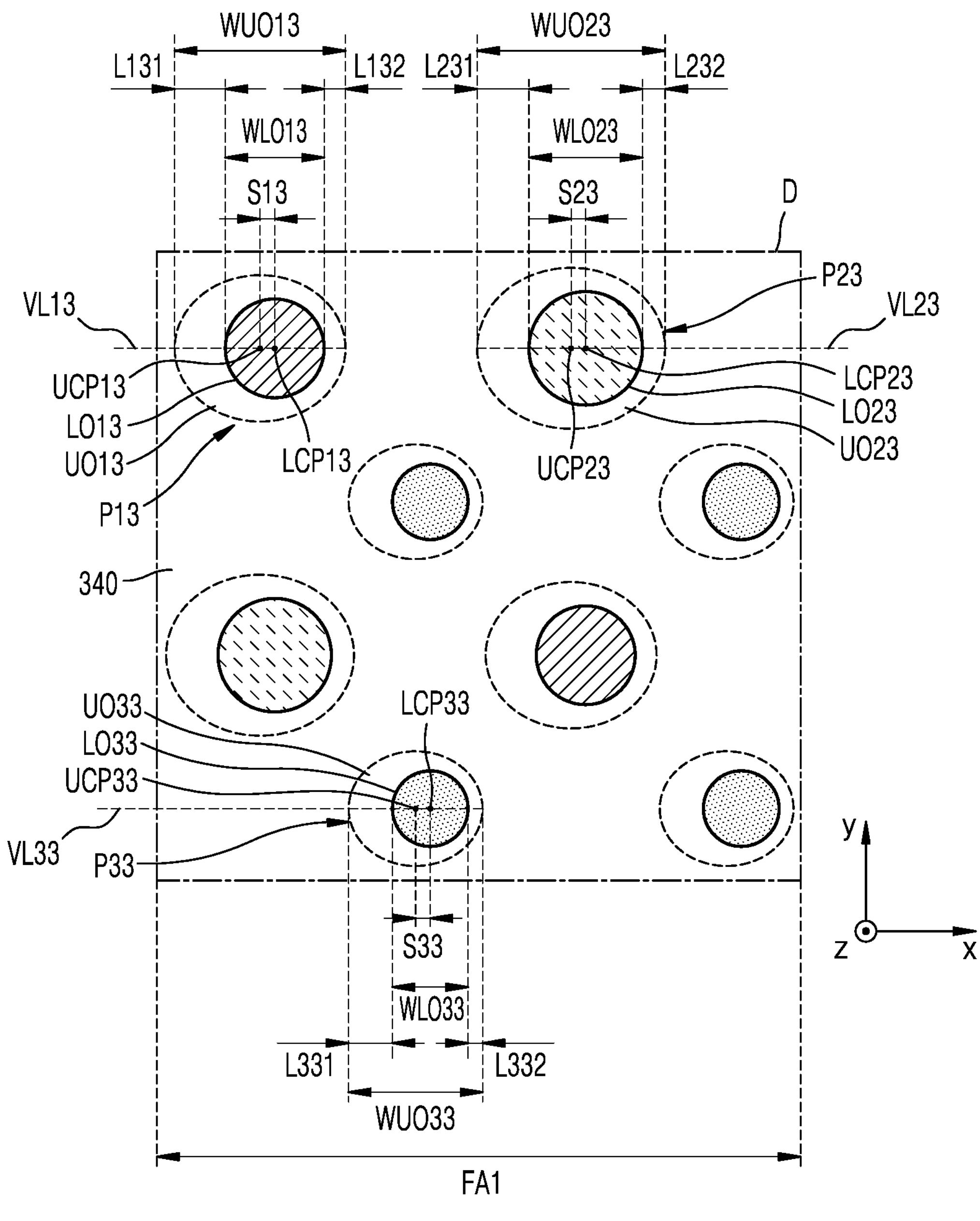
FIGS. 27 and 28 are schematic plan views of another embodiment of a portion of the display apparatus.
Figure 28:
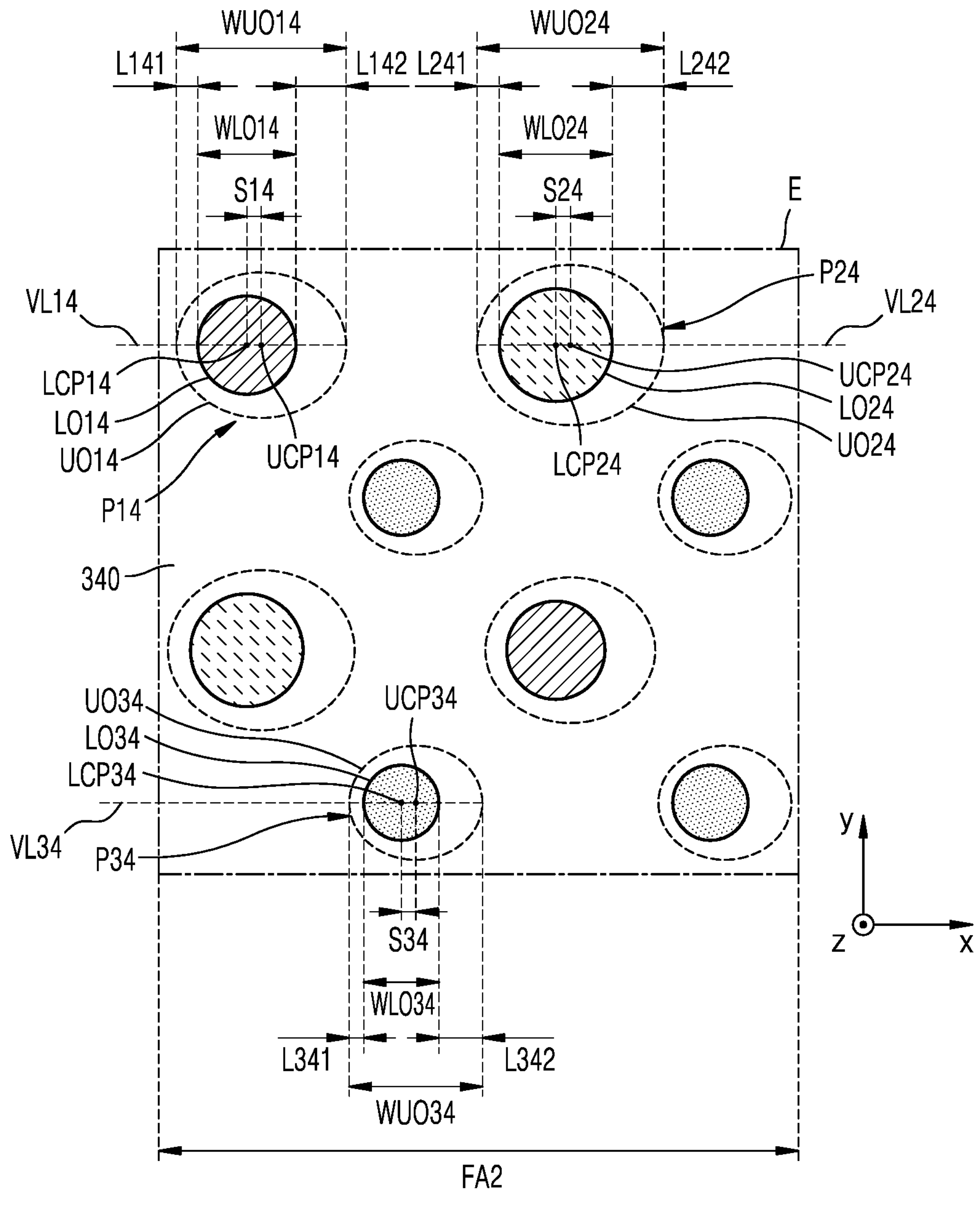

FIGS. 27 and 28 are schematic plan views of an embodiment of a portion of the display apparatus 1. Specifically, FIG. 27 is a schematic plan view of another embodiment of the first foldable area FA1 of the display apparatus 1 in another embodiment, and FIG. 28 is a schematic plan view of another embodiment of the second foldable area FA2 of the display apparatus 1. Because the display apparatus 1 in an embodiment is similar to the display apparatus 1 described above with reference to FIGS. 1 to 26, differences from the display apparatus 1 described with reference to FIGS. 1 to 26 are mainly described below.

As shown in FIG. 27, the (1-3)rd pixel P13, the (2-3)rd pixel P23, and the (3-3)rd pixel P33 may be arranged in the first foldable area FA1. In the case of the (1-3)rd pixel P13 of the display apparatus 1 described above with reference to FIG. 11, the width WLO13 of the (1-3)rd lower opening LO13 may be equal to the width WLO11 of the (1-1)st lower opening LO11, the width WLO23 of the (2-3)rd lower opening LO23 may be equal to the width WLO21 of the (2-1)st lower opening LO21, and the width WLO33 of the (3-3)rd lower opening LO33 may be equal to the width WLO31 of the (3-1)st lower opening LO31. Even in the case of the display apparatus 1 in an embodiment, a width WLO13 of the (1-3)rd lower opening LO13 may be equal to a width WLO11 of the (1-1)st lower opening LO11, a width WLO23 of the (2-3)rd lower opening LO23 may be equal to a width WLO21 of the (2-1)st lower opening LO21, and a width WLO33 of the (3-3)rd lower opening LO33 may be equal to a width WLO31 of the (3-1)st lower opening LO31. However, in the case of the display apparatus 1 in an embodiment, a width WUO13 of the (1-3)rd upper opening UO13 may be greater than a width WUO11 of the (1-1)st upper opening UO11, a width WUO23 of the (2-3)rd upper opening UO23 may be greater than a width WUO21 of the (2-1)st upper opening UO21, and a width WUO33 of the (3-3)rd upper opening UO33 may be greater than a width WUO11 of the (1-1)st upper opening UO11.

However, in the display apparatus 1 in an embodiment, the distance L131 may be greater than the distance L111, and the distance L132 may be equal or similar to the distance L112. Similarly, the distance L231 may be greater than the distance L211, and the distance L232 may be equal or similar to the distance L212. The distance L331 may be greater than the distance L311, and the distance L332 may be equal or similar to the distance L312. Accordingly, in a plan view, the central point UCP13 of the (1-3)rd upper opening UO13 may be arranged apart in a direction to the first non-folded area NFA1 by a (1-3)rd separation distance S13 from the central point LCP13 of the (1-3)rd lower opening LO13. Similarly, in a plan view, the central point UCP23 of the (2-3)rd upper opening UO23 may be arranged apart in a direction to the first non-folded area NFA1 by a (2-3)rd separation distance S23 from the central point LCP23 of the (2-3)rd lower opening LO23. In a plan view, the central point UCP33 of the (3-3)rd upper opening UO33 may be arranged apart in a direction to the first non-folded area NFA1 by a (3-3)rd separation distance S33 from the central point LCP33 of the (3-3)rd lower opening LO33.

That is, even in the case of the display apparatus 1 in an embodiment, like the display apparatus 1 described above with reference to FIGS. 1 to 26, the (1-3)rd upper opening UO13 may overlap the (1-3)rd lower opening LO13 and be shifted to one side facing the first non-folded area NFA1 of the (1-3)rd lower opening LO13 in the first direction (e.g., the x direction or the −x direction). Similarly, the (2-3)rd upper opening UO23 may overlap the (2-3)rd lower opening LO23 and be shifted to one side facing the first non-folded area NFA1 of the (2-3)rd lower opening LO23 in the first direction (e.g., the x direction or the −x direction). The (3-3)rd upper opening UO33 may overlap the (3-3)rd lower opening LO33 and be shifted to one side facing the first non-folded area NFA1 of the (3-3)rd lower opening LO33 in the first direction (e.g., the x direction or the −x direction). Accordingly, a difference in brightness between the first non-folded area NFA1 and the first foldable area FA1 may be reduced. In other words, a difference in light characteristics between the non-folded area and the foldable area may be reduced. Accordingly, the display quality of the display apparatus 1 may be improved.

As shown in FIG. 28, the (1-4)th pixel P14, the (2-4)th pixel P24, and the (3-4)th pixel P34 may be arranged in the second foldable area FA2. In the case of the (1-4)th pixel P14 of the display apparatus 1 described above with reference to FIG. 12, the width WLO14 of the (1-4)th lower opening LO14 may be equal to the width WLO11 of the (1-1)st lower opening LO11, the width WLO24 of the (2-4)th lower opening LO24 may be equal to the width WLO21 of the (2-1)st lower opening LO21, and the width WLO34 of the (3-4)th lower opening LO34 may be equal to the width WLO31 of the (3-1)st lower opening LO31. Even in the case of the display apparatus 1 in an embodiment, a width WLO14 of the (1-4)th lower opening LO14 may be equal to a width WLO11 of the (1-1)st lower opening LO11, a width WLO24 of the (2-4)th lower opening LO24 may be equal to a width WLO21 of the (2-1)st lower opening LO21, and a width WLO34 of the (3-4)th lower opening LO34 may be equal to a width WLO31 of the (3-1)st lower opening LO31. However, in the case of the display apparatus 1 in an embodiment, a width WUO14 of the (1-4)th upper opening UO14 may be greater than a width WUO11 of the (1-1)st upper opening UO11, a width WUO24 of the (2-4)th upper opening UO24 may be greater than a width WUO21 of the (2-1)st upper opening UO21, and a width WUO34 of the (3-4)th upper opening UO34 may be greater than a width WUO11 of the (1-1)st upper opening UO11.

However, in the display apparatus 1 in an embodiment, the distance L142 may be greater than the distance L112, and the distance L141 may be equal or similar to the distance L111. Similarly, the distance L242 may be greater than the distance L212, and the distance L241 may be equal or similar to the distance L211. The distance L342 may be greater than the distance L312, and the distance L341 may be equal or similar to the distance L311. Accordingly, in a plan view, the central point UCP14 of the (1-4)th upper opening UO14 may be disposed apart in a direction to the second non-folded area NFA2 by a (1-4)th separation distance S14 from the central point LCP14 of the (1-4)th lower opening LO14. Similarly, in a plan view, the central point UCP24 of the (2-4)th upper opening UO24 may be disposed apart in a direction to the second non-folded area NFA2 by a (2-4)th separation distance S24 from the central point LCP24 of the (2-4)th lower opening LO24. In a plan view, the central point UCP34 of the (3-4)th upper opening UO34 may be disposed apart in a direction to the second non-folded area NFA2 by a (3-4)th separation distance S34 from the central point LCP34 of the (3-4)th lower opening LO34.

That is, even in the case of the display apparatus 1 in an embodiment, like the display apparatus 1 described above with reference to FIGS. 1 to 26, the (1-4)th upper opening UO14 may overlap the (1-4)th lower opening LO14 and be shifted to one side facing the second non-folded area NFA2 of the (1-4)th lower opening LO14 in the first direction (e.g., the x direction or the −x direction). Similarly, the (2-4)th upper opening UO24 may overlap the (2-4)th lower opening LO24 and be shifted to one side facing the second non-folded area NFA2 of the (2-4)th lower opening LO24 in the first direction (e.g., the x direction or the −x direction). The (3-4)th upper opening UO34 may overlap the (3-4)th lower opening LO34 and be shifted to one side facing the second non-folded area NFA2 of the (3-4)th lower opening LO34 in the first direction (e.g., the x direction or the −x direction). Accordingly, a difference in brightness between the first non-folded area NFA1 and the second foldable area FA2 may be reduced. In other words, a difference in light characteristics between the non-folded area and the foldable area may be reduced. Accordingly, the display quality of the display apparatus 1 may be improved.

In an embodiment, the display apparatus with an improved display quality in which a difference in light characteristics between the non-folded area and the foldable area is reduced may be implemented. However, the scope of the disclosure is not limited by this effect.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display apparatus comprising:

a substrate including:
- a first non-folded area;
- a second non-folded area disposed apart in a first direction from the first non-folded area; and
- a foldable area disposed between the first non-folded area and the second non-folded area and extending in a second direction crossing the first direction, the foldable area including:
  - a first foldable area adjacent to the first non-folded area; and
  - a second foldable area adjacent to the second non-folded area;

a pixel-defining layer disposed over the substrate, the pixel-defining layer defining:
- a (1-1)st lower opening overlapping the first non-folded area;
- a (1-2)nd lower opening overlapping the second non-folded area;
- a (1-3)rd lower opening overlapping the first foldable area; and
- a (1-4)th lower opening overlapping the second foldable area; and a light-blocking layer disposed over the pixel-defining layer, the light-blocking layer defining:
- a (1-1)st upper opening overlapping the (1-1)st lower opening;
- a (1-2)nd upper opening overlapping the (1-2)nd lower opening;
- a (1-3)rd upper opening overlapping the (1-3)rd lower opening; and
- a (1-4)th upper opening overlapping the (1-4)th lower opening, wherein a width of the (1-1)st lower opening, a width of the (1-2)nd lower opening, a width of the (1-3)rd lower opening, and a width of the (1-4)th lower opening are same, wherein a width of the (1-1)st upper opening, a width of the (1-2)nd upper opening, a width of the (1-3)rd upper opening, and a width of the (1-4)th upper opening are same, wherein the (1-3)rd upper opening is shifted to one side facing the first non-folded area of the (1-3)rd lower opening in the first direction, and wherein the (1-4)th upper opening is shifted to one side facing the second non-folded area of the (1-4)th lower opening in the first direction.

2. The display apparatus of claim 1, wherein a central point of the (1-3)rd upper opening is spaced apart in a first non-folded area direction from a central point of the (1-3)rd lower opening by a (1-3)rd separation distance in a plan view, and a central point of the (1-4)th upper opening is spaced apart in the second non-folded area direction from a central point of the (1-4)th lower opening by a (1-4)th separation distance in the plan view.

3. The display apparatus of claim 1, wherein a central point of the (1-1)st upper opening is disposed at a same position as a position of a central point of the (1-1)st lower opening in a plan view, and a central point of the (1-2)nd upper opening is disposed at a same position as a position of a central point of the (1-2)nd lower opening in the plan view.

4. The display apparatus of claim 3, wherein the (1-1)st upper opening is not shifted to one side of the (1-1)st lower opening in the first direction, and the (1-2)nd upper opening is not shifted to one side of the (1-2)nd lower opening in the first direction.

5. The display apparatus of claim 2, further comprising:

a plurality of first pixel electrodes, a plurality of second pixel electrodes, and a plurality of third pixel electrodes disposed over the substrate and apart from each other;

a plurality of first emission layers which are respectively disposed on the plurality of first pixel electrodes and emit red light;

a plurality of second emission layers which are respectively disposed on the plurality of second pixel electrodes and emit blue light;

a plurality of third emission layers which are respectively disposed on the plurality of third pixel electrodes and emit green light; and an opposite electrode overlapping the plurality of first pixel electrodes, the plurality of second pixel electrodes, and the plurality of third pixel electrodes, wherein the pixel-defining layer defines a (2-1)st lower opening and a (3-1)st lower opening overlapping the first non-folded area, a (2-2)nd lower opening and a (3-2)nd lower opening overlapping the second non-folded area, a (2-3)rd lower opening and a (3-3)rd lower opening overlapping the first foldable area, and a (2-4)th lower opening and a (3-4)th lower opening overlapping the second foldable area, each of the (1-1)st lower opening, the (1-2)nd lower opening, the (1-3)rd lower opening, and the (1-4)th lower opening exposes a central portion of each of the plurality of first pixel electrodes, each of the (2-1)st lower opening, the (2-2)nd lower opening, the (2-3)rd lower opening, and the (2-4)th lower opening exposes a central portion of each of the plurality of second pixel electrodes, and each of the (3-1)st lower opening, the (3-2)nd lower opening, the (3-3)rd lower opening, and the (3-4)th lower opening exposes a central portion of each of the plurality of third pixel electrodes.

6. The display apparatus of claim 5, wherein the light-blocking layer defines a (2-1)st upper opening overlapping the (2-1)st lower opening, a (3-1)st upper opening overlapping the (3-1)st lower opening, a (2-2)nd upper opening overlapping the (2-2)nd lower opening, a (3-2)nd upper opening overlapping the (3-2)nd lower opening, a (2-3)rd upper opening overlapping the (2-3)rd lower opening, a (3-3)rd upper opening overlapping the (3-3)rd lower opening, a (2-4)th upper opening overlapping the (2-4)th lower opening, and a (3-4)th upper opening overlapping the (3-4)th lower opening, wherein the (2-3)rd upper opening is shifted to one side facing the first non-folded area of the (2-3)rd lower opening in the first direction, wherein the (3-3)rd upper opening is shifted to one side facing the first non-folded area of the (3-3)rd lower opening in the first direction, wherein the (2-4)th upper opening is shifted to one side facing the second non-folded area of the (2-4)th lower opening in the first direction, and wherein the (3-4)th upper opening is shifted to one side facing the first non-folded area of the (3-4)th lower opening in the first direction.

7. The display apparatus of claim 6, wherein, in the plan view, a central point of the (2-3)rd upper opening is spaced apart by a (2-3)rd separation distance in the first non-folded area direction from a central point of the (2-3)rd lower opening, wherein, in the plan view, a central point of the (3-3)rd upper opening is spaced apart by a (3-3)rd separation distance in the first non-folded area direction from a central point of the (3-3)rd lower opening, wherein, in the plan view, a central point of the (2-4)th upper opening is spaced apart by a (2-4)th separation distance in a second non-folded area direction from a central point of the (2-4)th lower opening, and wherein, in the plan view, a central point of the (3-4)th upper opening is spaced apart by a (3-4)th separation distance in the second non-folded area direction from a central point of the (3-4)th lower opening.

8. The display apparatus of claim 7, wherein the (1-3)rd separation distance, the (2-3)rd separation distance, and the (3-3)rd separation distance are different from one another, and wherein the (1-4)th separation distance, the (2-4)th separation distance, and the (3-4)th separation distance are different from one another.

9. The display apparatus of claim 1, wherein the (1-3)rd lower opening is provided in plural, the (1-3)rd upper opening is provided in plural, wherein the first foldable area includes a (1-1)st foldable area adjacent to the first non-folded area, a (1-2)nd foldable area adjacent to the second foldable area, and a (1-3)rd foldable area between the (1-1)st foldable area and the (1-2)nd foldable area, wherein, in a plan view, a central point of the (1-3)rd upper opening overlapping the (1-3)rd lower opening overlapping the (1-1)st foldable area is spaced apart by a (1-3-1)st separation distance from a central point of the (1-3)rd lower opening overlapping the (1-1)st foldable area, wherein, in the plan view, a central point of the (1-3)rd upper opening overlapping the (1-3)rd lower opening overlapping the (1-2)nd foldable area is spaced apart by a (1-3-2)nd separation distance from the central point of the (1-3)rd lower opening overlapping the (1-2)nd foldable area, wherein, in the plan view, a central point of the (1-3)rd upper opening overlapping the (1-3)rd lower opening overlapping the (1-3)rd foldable area is spaced apart by a (1-3-3)rd separation distance from a central point of the (1-3)rd lower opening overlapping the (1-3)rd foldable area, and wherein, the (1-3-3)rd separation distance is greater than each of the (1-3-1)st separation distance and the (1-3-2)nd separation distance.

10. The display apparatus of claim 9, wherein the (1-4)th lower opening is provided in plural, and the (1-4)th upper opening is provided in plural, wherein the second foldable area includes a (2-1)st foldable area adjacent to the second non-folded area, a (2-2)nd foldable area adjacent to the first foldable area, and a (2-3)rd foldable area between the (2-1)st foldable area and the (2-2)nd foldable area, wherein, in the plan view, a central point of the (1-4)th upper opening overlapping the (1-4)th lower opening overlapping the (2-1)st foldable area is spaced apart by a (1-4-1)st separation distance from a central point of the (1-4)th lower opening overlapping the (2-1)st foldable area, wherein, in the plan view, a central point of the (1-4)th upper opening overlapping the (1-4)th lower opening overlapping the (2-2)nd foldable area is spaced apart by a (1-4-2)nd separation distance from the central point of the (1-4)th lower opening overlapping the (2-2)nd foldable area, wherein, in the plan view, a central point of the (1-4)th upper opening overlapping the (1-4)th lower opening overlapping the (2-3)rd foldable area is spaced apart by a (1-4-3)rd separation distance from a central point of the (1-4)th lower opening overlapping the (2-3)rd foldable area, and wherein, the (1-4-3)rd separation distance is greater than each of the (1-4-1)st separation distance and the (1-4-2)nd separation distance.

11. A display apparatus comprising:

a substrate including:

a first non-folded area;

a second non-folded area disposed apart in a first direction from the first non-folded area; and a foldable area disposed between the first non-folded area and the second non-folded area and extending in a second direction crossing the first direction, the foldable area including:

a first foldable area adjacent to the first non-folded area; and a second foldable area adjacent to the second non-folded area;

a pixel-defining layer disposed over the substrate, the pixel-defining layer defining:

a (1-1)st lower opening overlapping the first non-folded area;

a (1-2)nd lower opening overlapping the second non-folded area;

a (1-3)rd lower opening overlapping the first foldable area; and a (1-4)th lower opening overlapping the second foldable area; and a light-blocking layer disposed over the pixel-defining layer, the light-blocking layer defining:

a (1-1)st upper opening overlapping the (1-1)st lower opening;

a (1-2)nd upper opening overlapping the (1-2)nd lower opening;

a (1-3)rd upper opening overlapping the (1-3)rd lower opening; and a (1-4)th upper opening overlapping the (1-4)th lower opening, wherein a width of the (1-1)st lower opening, a width of the (1-2)nd lower opening, a width of the (1-3)rd lower opening, and a width of the (1-4)th lower opening are same, wherein a width of the (1-2)nd upper opening is equal to a width of the (1-1)st upper opening, and each of a width of the (1-3)rd upper opening and a width of the (1-4)th upper opening is longer than the width of the (1-1)st upper opening, wherein the (1-3)rd upper opening is shifted to one side of the first non-folded area of the (1-3)rd lower opening in the first direction, and wherein the (1-4)th upper opening is shifted to one side of the second non-folded area of the (1-4)th lower opening in the first direction.

12. The display apparatus of claim 11, wherein a central point of the (1-3)rd upper opening is spaced apart in a first non-folded area direction from a central point of the (1-3)rd lower opening by a (1-3)rd separation distance in a plan view, and a central point of the (1-4)th upper opening is spaced apart in a second non-folded area direction from a central point of the (1-4)th lower opening by a (1-4)th separation distance in the plan view.

13. The display apparatus of claim 11, wherein a central point of the (1-1)st upper opening is disposed at a same position as a position of a central point of the (1-1)st lower opening in a plan view, and a central point of the (1-2)nd upper opening is disposed at a same position as a position of a central point of the (1-2)nd lower opening in the plan view.

14. The display apparatus of claim 13, wherein the (1-1)st upper opening is not shifted to one side of the (1-1)st lower opening in the first direction, and the (1-2)nd upper opening is not shifted to one side of the (1-2)nd lower opening in the first direction.

15. The display apparatus of claim 12, further comprising:

a plurality of first pixel electrodes, a plurality of second pixel electrodes, and a plurality of third pixel electrodes disposed over the substrate and apart from each other;

a plurality of first emission layers which are respectively arranged on the plurality of first pixel electrodes and emit red light;

a plurality of second emission layers which are respectively disposed on the plurality of second pixel electrodes and emit blue light;

a plurality of third emission layers which are respectively disposed on the plurality of third pixel electrodes and emit green light; and an opposite electrode overlapping the plurality of first pixel electrodes, the plurality of second pixel electrodes, and the plurality of third pixel electrodes, wherein the pixel-defining layer defines a (2-1)st lower opening and a (3-1)st lower opening overlapping the first non-folded area, a (2-2)nd lower opening and a (3-2)nd lower opening overlapping the second non-folded area, a (2-3)rd lower opening and a (3-3)rd lower opening overlapping the first foldable area, and a (2-4)th lower opening and a (3-4)th lower opening overlapping the second foldable area, each of the (1-1)st lower opening, the (1-2)nd lower opening, the (1-3)rd lower opening, and the (1-4)th lower opening exposes a central portion of each of the plurality of first pixel electrodes, each of the (2-1)st lower opening, the (2-2)nd lower opening, the (2-3)rd lower opening, and the (2-4)th lower opening exposes a central portion of each of the plurality of second pixel electrodes, and each of the (3-1)st lower opening, the (3-2)nd lower opening, the (3-3)rd lower opening, and the (3-4)th lower opening exposes a central portion of each of the plurality of third pixel electrodes.

16. The display apparatus of claim 15, wherein the light-blocking layer defines a (2-1)st upper opening overlapping the (2-1)st lower opening, a (3-1)st upper opening overlapping the (3-1)st lower opening, a (2-2)nd upper opening overlapping the (2-2)nd lower opening, a (3-2)nd upper opening overlapping the (3-2)nd lower opening, a (2-3)rd upper opening overlapping the (2-3)rd lower opening, a (3-3)rd upper opening overlapping the (3-3)rd lower opening, a (2-4)th upper opening overlapping the (2-4)th lower opening, and a (3-4)th upper opening overlapping the (3-4)th lower opening, wherein the (2-3)rd upper opening is shifted to one side facing the first non-folded area of the (2-3)rd lower opening in the first direction, wherein the (3-3)rd upper opening is shifted to one side facing the first non-folded area of the (3-3)rd lower opening in the first direction, wherein the (2-4)th upper opening is shifted to one side facing the second non-folded area of the (2-4)th lower opening in the first direction, and wherein the (3-4)th upper opening is shifted to one side facing the first non-folded area of the (3-4)th lower opening in the first direction.

17. The display apparatus of claim 16, wherein, in the plan view, a central point of the (2-3)rd upper opening is spaced apart by a (2-3)rd separation distance in the first non-folded area direction from a central point of the (2-3)rd lower opening, wherein, in the plan view, a central point of the (3-3)rd upper opening is spaced apart by a (3-3)rd separation distance in the first non-folded area direction from a central point of the (3-3)rd lower opening, wherein, in the plan view, a central point of the (2-4)th upper opening is spaced apart by a (2-4)th separation distance in the second non-folded area direction from a central point of the (2-4)th lower opening, and wherein, in the plan view, a central point of the (3-4)th upper opening is spaced apart by a (3-4)th separation distance in the second non-folded area direction from a central point of the (3-4)th lower opening.

18. The display apparatus of claim 17, wherein the (1-3)rd separation distance, the (2-3)rd separation distance, and the (3-3)rd separation distance are different from one another, and wherein the (1-4)th separation distance, the (2-4)th separation distance, and the (3-4)th separation distance are different from one another.

19. The display apparatus of claim 11, wherein the (1-3)rd lower opening is provided in plural, the (1-3)rd upper opening is provided in plural, wherein the first foldable area includes a (1-1)st foldable area adjacent to the first non-folded area, a (1-2)nd foldable area adjacent to the second foldable area, and a (1-3)rd foldable area between the (1-1)st foldable area and the (1-2)nd foldable area, wherein, in a plan view, a central point of the (1-3)rd upper opening overlapping the (1-3)rd lower opening overlapping the (1-1)st foldable area is spaced apart by a (1-3-1)st separation distance from a central point of the (1-3)rd lower opening overlapping the (1-1)st foldable area, wherein, in the plan view, a central point of the (1-3)rd upper opening overlapping the (1-3)rd lower opening overlapping the (1-2)nd foldable area is spaced apart by a (1-3-2)nd separation distance from the central point of the (1-3)rd lower opening overlapping the (1-2)nd foldable area, wherein, in the plan view, a central point of the (1-3)rd upper opening overlapping the (1-3)rd lower opening overlapping the (1-3)rd foldable area is spaced apart by a (1-3-3)rd separation distance from a central point of the (1-3)rd lower opening overlapping the (1-3)rd foldable area, and wherein, the (1-3-3)rd separation distance is greater than each of the (1-3-1)st separation distance and the (1-3-2)nd separation distance.

20. The display apparatus of claim 19, wherein the (1-4)th lower opening is provided in plural, and the (1-4)th upper opening is provided in plural, wherein the second foldable area includes a (2-1)st foldable area adjacent to the second non-folded area, a (2-2)nd foldable area adjacent to the first foldable area, and a (2-3)rd foldable area between the (2-1)st foldable area and the (2-2)nd foldable area, wherein, in the plan view, a central point of the (1-4)th upper opening overlapping the (1-4)th lower opening overlapping the (2-1)st foldable area is spaced apart by a (1-4-1)st separation distance from a central point of the (1-4)th lower opening overlapping the (2-1)st foldable area, wherein, in the plan view, a central point of the (1-4)th upper opening overlapping the (1-4)th lower opening overlapping the (2-2)nd foldable area is spaced apart by a (1-4-2)nd separation distance from the central point of the (1-4)th lower opening overlapping the (2-2)nd foldable area, wherein, in the plan view, a central point of the (1-4)th upper opening overlapping the (1-4)th lower opening overlapping the (2-3)rd foldable area is spaced apart by a (1-4-3)rd separation distance from a central point of the (1-4)th lower opening overlapping the (2-3)rd foldable area, and wherein, the (1-4-3)rd separation distance is greater than each of the (1-4-1)st separation distance and the (1-4-2)nd separation distance.

* * * * *